United States Patent
Shirakawa et al.

(10) Patent No.: US 11,703,758 B2
(45) Date of Patent: *Jul. 18, 2023

(54) PHOTOSENSITIVE COMPOSITION FOR EUV LIGHT, PATTERN FORMING METHOD, AND METHOD FOR MANUFACTURING ELECTRONIC DEVICE

(71) Applicant: FUJIFILM Corporation, Tokyo (JP)

(72) Inventors: Michihiro Shirakawa, Shizuoka (JP);
Hajime Furutani, Shizuoka (JP);
Hironori Oka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 93 days.

This patent is subject to a terminal disclaimer.

(21) Appl. No.: 17/035,746

(22) Filed: Sep. 29, 2020

(65) Prior Publication Data

US 2021/0011377 A1    Jan. 14, 2021

Related U.S. Application Data

(63) Continuation of application No. PCT/JP2019/015910, filed on Apr. 12, 2019.

(30) Foreign Application Priority Data

Apr. 20, 2018  (JP) .............................. JP2018-081359
Mar. 26, 2019  (JP) .............................. JP2019-058312

(51) Int. Cl.
| G03F 7/004 | (2006.01) |
|---|---|
| C08L 101/04 | (2006.01) |
| G03F 7/20 | (2006.01) |
| G03F 7/32 | (2006.01) |

(52) U.S. Cl.
CPC .......... *G03F 7/0045* (2013.01); *C08L 101/04* (2013.01); *G03F 7/2004* (2013.01); *G03F 7/325* (2013.01)

(58) Field of Classification Search
CPC .................................................. G03F 7/0045
See application file for complete search history.

(56) References Cited

U.S. PATENT DOCUMENTS

| 9,170,489 B2 | 10/2015 | Takizawa et al. |
|---|---|---|
| 10,101,653 B2 | 10/2018 | Hatakeyama et al. |
| 2014/0162188 A1 | 6/2014 | Hatakeyama et al. |
| 2015/0017576 A1* | 1/2015 | Inoue .................. G03F 7/0046 430/326 |
| 2016/0147155 A1* | 5/2016 | Takizawa ............. G03F 7/0045 430/311 |

FOREIGN PATENT DOCUMENTS

| JP | 2013205811 | 10/2013 |
|---|---|---|
| JP | 2014115569 | 6/2014 |
| JP | 2015172767 | 10/2015 |
| JP | 2016085382 | 5/2016 |
| JP | 2018025789 | 2/2018 |
| KR | 20140076489 | 6/2014 |
| KR | 20140139525 | 12/2014 |
| TW | 201317712 | 5/2013 |
| TW | 201344355 | 11/2013 |

OTHER PUBLICATIONS

Office Action of Japan Counterpart Application, with English translation thereof, dated Nov. 24, 2021, pp. 1-6.
"International Search Report (Form PCT/ISA/210) of PCT/JP2019/015910," dated Jul. 2, 2019, with English translation thereof, pp. 1-3.
"Written Opinion of the International Searching Authority (Form PCT/ISA/237) of PCT/JP2019/015910," dated Jul. 2, 2019, with English translation thereof, pp. 1-9.
"Search Report of Europe Counterpart Application", dated May 25, 2021, p. 1-p. 7.
"Office Action of Korea Counterpart Application" with English translation thereof, dated Aug. 8, 2022, p. 1-p. 11.
"Office Action of Japan Counterpart Application", dated Jun. 14, 2022, with English translation thereof, pp. 1-5.
Office Action of Taiwan Counterpart Application, with English translation thereof, dated Sep. 8, 2022, pp. 1-11.
Office Action of Japan Counterpart Application, with English translation thereof, dated Nov. 22, 2022, pp. 1-4.
Office Action of Israel Counterpart Application, dated Nov. 2, 2022, pp. 1-3.
"Office Action of Europe Counterpart Application, Application No. 19789468.6", dated Feb. 27, 2023, p. 1-p. 4.
Office Action of Taiwan Counterpart Application, with English translation thereof, dated Mar. 2, 2023, pp. 1-12.

* cited by examiner

*Primary Examiner* — Duane Smith
*Assistant Examiner* — Nicholas E Brown
(74) *Attorney, Agent, or Firm* — Jciprnet

(57) ABSTRACT

A photosensitive composition for EUV light includes a predetermined resin and a photoacid generator, or includes a predetermined resin having a repeating unit having a photoacid generating group, and satisfies Requirements 1 to 3, Requirement 1: The A value determined by Formula (1) is 0.14 or more, $$A=([H]\times 0.04+[C]\times 1.0+[N]\times 2.1+[O]\times 3.6+[F]\times 5.6+[S]\times 1.5+[I]\times 39.5)/([H]\times 1+[C]\times 12+[N]\times 14+[O]\times 16+[F]\times 19+[S]\times 32+[I]\times 127) \quad \text{Formula(1)}$$

Requirement 2: The concentration of solid contents in the photosensitive composition for EUV light is 5.0% by mass or less,
Requirement 3: The content of the photoacid generator is 5% to 50% by mass with respect to the total solid content in the photosensitive composition for EUV light.

12 Claims, No Drawings

PHOTOSENSITIVE COMPOSITION FOR EUV LIGHT, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2019/015910 filed on Apr. 12, 2019, which claims priority under 35 U.S.C § 119(a) to Japanese Patent Application No. 2018-081359 filed on Apr. 20, 2018, and Japanese Patent Application No. 2019-058312 filed on Mar. 26, 2019. Each of the above application(s) is hereby expressly incorporated by reference, in its entirety, into the present application.

BACKGROUND OF THE INVENTION

1. Field of the Invention

The present invention relates to a photosensitive composition for EUV light, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using a photosensitive composition has been performed.

Examples of the lithographic method include a method in which a resist film is formed with a photosensitive composition, and then the obtained film is exposed and then developed. In particular, it has recently been investigated to use extreme ultraviolet (EUV) light upon exposure (JP2016-085382A).

SUMMARY OF THE INVENTION

On the other hand, it has recently been demanded to form a finer pattern without a bridge defect.

In addition, similarly, a further improvement of a Z-factor has also been demanded. Further, the Z-factor is a value that exhibits total performance of a resolution, a line edge roughness (LER), and a sensitivity, and a smaller numerical value thereof exhibits better total performance of the resolution, the LER, and the sensitivity. In addition, the Z-factor is determined with the following equation.

$$Z\text{-Factor}=(\text{Resolving power})^3 \times (\text{LER})^2 \times (\text{Sensitivity})$$

The present inventors have conducted studies on the related art, and have thus discovered that it was not possible to satisfy both of a good Z-factor and a suppressed bridge defect at the same time, whereby there is room for a further improvement thereof.

An object of the present invention is to provide a photosensitive composition for EUV light, which has a good Z-factor and is capable of forming a pattern having a suppressed bridge defect.

In addition, another object of the present invention is to provide a pattern forming method and a method for manufacturing an electronic device.

The present inventors have found that the objects can be accomplished by the following configurations.

(1) A photosensitive composition for EUV light, comprising:
a resin that has an increased polarity by action of an acid, thereby having an increased solubility in an alkali developer and a decreased solubility in an organic solvent; and
a photoacid generator, or
a resin that has a repeating unit having a photoacid generating group, and has an increased polarity by action of an acid, thereby having an increased solubility in an alkali developer and a decreased solubility in an organic solvent, and
in which the photosensitive composition satisfies Requirement 1 to Requirement 3 which will be described later.

(2) The photosensitive composition for EUV light as described in (1), comprising:
the resin that has an increased polarity by action of an acid, thereby having an increased solubility in an alkali developer and a decreased solubility in an organic solvent; and
a photoacid generator consisting of a cationic moiety and an anionic moiety,
in which a B value determined by Formula (2) which will be described later is 0 eV or more.

(3) The photosensitive composition for EUV light as described in (1) or (2), in which a volume of an acid generated from the photoacid generator is 240 Å$^3$ or more.

(4) The photosensitive composition for EUV light as described in any one of (1) to (3), in which a glass transition temperature of the resin is higher than 90° C.

(5) The photosensitive composition for EUV light as described in any one of (1) to (4), in which the resin has an acid group with an acid dissociation constant of 13 or less.

(6) The photosensitive composition for EUV light as described in (5), in which a content of the acid group is 0.80 to 6.00 mmol/g.

(7) The photosensitive composition for EUV light as described in any one of (1) to (6), in which the resin has a repeating unit having a fluorine atom or an iodine atom.

(8) The photosensitive composition for EUV light as described in (7),
in which neither a structure in which a polar group is protected with a leaving group that leaves by action of an acid nor an acid group is included in the repeating unit having a fluorine atom or an iodine atom.

(9) The photosensitive composition for EUV light as described in any one of (1) to (8),
in which the resin includes a fluorine atom and an iodine atom.

(10) A pattern forming method comprising:
a step of forming a resist film on a substrate using the photosensitive composition for EUV light as described in any one of (1) to (9);
a step of exposing the resist film with EUV light; and
a step of developing the exposed resist film using an alkali developer to form a pattern.

(11) A method for manufacturing an electronic device, comprising the pattern forming method as described in (10).

According to the present invention, it is possible to provide a photosensitive composition for EUV light, which has a good Z-factor and is capable of forming a pattern having a suppressed bridge defect.

In addition, according to the present invention, it is possible to provide a pattern forming method and a method for manufacturing an electronic device.

DESCRIPTION OF THE PREFERRED EMBODIMENTS

Hereinafter, an example of embodiments for carrying out the present invention will be described.

In the present specification, a numerical range expressed using "to" is used in a meaning of a range that includes the preceding and succeeding numerical values of "to" as the lower limit value and the upper limit value, respectively.

Moreover, in citations for a group (atomic group) in the present specification, in a case where the group is denoted without specifying whether it is substituted or unsubstituted, the group includes both a group not containing a substituent and a group containing a substituent. For example, an "alkyl group" includes not only an alkyl group not containing a substituent (unsubstituted alkyl group), but also an alkyl group containing a substituent (substituted alkyl group).

"(Meth)acryl" in the present specification is a generic term that collectively refers to acryl and methacryl, and means "at least one of acryl or methacryl". Similarly, "(meth)acrylic acid" means "at least one of acrylic acid or methacrylic acid".

In the present specification, the weight-average molecular weight (Mw), the number-average molecular weight (Mn), and the dispersity (also referred to as a molecular weight distribution) (Mw/Mn) of a resin are defined as values in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

1 Å is $1 \times 10^{-10}$ m.

<<Photosensitive Composition for EUV Light>>

The photosensitive composition for EUV light of an embodiment of the present invention (hereinafter also referred to as a "resist composition") satisfies Requirements 1 to 3 which will be described later. A reason why a desired effect is obtained by satisfying these requirements is shown below.

EUV light has a wavelength of 13.5 nm, which is a shorter wavelength than that of ArF (wavelength of 193 nm) light or the like, and therefore, the EUV light has a smaller number of incidence photons upon exposure with the same sensitivity. Thus, an effect of "photon shot noise" that the number of photons is statistically non-uniform is significant, and a deterioration in LER and a bridge defect are caused. In order to reduce the photon shot noise, a method in which an exposure dose is increased to cause an increase in the number of incidence photons is available, but the method is a trade-off with a demand for a higher sensitivity.

In contrast, according to the present invention, it has been found that the problems can be solved by increasing an absorbance rate of EUV light by a method that does not depend on increasing an exposure dose. By increasing the A value shown in Requirement 1, the absorption of EUV light per film thickness of the resist film formed from the resist composition is increased. Further, by satisfying Requirement 2, more EUV light can be absorbed in the film thickness direction. In addition, by satisfying Requirement 3, the absorbed EUV light can be effectively used for generation of an acid. As a result, a Z-factor which is total performance of a resolution, a line edge roughness (LER), and a sensitivity is improved while generation of a bridge defect is suppressed.

The resist composition satisfies Requirement 1. As described above, in a case where the A value defined in Requirement 1 is high, the absorption efficiency of EUV light of the resist film formed with the resist composition is increased. The A value represents the absorption efficiency of EUV light of the resist film in terms of a mass ratio.

Requirement 1: The A value determined by Formula (1) is 0.14 or more.

$$A=([H]\times 0.04+[C]\times 1.0+[N]\times 2.1+[O]\times 3.6+[F]\times 5.6+[S]\times 1.5+[I]\times 39.5)/([H]\times 1+[C]\times 12+[N]\times 14+[O]\times 16+[F]\times 19+[S]\times 32+[I]\times 127) \quad \text{Formula (1)}$$

As described, the A value is 0.14 or more, but from the viewpoint that at least one of a further improvement of the Z-factor or a further suppression of a bridge defect is achieved (hereinafter also simply referred to as "the effect of the present invention is more excellent"), the A value is preferably 0.15 or more, and more preferably 0.16 or more. The upper limit is not particularly limited, but in a case where the A value is extremely high, the transmittance of EUV light of the resist film is lowered and the optical profile in the resist film is deteriorated, which results in difficulty in obtaining a good pattern shape, and therefore, the upper limit is preferably 0.24 or less, and more preferably 0.22 or less.

In a case where A is less than 0.14, the Z-factor is usually deteriorated. Moreover, in Formula (1), [H] represents a molar ratio of hydrogen atoms derived from the total solid content with respect to all the atoms of the total solid content in the photosensitive composition for EUV light, [C] represents a molar ratio of carbon atoms derived from the total solid content with respect to all the atoms of the total solid content in the photosensitive composition for EUV light, [N] represents a molar ratio of nitrogen atoms derived from the total solid content with respect to all the atoms of the total solid content in the photosensitive composition for EUV light, [O] represents a molar ratio of oxygen atoms derived from the total solid content with respect to all the atoms of the total solid content in the photosensitive composition for EUV light, [F] represents a molar ratio of fluorine atoms derived from the total solid content with respect to all the atoms of the total solid content in the photosensitive composition for EUV light, [S] represents a molar ratio of sulfur atoms derived from the total solid content with respect to all the atoms of the total solid content in the photosensitive composition for EUV light, and [I] represents a molar ratio of iodine atoms derived from the total solid content with respect to all the atoms of the total solid content in the photosensitive composition for EUV light.

In addition, the solid content is intended to mean components, excluding solvents, which can constitute the resist film. Further, even in a case where the property of the components is a liquid state, any of the components that can form the resist film are calculated as a solid.

For example, in a case where the resist composition includes a resin that has an increased polarity by action of an acid, thereby having an increased solubility in an alkali developer and a decreased solubility in an organic solvent, a photoacid generator, an acid diffusion control agent, and a solvent, the resin, the photoacid generator, and the acid diffusion control agent correspond to the solid content. That is, all the atoms in the total solid content correspond to a sum of all the atoms derived from the resin, all the atoms derived from the photoacid generator, and all the atoms derived from the acid diffusion control agent. For example, [H] represents a molar ratio of hydrogen atoms derived from the total solid content with respect to all the atoms in the total solid content, and by way of description based on the example above, [H] represents a molar ratio of a sum of the hydrogen atom derived from the resin, the hydrogen atom derived from the photoacid generator, and the hydrogen atom derived from the acid diffusion control agent with respect to a sum of all the atoms derived from the resin, all the atoms derived from the photoacid generator, and all the atoms derived from the acid diffusion control agent.

The A value can be calculated by computation of the structure of constituent components of the total solid content in the resist composition, and the ratio of atoms contained in a case where the content is already known. In addition, even in a case where the constituent component is not known yet, it is possible to calculate a ratio of the number of constituent atoms by subjecting a resist film obtained after evaporating the solvent components of the resist composition to computation according to an analytic approach such as elemental analysis.

Moreover, the resist composition satisfies Requirement 2.

Requirement 2: The concentration of solid contents in the photosensitive composition for EUV light is 5.0% by mass or less.

The concentration of solid contents in the resist composition is 5.0% by mass or less, and from the viewpoint that the effect of the present invention is more excellent, the concentration of solid contents is preferably more than 1.0% by mass, more preferably more than 1.5% by mass, and still more preferably more than 2.5% by mass, and is preferably less than 4.5% by mass, more preferably 4.0% by mass or less, and still more preferably 3.5% by mass or less.

Moreover, the resist composition satisfies Requirement 3.

Requirement 3: The content of the photoacid generator is 5% to 50% by mass with respect to the total solid content in the photosensitive composition for EUV light.

From the viewpoint that the effect of the present invention is more excellent, the content of the photoacid generator in the resist composition is preferably 10% to 40% by mass, more preferably 10% to 35% by mass, still more preferably 15% to 35% by mass, and most preferably more than 15% by mass and less than 35% by mass with respect to the total solid content of the composition.

The photoacid generators may be used alone or in combination of two or more kinds thereof. In a case where two or more kinds of the photoacid generators are used in combination, the total amount thereof is preferably within the range.

The aspect of the photoacid generator will be described in detail later.

The resist composition may be any one of a positive type or a negative type, but the positive type is preferable. Further, the exposed area of EUV light is more easily dissolved by an alkali developer.

In a case where the resist composition satisfies Requirements 1 to 3, the constituent components thereof are not particularly limited, but the resist composition usually includes a resin that has an increased polarity by action of an acid, thereby having an increased solubility in an alkali developer and a decreased solubility in an organic solvent, and a photoacid generator; or a resin that includes a repeating unit having a photoacid generating group, and has an increased polarity by action of an acid, thereby having an increased solubility in an alkali developer and a decreased solubility in an organic solvent. Above all, it is preferable that the resist composition includes the resin that has an increased polarity by action of an acid, thereby having an increased solubility in an alkali developer and a decreased solubility in an organic solvent, and a photoacid generator consisting of a cationic moiety and an anionic moiety, as described later.

In a case where the resist composition includes the resin that has an increased polarity by action of an acid, thereby having an increased solubility in an alkali developer and a decreased solubility in an organic solvent, and the photoacid generator consisting of a cationic moiety and an anionic moiety, the B value determined by Formula (2) is preferably 0 eV or more, and more preferably 0.2 eV or more from the viewpoint that the effect of the present invention is more excellent. The upper limit is not particularly limited, but is preferably 3.0 eV or less, and more preferably 2.5 eV or less. By increasing the B value, the electron transfer efficiency from the resin (the resin that has an increased polarity by action of an acid, thereby having an increased solubility in an alkali developer and a decreased solubility in an organic solvent) to the cationic moiety of the photoacid generator is increased, which is thus considered to enable an acid to be generated efficiently.

$$B \text{ value} = \text{LUMO(Polymer)} - \text{LUMO(PAG\_Cation)} \quad \text{Formula (2)}$$

The LUMO (Polymer) represents an energy value of a lowest unoccupied molecular orbital level of a monomer of a repeating unit which is derived from the monomer having a lowest energy value of the lowest unoccupied molecular orbital level, the repeating unit being one of repeating units included in an amount of 5% by mass or more with respect to all the repeating units of the resin.

The LUMO (PAG_Cation) represents an energy value of the lowest unoccupied molecular orbital level of a cationic moiety of the photoacid generator which is contained in the largest amount in the resist composition in term of a mass.

The lowest unoccupied molecular orbital (LUMO) value of each compound is calculated by a quantum chemical calculation program that is most widely used at present, Gaussian 09 (Gaussian 09, Revision A. 02, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2009.).

A density functional theory is used as the calculation method and B3LYP is used as the functional theory. In a basis function thereof, 6-31+G (d, p) is used for an atom other than iodine and aug-cc-PVDZ-PP is used for the iodine atom. The aug-cc-PVDZ-PP is available from a database "Basis Set Exchange (https://bse.pn1.gov/bse/portal)" disclosed in WEB.

By the way, the value calculated from the density functional theory usually corresponds to a value for a lone molecule in vacuum. However, a molecule included in the resist film (a molecule present in the resist film) is affected by other molecules present in the surrounding area, which is different from the lone molecule in vacuum.

Therefore, in a case where a LUMO value of the compound is computed using the density functional theory, it can be more appropriate to use a numerical value in consideration of the thin film state.

As a point that should be considered as a difference between the vacuum and the thin film, there is a difference in a permittivity. The relative permittivity in vacuum is 1, but the relative permittivity of the resist film is considered to be approximately 2 to 5. Accordingly, a value obtained in consideration of the permittivity is preferably used as the LUMO value.

The LUMO value in consideration of the permittivity can be computed by solvent effect computation (PCM method) which is included in Gaussian 09. Since a parameter of the thin film is not included, it is necessary to perform substitution with a compound having a relative permittivity of 2 to 5. In the present specification, a parameter of benzene (relative permittivity=2.2706) is used.

A structure optimization computation is performed by the present method to calculate a LUMO value for a structure in which production energy is minimized. In a case where the LUMO value of the cationic moiety of the photoacid generator is computed, an anion derived from trifluoromethanesulfonic acid is used as a counter anion.

Hereinafter, components that can be included in the specific composition will be described in detail.

<(A) Resin that has Increased Polarity by Action of Acid, Thereby Having Increased Solubility in Alkali Developer and Decreased Solubility in Organic Solvent>

The resist composition includes a resin that has an increased polarity by action of an acid, thereby having an increased solubility in an alkali developer and a decreased solubility in an organic solvent (hereinafter also referred to as a "resin (A)"). Further, the resin (A) may have a repeating unit having a photoacid generating group, as described later.

Among those, the resin (A) preferably has an acid group having an acid dissociation constant (pKa) of 13 or less. The acid dissociation constant of the acid group is preferably 13 or less, more preferably 3 to 13, and still more preferably 5 to 10, as described above.

In a case where the resin (A) has an acid group having a predetermined pKa, the storage stability of the resist composition is excellent, and thus, a progress of development is improved.

Examples of the acid group having an acid dissociation constant (pKa) of 13 or less include a carboxyl group, a phenolic hydroxyl group, a fluorinated alcohol group (preferably hexafluoroisopropanol group), a sulfonic acid group, and a sulfonamido group.

In a case where the resin (A) has an acid group having a pKa of 13 or less, the content of the acid group in the resin (A) is not particularly limited, but is 0.2 to 6.0 mmol/g in many cases. Among those, the content of the acid group is preferably 0.8 to 6.0 mmol/g, more preferably 1.2 to 5.0 mmol/g, and still more preferably 1.6 to 4.0 mmol/g. In a case where the content of the acid group is within the range, a progress of development is improved, and thus, the shape of a pattern thus formed is excellent and the resolution is also excellent.

(Repeating Unit Having Structure in which Polar Group is Protected with Leaving Group that Leaves by Action of Acid)

The resin (A) preferably has a repeating unit having a structure in which a polar group is protected with a leaving group that leaves by action of an acid. That is, the resin (A) preferably has a repeating unit having a group that decomposes by action of an acid to generate a polar group. The resin having such a repeating unit has an increased polarity by action of an acid, thereby having an increased solubility in an alkali developer and a decreased solubility in an organic solvent.

As the polar group in the repeating unit having a structure (acid-decomposable group) in which a polar group is protected with a leaving group that leaves by action of an acid, an alkali-soluble group is preferable, and examples thereof include acidic groups such as a carboxyl group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and alcoholic hydroxyl groups.

Among those, the carboxyl group, the phenolic hydroxyl group, the fluorinated alcohol group (preferably a hexafluoroisopropanol group), or the sulfonic acid group is preferable as the polar group.

Examples of the leaving group that leaves by action of an acid include groups represented by Formulae (Y1) to (Y4).

—C(Rx$_1$)(Rx$_2$)(Rx$_3$)    Formula (Y1)

—C(=O)OC(Rx$_1$)(Rx$_2$)(Rx$_3$)    Formula (Y2)

—C(R$_{36}$)(R$_{37}$)(OR$_{38}$)    Formula (Y3)

—C(Rn)(H)(Ar)    Formula (Y4)

In Formula (Y1) and Formula (Y2), Rx$_1$ to Rx$_3$ each independently represent an (linear or branched) alkyl group or a (monocyclic or polycyclic) cycloalkyl group. Further, in a case where all of Rx$_1$ to Rx$_3$ are (linear or branched) alkyl groups, at least two of Rx$_1$, . . . , or Rx$_3$ are preferably methyl groups.

Above all, it is preferable that Rx$_1$ to Rx$_3$ each independently represent a linear or branched alkyl group, and it is more preferable that Rx$_1$ to Rx$_3$ each independently represent a linear alkyl group.

Two of Rx$_1$ to Rx$_3$ may be bonded to each other to form a monocycle or a polycycle.

As the alkyl group of each of Rx$_1$ to Rx$_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of Rx$_1$ to Rx$_3$, for example, one methylene group constituting the ring may be substituted with a heteroatom such as an oxygen atom or a group having a heteroatom, such as a carbonyl group.

For the group represented by Formula (Y1) or Formula (Y2), for example, an aspect in which $Rx_1$ is a methyl group or an ethyl group, and $Rx_2$ and $Rx_3$ are bonded to each other to form the above-mentioned cycloalkyl group is preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is a hydrogen atom.

For Formula (Y3), a group represented by Formula (Y3-1) is preferable.

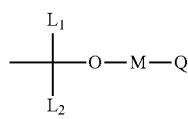
(Y3-1)

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one methylene group may be substituted with a heteroatom such as an oxygen atom, or a group having a heteroatom, such as a carbonyl group.

Furthermore, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of making a pattern finer, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, a glass transition temperature (Tg) or an activation energy is increased, and therefore, in addition to secured film hardness, suppression of fogging can be achieved.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

As the repeating unit having a structure in which a polar group is protected with a leaving group that leaves by action of an acid, a repeating unit represented by Formula (A) is preferable.

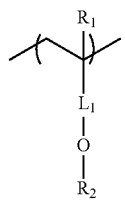
(A)

$L_1$ represents a divalent linking group which may have a fluorine atom or an iodine atom, $R_1$ represents a hydrogen atom, a fluorine atom, an iodine atom, an alkyl group which may have a fluorine atom or an iodine atom, or an aryl group which may have a fluorine atom or an iodine atom, and $R_2$ represents a leaving group which leaves by action of an acid and may have a fluorine atom or an iodine atom. It should be noted that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —$SO_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, —CO— or -arylene group-alkylene group having a fluorine atom or an iodine atom-is preferable as $L_1$ from the viewpoint that the effect of the present invention is more excellent.

As the arylene group, a phenylene group is preferable.

The alkylene group may be linear or branched. The number of carbon atoms of the alkylene group is not particularly limited, but is preferably 1 to 10, and more preferably 1 to 3.

The total number of the fluorine atoms and the iodine atoms included in the alkylene group having a fluorine atom or an iodine atom is not particularly limited, but from the viewpoint that the effect of the present invention is more excellent, the total number is preferably 2 or more, more preferably 2 to 10, and still more preferably 3 to 6.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of the fluorine atoms and the iodine atoms included in the alkyl group having a fluorine atom or an iodine atom is not particularly limited, but from the viewpoint that the effect of the present invention is more excellent, the total number is preferably 1 or more, more preferably 1 to 5, and still more preferably 1 to 3.

$R_2$ represents a leaving group that leaves by action of an acid and may have a fluorine atom or an iodine atom.

Among those, examples of the leaving group include groups represented by Formulae (Z1) to (Z4).

—C($Rx_{11}$)($Rx_{12}$)($Rx_{13}$)    Formula (Z1)

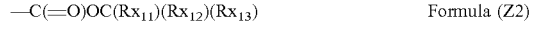

—C(=O)OC($Rx_{11}$)($Rx_{12}$)($Rx_{13}$)    Formula (Z2)

—C($R_{136}$)($R_{137}$)($OR_{138}$)    Formula (Z3)

—C($Rn_1$)(H)($Ar_1$)    Formula (Z4)

In Formulae (Z1) and (Z2), $Rx_{11}$ to $Rx_{13}$ each independently represent an (linear or branched) alkyl group which may have a fluorine atom or an iodine atom, or a (monocyclic or polycyclic) cycloalkyl group which may have a fluorine atom or an iodine atom. In addition, in a case where all of $Rx_{11}$ to $Rx_{13}$ are (linear or branched) alkyl groups, it is preferable that at least two of $Rx_{11}, \ldots,$ or $Rx_{13}$ are methyl groups.

$Rx_{11}$ to $Rx_{13}$ are the same as $Rx_1$ to $Rx_3$ in the above-mentioned (Y1) and (Y2) except that they may have a fluorine atom or an iodine atom, and have the same definitions and suitable ranges as those of the alkyl group and the cycloalkyl group.

In Formula (Z3), $R_{136}$ to $R_{138}$ each independently represent a hydrogen atom or a monovalent organic group which may have a fluorine atom or an iodine atom. $R_{137}$ and $R_{138}$ may be bonded to each other to form a ring. Examples of the monovalent organic group which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group formed by combination thereof (for example, a group formed by combination of an alkyl group and a cycloalkyl group).

In addition, a heteroatom such as an oxygen atom, in addition to the fluorine atom and the iodine atom, may be included in the alkyl group, the cycloalkyl group, the aryl group, and the aralkyl group. That is, in the alkyl group, the cycloalkyl group, the aryl group, and the aralkyl group, for example, one methylene group may be substituted with a heteroatom such as an oxygen atom, or a group having a heteroatom, such as a carbonyl group.

For Formula (Z3), a group represented by Formula (Z3-1) is preferable.

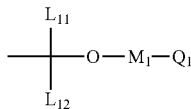

(Z3-1)

Here, $L_{11}$ and $L_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group formed by combination thereof (for example, a group formed by combination of an alkyl group and a cycloalkyl group, which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; or a group formed by combination thereof (for example, a group formed by combination of an alkyl group and a cycloalkyl group, which may have a heteroatom selected from the group consisting of a fluorine atom, an iodine atom, and an oxygen atom).

In Formula (Y4), An represents an aromatic ring group which may have a fluorine atom or an iodine atom. $Rn_1$ represents an alkyl group which may have a fluorine atom or an iodine atom, a cycloalkyl group which may have a fluorine atom or an iodine atom, or an aryl group which may have a fluorine atom or an iodine atom. $Rn_1$ and An may be bonded to each other to form a non-aromatic ring.

As the repeating unit having a structure in which a polar group is protected with a leaving group that leaves by action of an acid, a repeating unit represented by General Formula (AI) is also preferable.

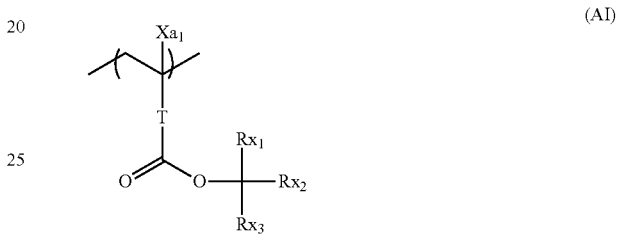

(AI)

In General Formula (AI), $Xa_1$ represents a hydrogen atom or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$ to $Rx_3$ are methyl groups.

Two of $Rx_1$ to $Rx_3$ may be bonded to each other to form a (monocyclic or polycyclic) cycloalkyl group.

Examples of the alkyl group which may have a substituent represented by $Xa_1$ include a methyl group or a group represented by $-CH_2-R_{11}$. Ru represents a halogen atom (a fluorine atom and the like), a hydroxyl group, or a monovalent organic group, examples thereof include an alkyl group having 5 or less carbon atoms and an acyl group having 5 or less carbon atoms, the alkyl group having 3 or less carbon atoms is preferable; and the methyl group is more preferable. As $Xa_1$, a hydrogen atom, a methyl group, a trifluoromethyl group, or a hydroxymethyl group is preferable.

Examples of the divalent linking group of T include an alkylene group, an aromatic ring group, a $-COO-R_t-$ group, and an $-O-R_t-$ group. In the formulae, $R_t$ represents an alkylene group or a cycloalkylene group.

T is preferably a single bond or a $-COO-R_t-$ group. In a case where T represents a $-COO-R_t-$ group, $R_t$ is preferably an alkylene group having 1 to 5 carbon atoms, and more preferably a $-CH_2-$ group, a $-(CH_2)_2-$ group, or a $-(CH_2)_3-$ group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as norbornyl group, a tetracyclodecanyl group, a tetracyclododecanyl group, and an adamantyl group is preferable. Among those, a monocyclic cycloalkyl group having 5 or 6 carbon atoms is preferable.

In the cycloalkyl group formed by the bonding of two of $Rx_1$ to $Rx_3$, for example, one methylene group constituting the ring may be substituted with a heteroatom such as an oxygen atom or a group having a heteroatom, such as a carbonyl group.

For the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The number of carbon atoms of the substituent is preferably 8 or less.

The repeating unit represented by General Formula (AI) is preferably an acid-decomposable (meth)acrylic acid tertiary alkyl ester-based repeating unit (the repeating unit in which $Xa_1$ represents a hydrogen atom or a methyl group, and T represents a single bond).

The content of the repeating unit having a structure in which a polar group is protected with a leaving group that leaves by action of an acid is preferably 15% to 80% by mole, more preferably 20% to 70% by mole, and still more preferably 25 to 65% by mole with respect to all the repeating units in the resin (A).

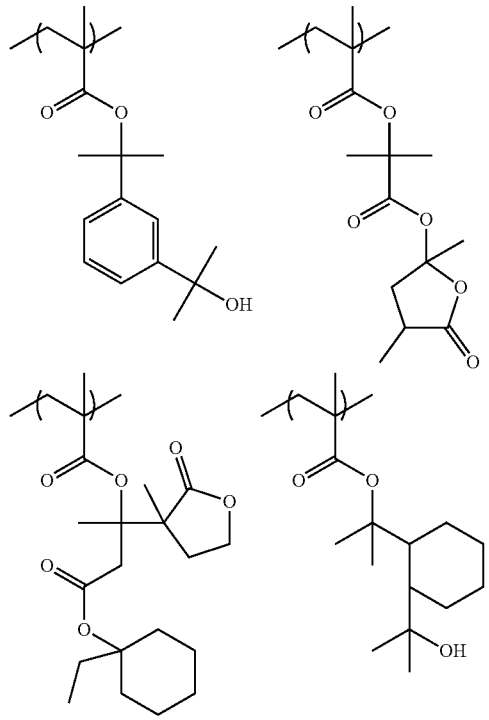

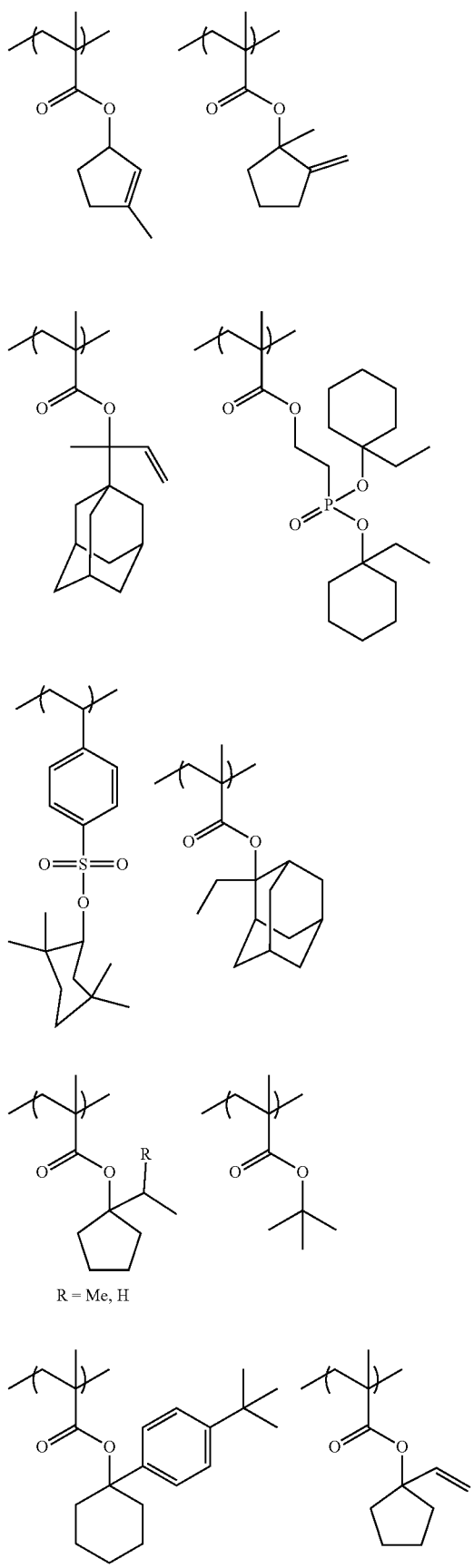

-continued

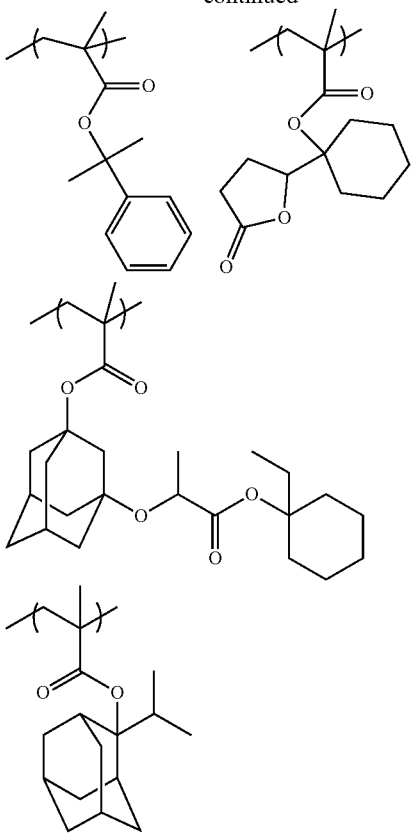

(Repeating Unit Having Acid Group)

The resin (A) may have a repeating unit having an acid group.

As the acid group, the above-mentioned acid group having a pKa of 13 or less is preferable.

The repeating unit having an acid group may have a fluorine atom or an iodine atom.

As the repeating unit having an acid group, a repeating unit represented by Formula (B) is preferable.

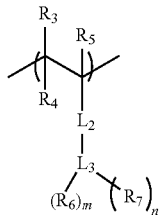

(B)

$R_3$ represents a hydrogen atom or a monovalent organic group which may have a fluorine atom or an iodine atom.

As the monovalent organic group which may have a fluorine atom or an iodine atom, a group represented by $-L_4-R_8$ is preferable. $L_4$ represents a single bond or an ester group. Examples of $R_8$ include an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

$R_6$ represents a hydroxyl group or a fluorinated alcohol group (preferably a hexafluoroisopropanol group). In addition, in a case where $R_6$ is a hydroxyl group, $L_3$ is preferably an (n+m+1)-valent aromatic hydrocarbon ring group.

$R_7$ represents a halogen atom. Examples of the halogen atom include a fluorine atom, a chlorine atom, a bromine atom, and an iodine atom.

m represents an integer of 1 or more. m is preferably an integer of 1 to 3, and more preferably an integer of 1 or 2.

n represents an integer of 0, or 1 or more. n is preferably an integer of 1 to 4.

In addition, (n+m+1) is preferably an integer of 1 to 5.

As the repeating unit having an acid group, a repeating unit represented by General Formula (I) is also preferable.

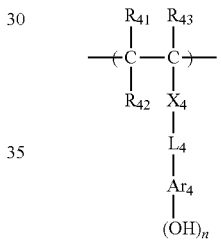

(I)

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group of each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be either monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms of the substituent is preferably 8 or less.

$Ar_4$ represents an (n+1)-valent aromatic ring group. The divalent aromatic ring group in a case where n is 1 may have a substituent, and for example, an arylene group having 6 to 18 carbon atoms, such as a phenylene group, a tolylene group, a naphthylene group, and an anthracenylene group, or an aromatic ring group including a heterocycle, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring, is preferable.

Specific examples of the (n+1)-valent aromatic ring group in a case where n is an integer of 2 or more include groups formed by excluding any (n−1) hydrogen atoms from the above-mentioned specific examples of the divalent aromatic ring group.

The (n+1)-valent aromatic ring group may further have a substituent.

Examples of the substituent which can be contained in the above-mentioned alkyl group, cycloalkyl group, alkoxycarbonyl group, alkylene group, and (n+1)-valent aromatic ring group include the alkyl groups mentioned in $R_{41}$, $R_{42}$, and $R_{43}$ in General Formula (I); alkoxy groups such as a methoxy group, an ethoxy group, a hydroxyethoxy group, a propoxy group, a hydroxypropoxy group, and a butoxy group; and aryl groups such as a phenyl group.

Examples of the alkyl group of $R_{64}$ in —$CONR_{64}$— ($R_{64}$ represents a hydrogen atom or an alkyl group) represented by $X_4$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and the alkyl group is preferably an alkyl group having 8 or less carbon atoms.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

The repeating unit represented by General Formula (I) preferably comprises a hydroxystyrene structure. That is, $Ar_4$ is preferably a benzene ring group.

As the repeating unit represented by General Formula (I), a repeating unit represented by General Formula (1) is preferable.

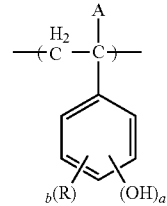

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where R's are present in a plural number, they may be the same as or different from each other. In a case where a plurality of R's are included, they may be combined with each other to form a ring. As R, the hydrogen atom is preferable.

a represents an integer of 1 to 3.

b represents an integer of 0 to (5−a).

Specific examples of the repeating unit represented by General Formula (I) are shown below but the present invention is not limited thereto. In the formulae, a represents 1 or 2.

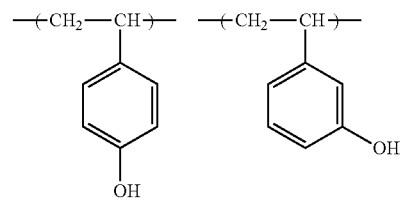

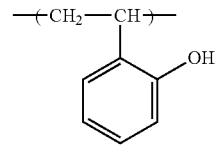

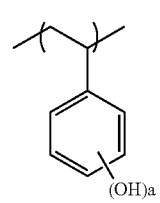

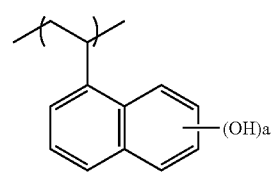

-continued
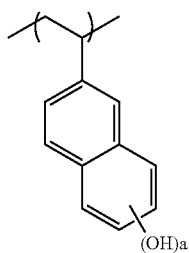 (B-3)
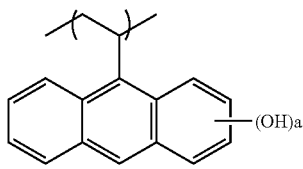 (B-4)
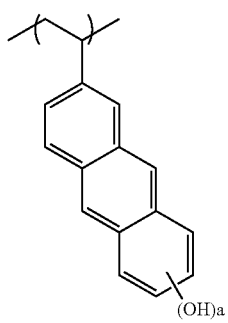 (B-5)
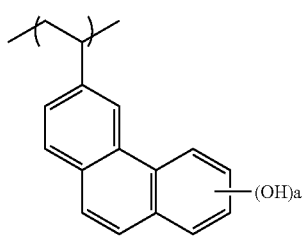 (B-6)
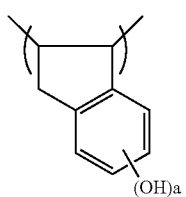 (B-7)
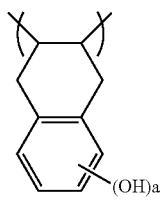 (B-8)
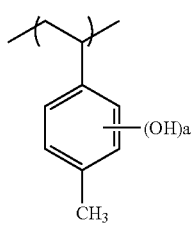 (B-9)
-continued
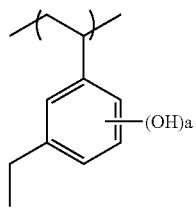 (B-10)
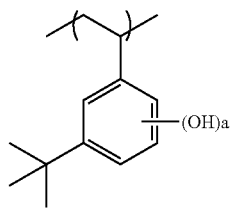 (B-11)
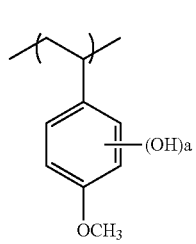 (B-12)
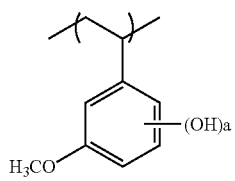 (B-13)
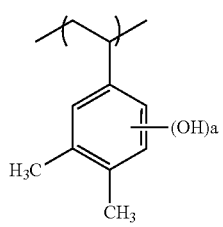 (B-14)
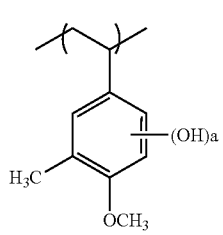 (B-15)
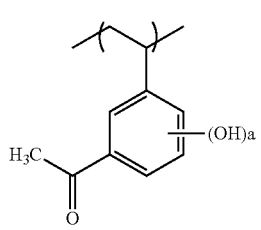 (B-16)

(B-17) 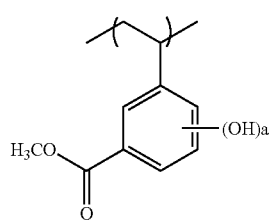
(B-18) 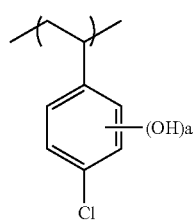
(B-19) 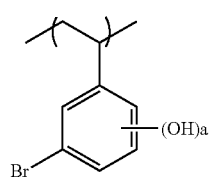
(B-20) 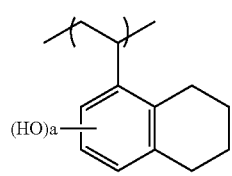
(B-21) 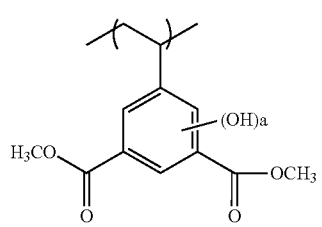
(B-22) 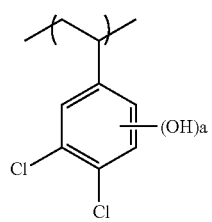
(B-23) 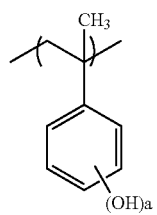
(B-24) 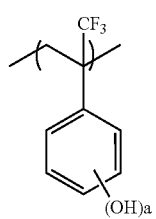
(B-25) 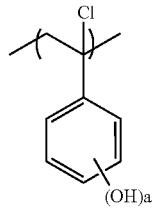
(B-26) 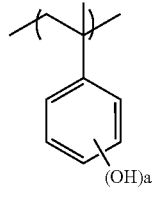
(B-27) 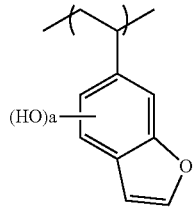
(B-28) 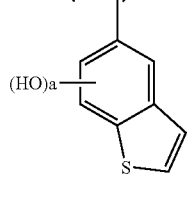
(B-29) 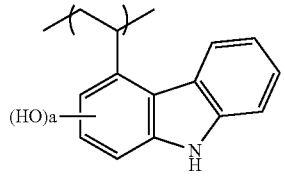
(B-30) 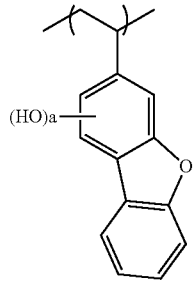

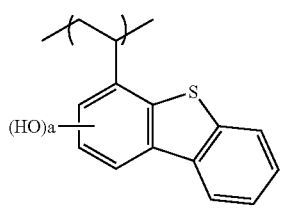
(B-31)
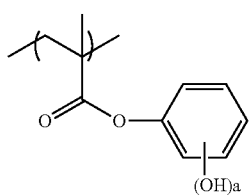
(B-32)
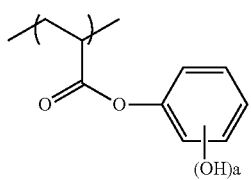
(B-33)
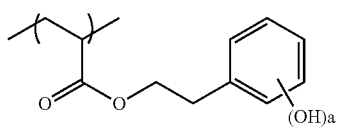
(B-34)
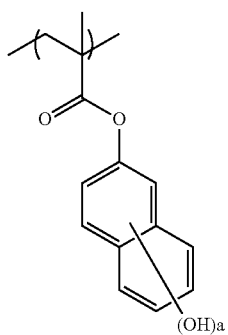
(B-35)
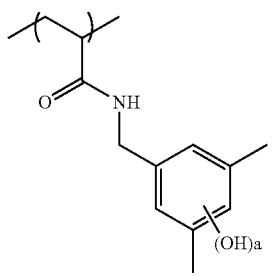
(B-36)
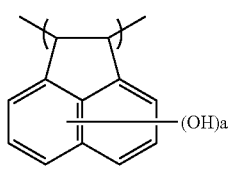
(B-37)
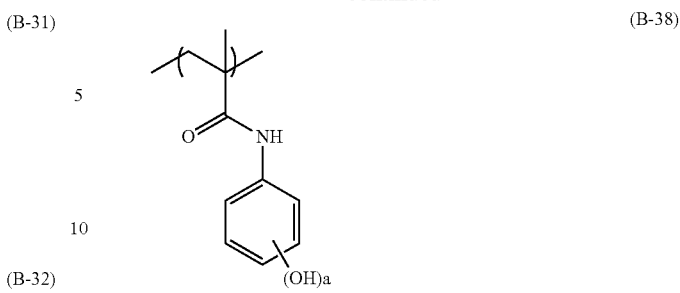
(B-38)
Moreover, among the repeating units, the repeating units specifically described below are preferable. In the formulae, R represents a hydrogen atom or a methyl group, and a represents 2 or 3.
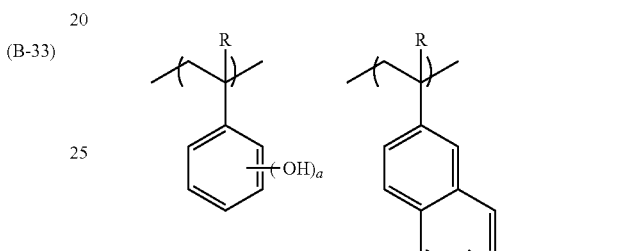
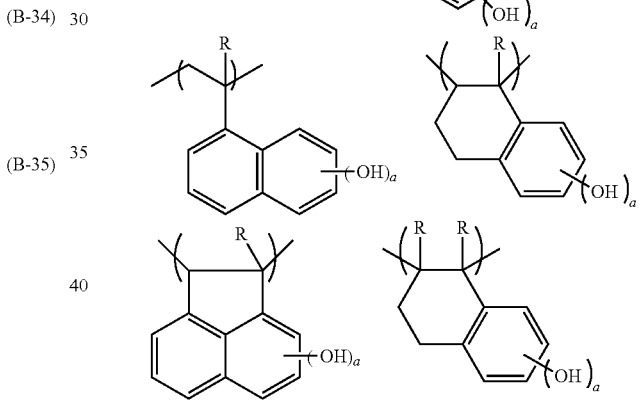
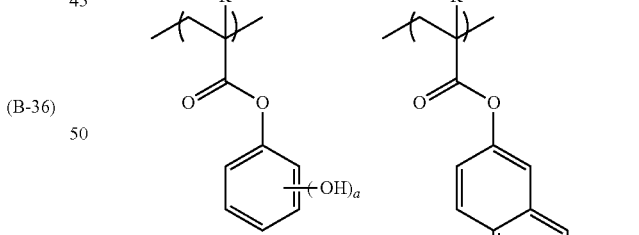
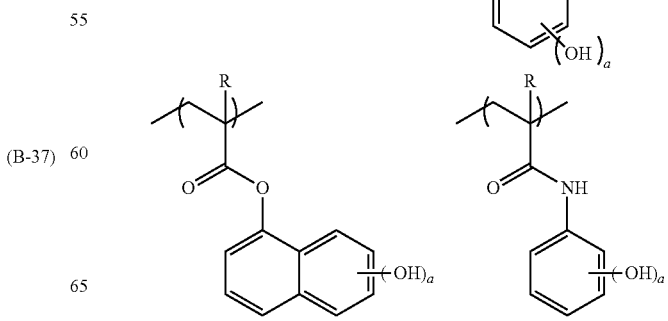

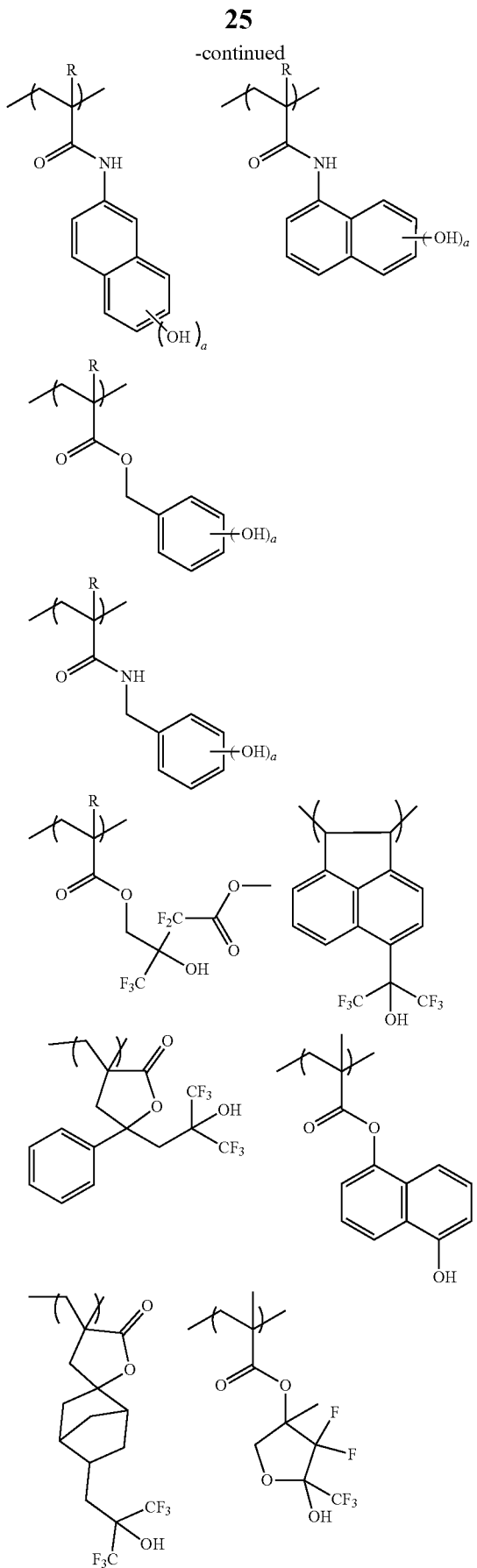

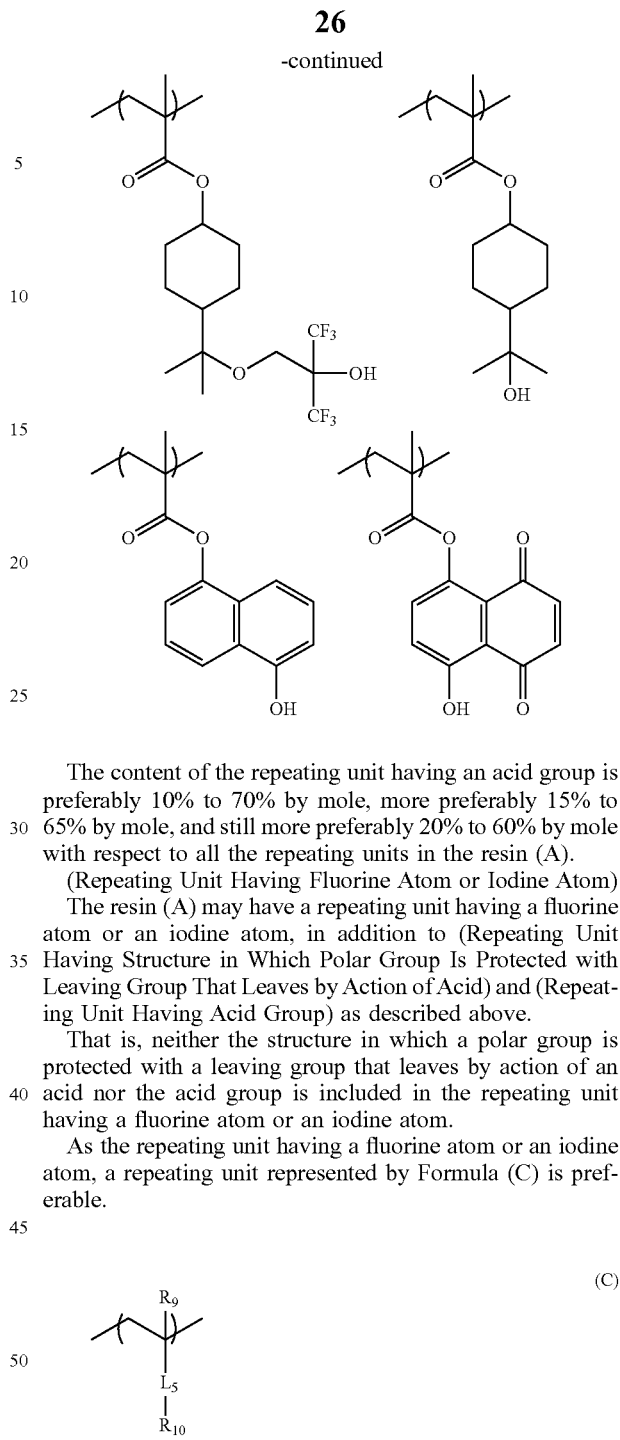

The content of the repeating unit having an acid group is preferably 10% to 70% by mole, more preferably 15% to 65% by mole, and still more preferably 20% to 60% by mole with respect to all the repeating units in the resin (A).

(Repeating Unit Having Fluorine Atom or Iodine Atom)

The resin (A) may have a repeating unit having a fluorine atom or an iodine atom, in addition to (Repeating Unit Having Structure in Which Polar Group Is Protected with Leaving Group That Leaves by Action of Acid) and (Repeating Unit Having Acid Group) as described above.

That is, neither the structure in which a polar group is protected with a leaving group that leaves by action of an acid nor the acid group is included in the repeating unit having a fluorine atom or an iodine atom.

As the repeating unit having a fluorine atom or an iodine atom, a repeating unit represented by Formula (C) is preferable.

(C)

$L_5$ represents a single bond or an ester group.

$R_9$ represents a hydrogen atom, or an alkyl group which may have a fluorine atom or an iodine atom.

$R_{10}$ represents a hydrogen atom, an alkyl group which may have a fluorine atom or an iodine atom, a cycloalkyl group which may have a fluorine atom or an iodine atom, an aryl group which may have a fluorine atom or an iodine atom, or a group formed by combination thereof.

The content of the repeating unit having a fluorine atom or an iodine atom is preferably 0% to 50% by mole, more preferably 5% to 45% by mole, and still more preferably 10% to 40% by mole with respect to all the repeating units in the resin (A).

Furthermore, from the viewpoint that (Repeating Unit Having Structure in Which Polar Group Is Protected with Leaving Group That Leaves by Action of Acid) and (Repeating Unit Having Acid Group) are not included in the repeating unit having a fluorine atom or an iodine atom as described above, the content of the repeating unit having a fluorine atom or an iodine atom is also intended to mean the content of the repeating unit having a fluorine atom or an iodine atom, excluding (Repeating Unit Having Structure in Which Polar Group Is Protected with Leaving Group That Leaves by Action of Acid) and (Repeating Unit Having Acid Group).

As described above, the repeating unit having a structure in which a polar group is protected with a leaving group that leaves by action of an acid may include a fluorine atom or an iodine atom, and the repeating unit having an acid group may also include a fluorine atom or an iodine atom.

Among the repeating units of the resin (A), the total content of the repeating unit including at least one of a fluorine atom or an iodine atom is preferably 20% to 100% by mole, more preferably 30% to 100% by mole, and still more preferably 40% to 100% by mole with respect to all the repeating units of the resin (A).

In addition, examples of the repeating unit including at least one of a fluorine atom or an iodine atom include a repeating unit which has a fluorine atom or an iodine atom, and has a structure in which a polar group is protected with a leaving group that leaves by action of an acid, a repeating unit which has a fluorine atom or an iodine atom, and has an acid group, and a repeating unit having a fluorine atom or an iodine atom.

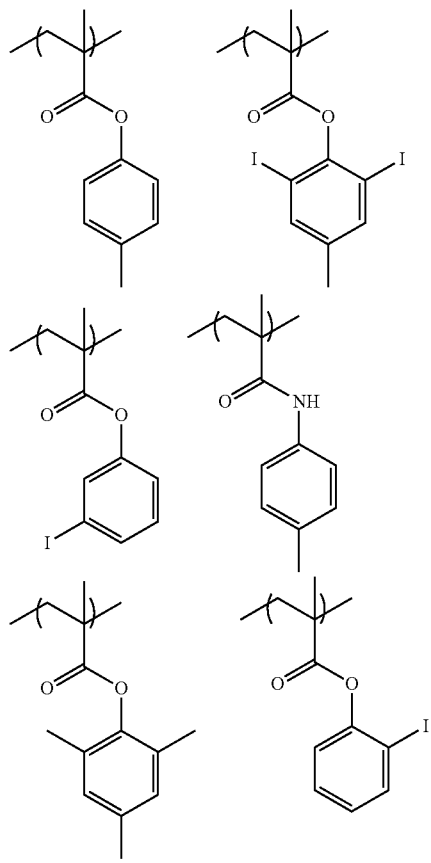

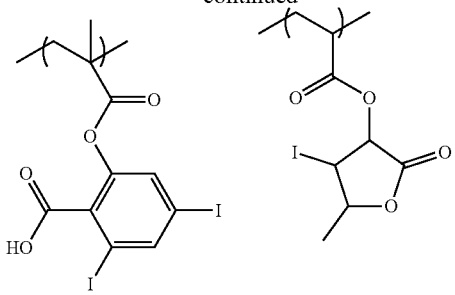

(Repeating Unit Having Group That Decomposes by Action of Alkali Developer to Increase Solubility in Alkali Developer)

The resin (A) preferably has a repeating unit having a group (polar conversion group) that decomposes by action of an alkali developer to increase the solubility in the alkali developer.

Examples of the polarity conversion group include a lactone group, a carboxylic ester group (—COO—), an acid anhydride group (—C(O)OC(O)—), an acid imido group (—NHCONH—), a carboxylic thioester group (—COS—), carbonic ester group (—OC(O)O—), a sulfuric ester group (—OSO$_2$O—), a sulfonic ester group (—SO$_2$O—), and an acid amido group (—NHCO—).

The polarity conversion group is preferably a group represented by X in the partial structure represented by General Formula (KA-1) or (KB-1), and more preferably has a partial structure represented by General Formula (KA-1).

X in General Formula (KA-1) or (KB-1) represents a carboxylic ester group: —COO—, an acid anhydride group: —C(O)OC(O)—, an acid imido group: —NHCONH—, a carboxylic thioester group: —COS—, a carbonic ester group: —OC(O)O—, a sulfuric ester group: —OSO$_2$O—, a sulfonic ester group: —SO$_2$O—, or an acid amido group (—NHCO—).

Y$^1$ and Y$^2$ may be the same as or different from each other, and each represent an electron-withdrawing group.

(Repeating Unit Having Lactone Group)

It is more preferable that the resin (A) has a repeating unit having a lactone group as a group that decomposes by action of the above-mentioned alkali developer to increase the solubility in the alkali developer.

The resin (A) may further have a repeating unit having a lactone group.

As the lactone group, any group may be used as long as it has a lactone structure, but the lactone group is preferably a group having a 5- to 7-membered ring lactone structure, and more preferably a group having a 5- to 7-membered ring lactone structure to which another ring structure is fused in the form of forming a bicyclo structure or a spiro structure. The resin (A) more preferably has a repeating unit having a group having a lactone structure represented by any of General Formulae (LC1-1) to (LC1-17). Further, the group having a lactone structure may be bonded directly to the main chain. As the lactone structure, a lactone structure represented by General Formula (LC1-1), General Formula (LC1-4), General Formula (LC1-5), General Formula (LC1-6), General Formula (LC1-13), or General Formula (LC1-14) is preferable.
LC1-1
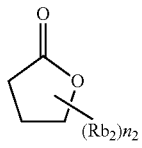
LC1-2
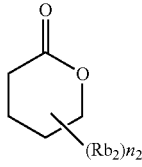
LC1-3
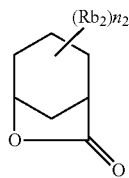
LC1-4
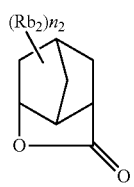
LC1-5
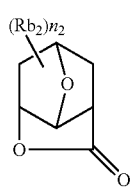
LC1-6
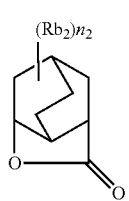
LC1-7
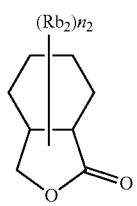
LC1-8
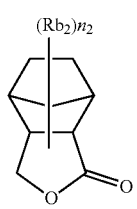
-continued
LC1-9
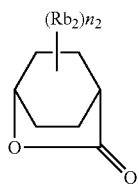
LC1-10
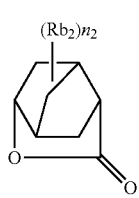
LC1-11
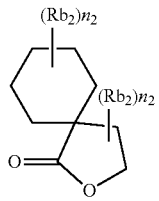
LC1-12
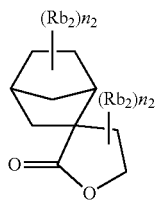
LC1-13
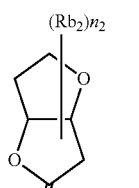
LC1-14
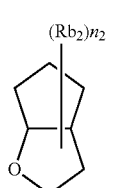
LC1-15
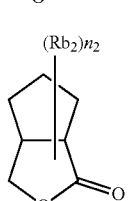
LC1-16
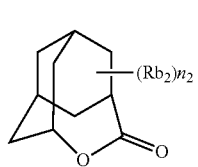

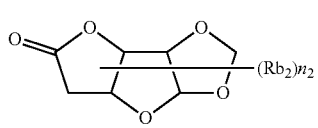

LC1-17

The lactone structural moiety may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ is 2 or more, $Rb_2$'s which are present in plural number may be the same as or different from each other, and $Rb_2$'s which are present in plural number may be bonded to each other to form a ring.

Examples of the repeating unit having a group having a lactone structure represented by any of General Formulae (LC1-1) to (LC1-17) include a repeating unit represented by General Formula (AI).

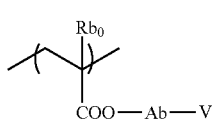

(AI)

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. As $Rb_0$, a hydrogen atom or a methyl group is preferable.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among those, the single bond or the linking group represented by -$Ab_1$-$CO_2$— is preferable. $Ab_1$ represents a linear or branched alkylene group, or a monocyclic or polycyclic cycloalkylene group, and is preferably a methylene group, an ethylene group, a cyclohexylene group, an adamantylene group, or a norbornylene group.

V represents a lactone structure represented by any of General Formulae (LC1-1) to (LC1-17).

In the repeating unit which has a group having a lactone structure, optical isomers are typically present, but any of the optical isomers may be used. In addition, one optical isomer may be used alone or a mixture of a plurality of the optical isomers may be used. In a case where one optical isomer is mainly used, the optical purity (ee) thereof is preferably 90 or more, and more preferably 95 or more.

Specific examples of the repeating unit having the group having a lactone structure are shown below, but the present invention is not limited thereto.

(In the formulae, x is H, $CH_3$, $CH_2OH$, or $CF_3$)

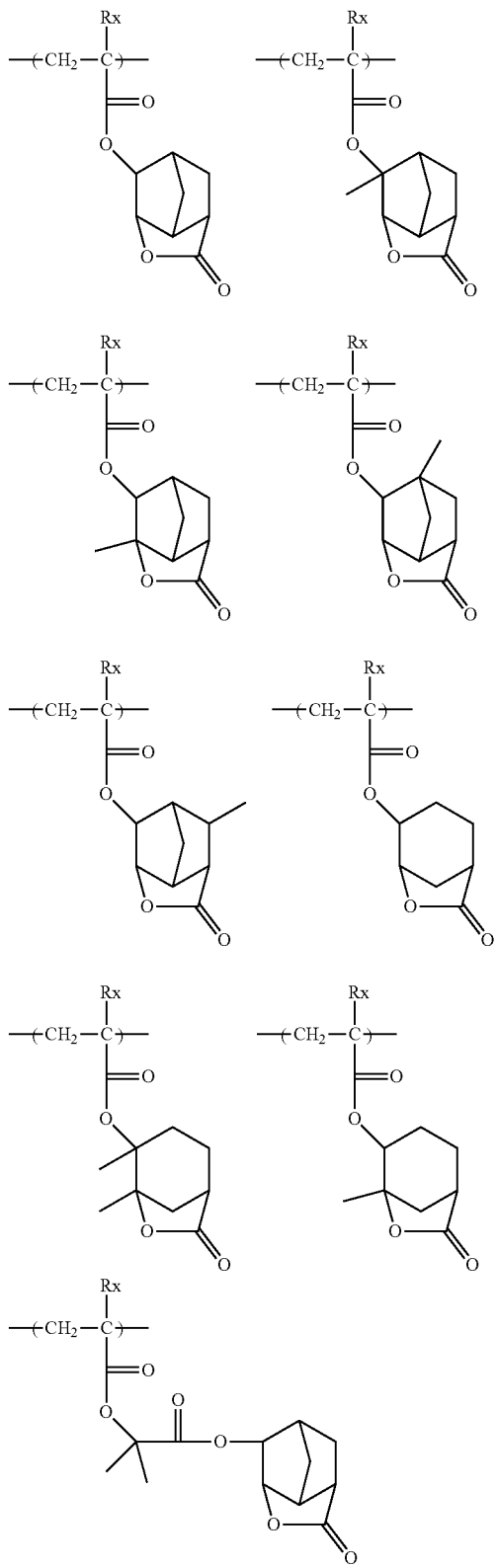

33
-continued
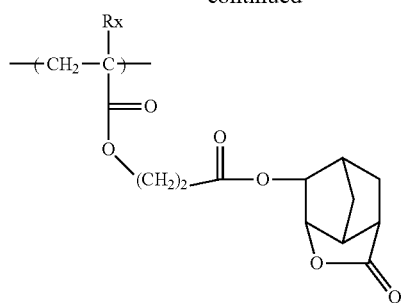
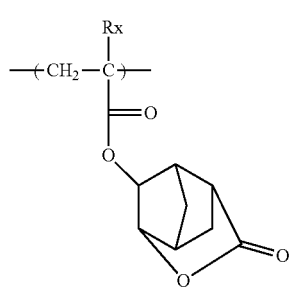
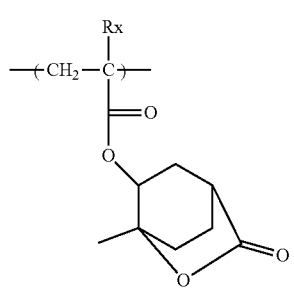
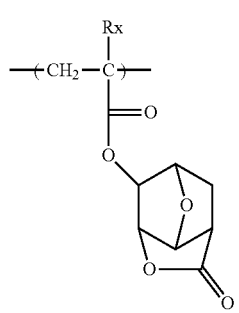
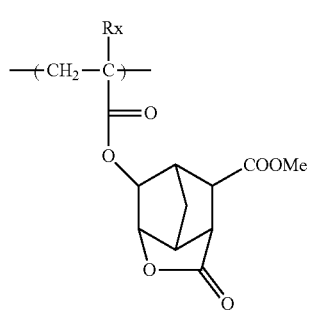
34
-continued
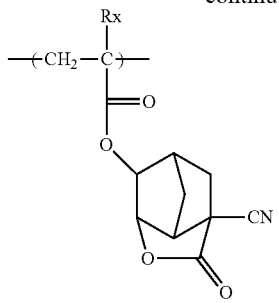
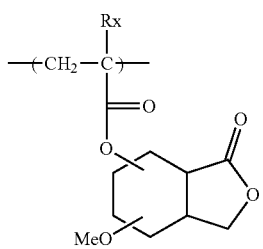
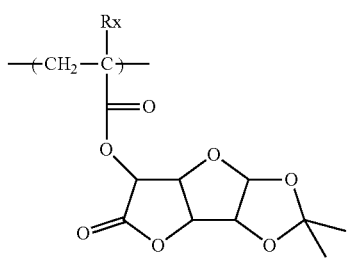
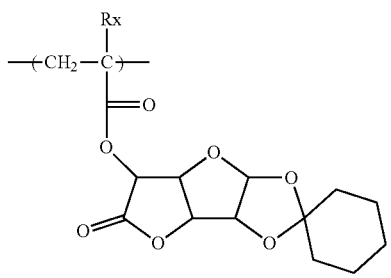
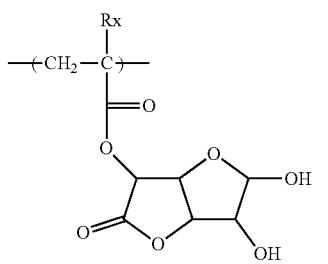
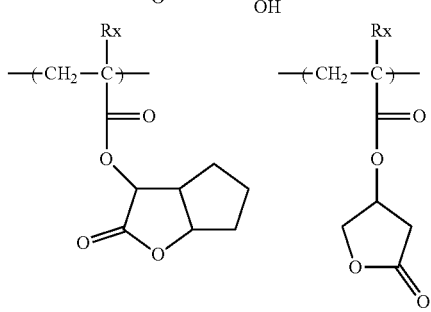

-continued

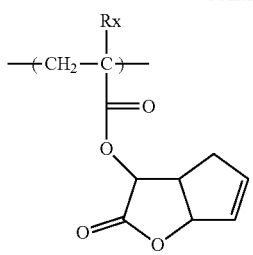
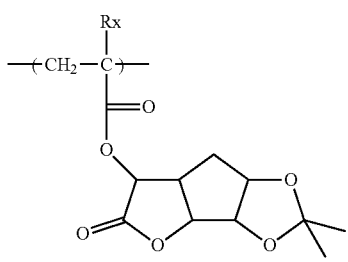
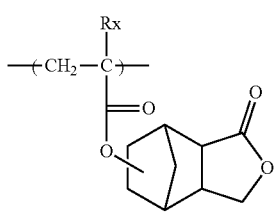
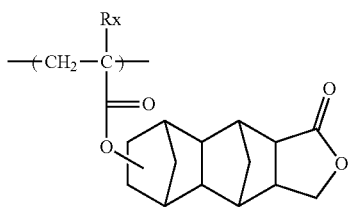
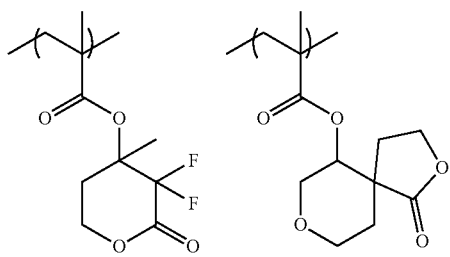
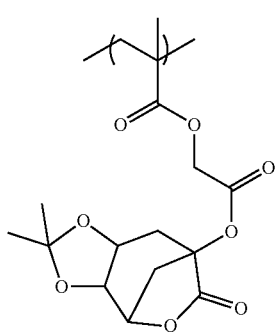

-continued

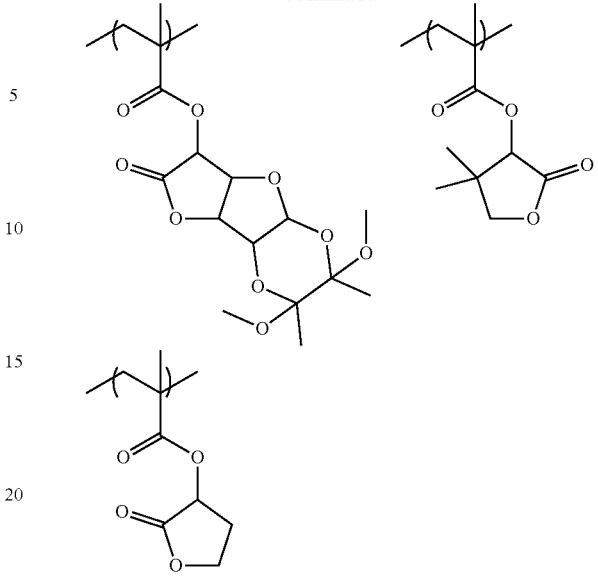

(In the formulae, x is H, CH$_3$, CH$_2$OH, or CF$_3$.)

The content of the repeating unit having a lactone group is preferably 1% to 30% by mole, more preferably 5% to 25% by mole, and still more preferably 5% to 20% by mole with respect to all the repeating units in the resin (A)

(Repeating Unit Having Photoacid Generating Group)

The resin (A) may have a repeating unit having a group (hereinafter also referred to as a "photoacid generating group") that generates an acid upon irradiation with actinic rays or radiation as a repeating unit other than the repeating units described above.

In this case, it can be considered that the repeating unit having a photoacid generating group corresponds to a compound (referred to as a "photoacid generator") that generates an acid upon irradiation with actinic rays or radiation, which will be described later. It is considered that in a case where the resin has a repeating unit having a photoacid generating group, the resin includes the photoacid generator in a mass proportion of the repeating unit having a photoacid generating group in the resin.

Examples of such a repeating unit include a repeating unit represented by General Formula (4).

(4)

$R^{41}$ represents a hydrogen atom or a methyl group. $L^{41}$ represents a single bond or a divalent linking group. $L^{42}$ represents a divalent linking group. $R^{40}$ represents a structural moiety that decomposes upon irradiation with actinic rays or radiation to generate an acid in a side chain.

Specific examples of the repeating unit represented by General Formula (4) are shown below, but the present invention is not limited thereto.

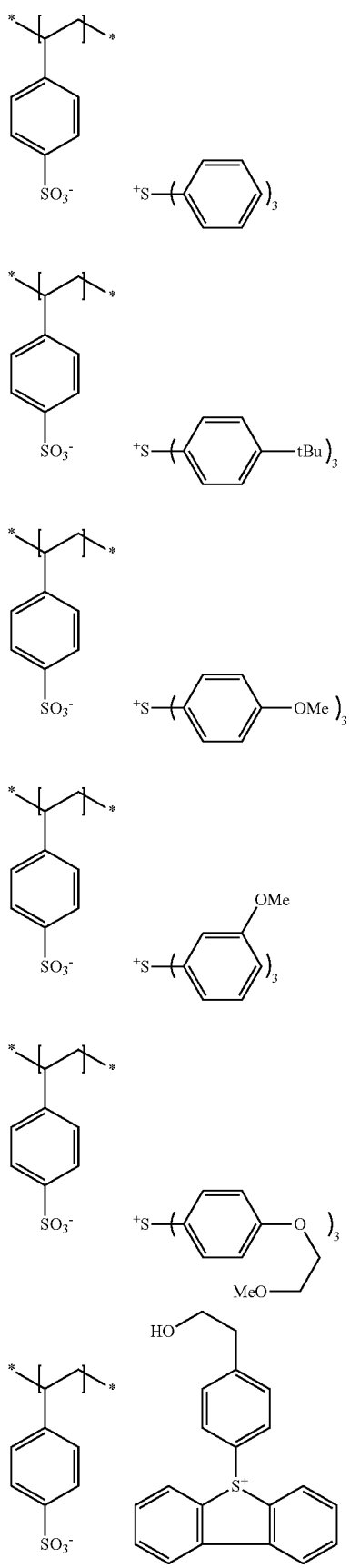
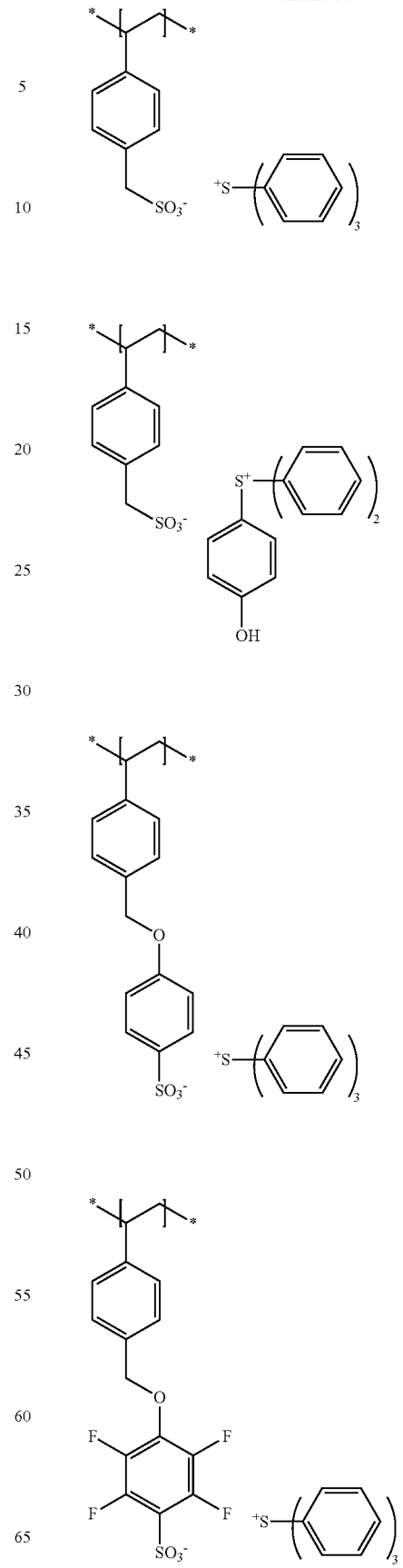

-continued

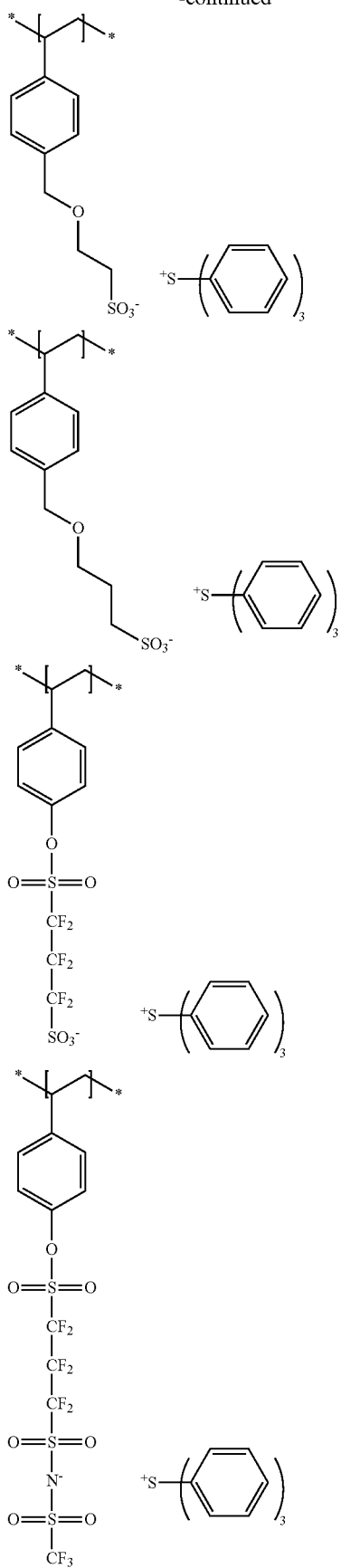

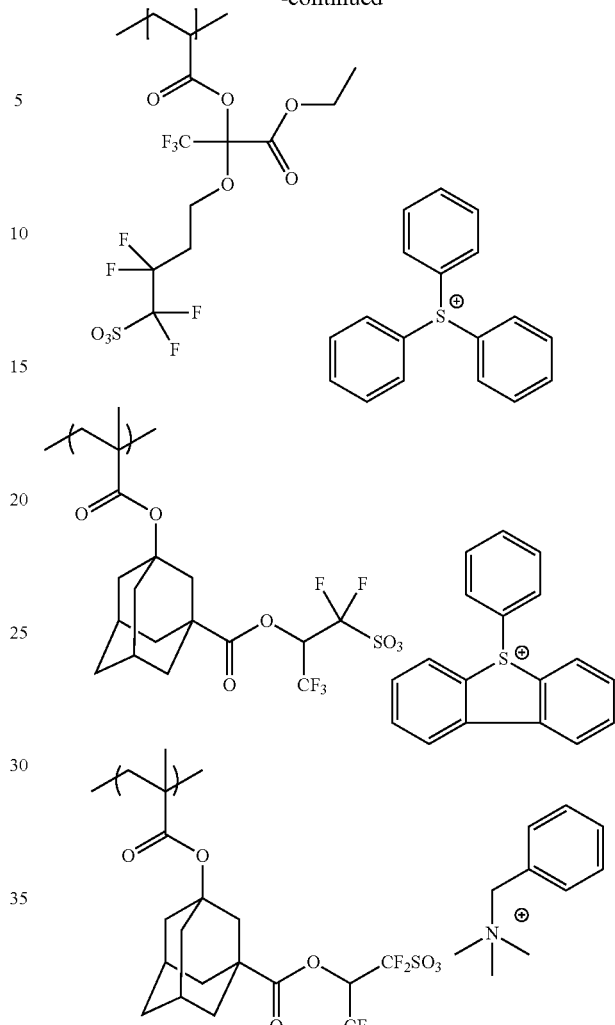

Other examples of the repeating unit represented by General Formula (4) include the repeating units described in paragraphs <0094> to <0105> of JP2014-041327A.

In a case where the resin (A) has a repeating unit having a photoacid generating group, the content of the repeating unit having a photoacid generating group is preferably 1% to 40% by mole, more preferably 5% to 35% by mole, and still more preferably 5% to 30% by mole with respect to all the repeating units of the resin (A).

(Repeating Unit Represented by General Formula (V-1) or General Formula (V-2))

The resin (A) may have a repeating unit represented by General Formula (V-1) or General Formula (V-2).

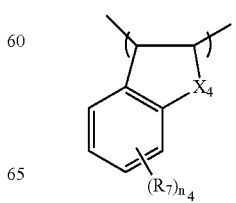

(V-1)

-continued

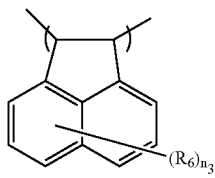
(V-2)

In the formulae, $R_6$ and $R_7$ each independently represent a hydrogen atom, a hydroxyl group, a linear, branched, or cyclic alkyl group, alkoxy group, or acyloxy group, having 1 to 10 carbon atoms, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ is a methylene group, an oxygen atom, or a sulfur atom.

Specific examples of the repeating unit represented by General Formula (V-1) or (V-2) are shown below, but are not limited thereto.

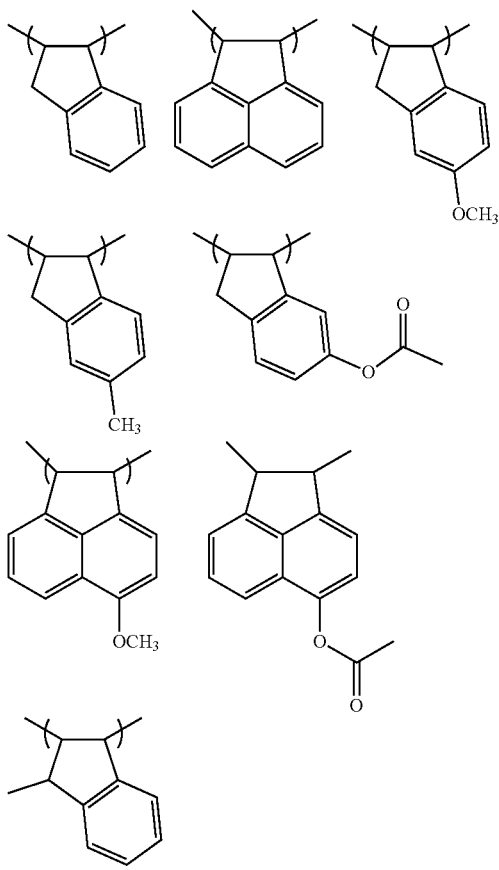

The resin (A) can be synthesized in accordance with an ordinary method (for example, radical polymerization).

The weight-average molecular weight of the resin (A) as a value in terms of polystyrene by a GPC method is preferably 1,000 to 200,000, more preferably 3,000 to 20,000, and still more preferably 5,000 to 15,000. By setting the weight-average molecular weight of the resin (A) to 1,000 to 200,000, it is possible to prevent the deterioration of heat resistance and dry etching resistance, and also prevent the deterioration of film forming properties due to deteriorated developability or increased viscosity.

The dispersity (molecular weight distribution) of the resin (A) is usually 1 to 5, preferably 1 to 3, more preferably 1.2 to 3.0, and still more preferably 1.2 to 2.0. As the dispersity is smaller, the resolution and the resist shape are excellent, the side wall of the resist pattern is smooth, and the roughness is excellent.

From the viewpoint that it is possible to suppress excessive diffusion of an acid generated or pattern collapse during development, it is preferable that the resin (A) has a high glass transition temperature (Tg). The Tg is preferably higher than 90° C., more preferably higher than 100° C., still more preferably higher than 110° C., and particularly preferably higher than 125° C. Further, since an excessively high Tg causes a decrease in a dissolution rate in a developer, the Tg is preferably 400° C. or lower, and more preferably 350° C. or lower.

Furthermore, in the present specification, the glass transition temperature (Tg) of a polymer such as the resin (A) is calculated by the following method. First, each Tg of homopolymers including only the respective repeating units included in the polymer is calculated by the Bicerano method. Hereinafter, the Tg calculated is referred to as a "Tg of the repeating unit. Next, a mass ratio (%) of each repeating unit with respect to the all the repeating units in the polymer is calculated. Next, a Tg at each mass ratio is calculated using a Fox's equation (described in Materials Letters 62 (2008) 3152, or the like), and summed up to obtain a Tg (° C.) of the polymer.

The Bicerano method is described in Prediction of polymer properties, Marcel Dekker Inc, New York (1993), or the like. Further, calculation of a Tg by the Bicerano method can be performed using a software for estimating physical properties of a polymer, MDL Polymer (MDL Information Systems, Inc.).

In order to raise the Tg of the resin (A) to higher than 90° C., it is preferable to lower the mobility of the main chain of the resin (A). Examples of a method for lowering the mobility of the main chain of the resin (A) include the following (a) to (e) methods.

(a) Introduction of a bulky substituent into the main chain.

(b) Introduction of a plurality of substituents into the main chain.

(c) Introduction of a substituent causing an interaction between the resins (A) into the vicinity of the main chain.

(d) Formation of the main chain in a cyclic structure.

(e) Linking of a cyclic structure to the main chain.

Furthermore, the resin (A) preferably has a repeating unit in which the homopolymer exhibits a Tg of 130° C. or higher.

In addition, the type of the repeating unit in which the homopolymer exhibits a Tg of 130° C. or higher is not particularly limited, and may be any of repeating units in which the homopolymer exhibits a Tg of 130° C. or higher, as calculated by a Bicerano method. Further, depending on the types of the functional groups in the repeating units represented by each of Formula (A) to Formula (E) which will be described later, it is determined that the repeating unit corresponds to a repeating unit in which the homopolymer exhibits a Tg of 130° C. or higher.

A specific example of a unit for accomplishing (a) above may be a method in which a repeating unit represented by Formula (A) is introduced into the resin (A).

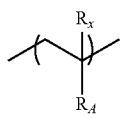
(A)

In Formula (A), RA represents a group having a polycyclic structure. $R_x$ represents a hydrogen atom, a methyl group, or an ethyl group. The group having a polycyclic structure is a group having a plurality of ring structures, and the plurality of ring structures may or may not be fused.

Specific examples of the repeating unit represented by Formula (A) include the following repeating units.

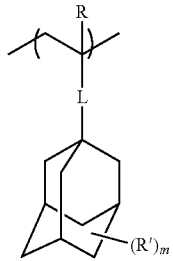
(A-1)

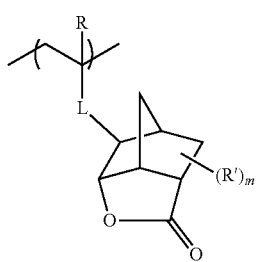
(A-2)

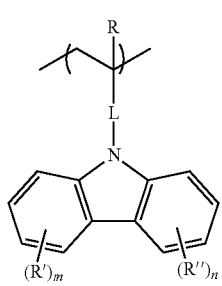
(A-3)

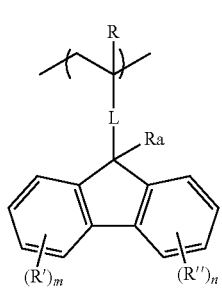
(A-4)

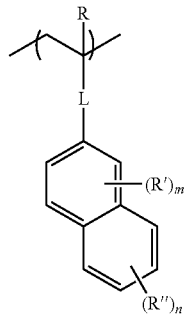
(A-5)

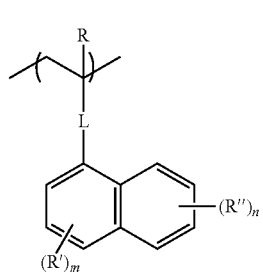
(A-6)

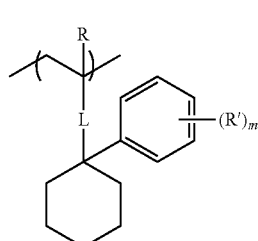
(A-7)

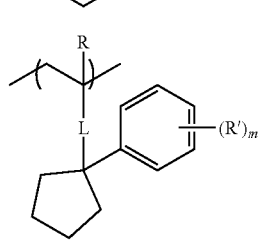
(A-8)

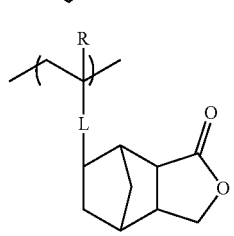
(A-9)

In the formulae, R represents a hydrogen atom, a methyl group, or an ethyl group.

Ra represents a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR''' or —COOR''': R''' represents an alkyl group or fluorinated alkyl group having 1 to 20 carbon atoms), or a carboxyl group. Further, the alkyl group, the cycloalkyl group, the aryl group, the aralkyl group, and the alkenyl group may each have a substituent. In addition, a hydrogen atom bonded to a carbon atom in the group represented by Ra may be substituted with a fluorine atom or an iodine atom.

Furthermore, R' and R" each independently represent an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR'" or —COOR'": R'" represents an alkyl group or fluorinated alkyl group having 1 to 20 carbon atoms), or a carboxyl group. Further, the alkyl group, the cycloalkyl group, the aryl group, the aralkyl group, and the alkenyl group may each have a substituent. In addition, a hydrogen atom bonded to a carbon atom in the group represented by each of R' and R" may be substituted with a fluorine atom or an iodine atom.

L represents a single bond or a divalent linking group. Examples of the divalent linking group include —COO—, —CO—, —O—, —S—, —SO—, —SO$_2$—, an alkylene group, a cycloalkylene group, an alkenylene group, and a linking group formed by the linking of a plurality of these groups.

m and n each independently represent an integer of 0 or more. The upper limits of m and n are not particularly limited, but are preferably 2 or less in many cases, and 1 or less in more cases.

A specific example of a unit for accomplishing (b) above may be a method in which a repeating unit represented by Formula (B) is introduced into the resin (A).

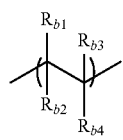

(B)

In Formula (B), $R_{b1}$ to $R_{b4}$ each independently represent a hydrogen atom or an organic group, and at least two or more of $R_{b1}$, . . . , or $R_{b4}$ are organic groups.

Furthermore, in a case where at least one of the organic groups is a group in which a ring structure is directly linked to the main chain in the repeating unit, the types of the other organic groups are not particularly limited.

In addition, in a case where all the organic groups are not a group in which a ring structure is directly linked to the main chain in the repeating unit, at least two or more of the organic groups are substituents having a number of the constituent atoms excluding hydrogen atoms of 3 or more.

Specific examples of the repeating unit represented by Formula (B) include the following repeating units.

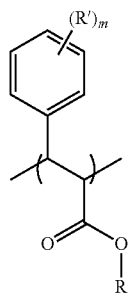

(B-1)

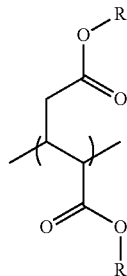

(B-2)

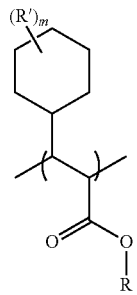

(B-3)

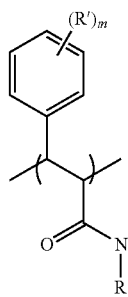

(B-4)

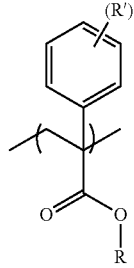

(B-5)

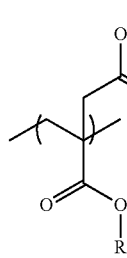

(B-6)

In the formulae, R's each independently represent a hydrogen atom or an organic group. Examples of the organic group include an organic group such as an alkyl group, a cycloalkyl group, an aryl group, an aralkyl group, and an alkenyl group, each of which may have a substituent.

R"s each independently represent an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR″ or —COOR″: R″ represents an alkyl group or fluorinated alkyl group having 1 to 20 carbon atoms), or a carboxyl group. Further, the alkyl group, the cycloalkyl group, the aryl group, the aralkyl group, and the alkenyl group may each have a substituent. In addition, a hydrogen atom bonded to a carbon atom in the group represented by R' may be substituted with a fluorine atom or an iodine atom.

m represents of an integer of 0 or more. The upper limit of m is not particularly limited, but is 2 or less in many cases, and 1 or less in more cases.

A specific example of a unit for accomplishing (c) above may be a method in which a repeating unit represented by Formula (C) is introduced into the resin (A).

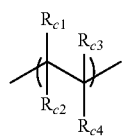

(C)

In Formula (C), $R_{c1}$ to $R_{c4}$ each independently represent a hydrogen atom or an organic group, and at least one of $R_{c1}$ . . . , or $R_{c4}$ is a group having hydrogen-bonding hydrogen atoms with a number of atoms of 3 or less from the main chain carbon. Among those, it is preferable that the group has hydrogen-bonding hydrogen atoms with a number of atoms of 2 or less (on a side closer to the vicinity of the main chain) to cause an interaction between the main chains of the resin (A).

Specific examples of the repeating unit represented by Formula (C) include the following repeating units.

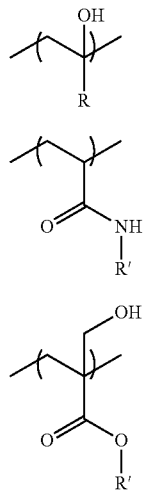

(C-1)

(C-2)

(C-3)

In the formulae, R represents an organic group. Examples of the organic group include an alkyl group, a cycloalkyl group, an aryl group, an aralkyl group, an alkenyl group, and an ester group (—OCOR or —COOR: R represents an alkyl group or fluorinated alkyl group having 1 to 20 carbon atoms), each of which may have a substituent.

R' represents a hydrogen atom or an organic group. Examples of the organic group include an organic group such as an alkyl group, a cycloalkyl group, an aryl group, an aralkyl group, and an alkenyl group. In addition, a hydrogen atom in the organic group may be substituted with a fluorine atom or an iodine atom.

A specific example of a unit for accomplishing (d) above may be a method in which a repeating unit represented by Formula (D) is introduced into the resin (A).

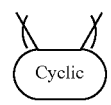

(D)

In Formula (D), "Cyclic" is a group that forms a main chain with a cyclic structure. The number of the ring-constituting atoms is not particularly limited.

Specific examples of the repeating unit represented by Formula (D) include the following repeating units.

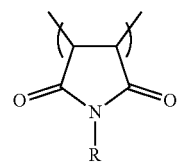

(D-1)

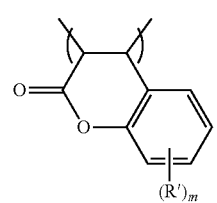

(D-2)

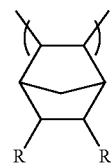

(D-3)

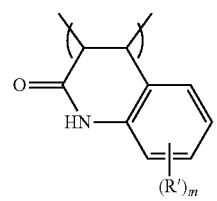

(D-4)

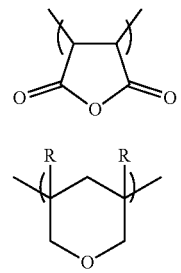

(D-5)

(D-6)

(D-7) 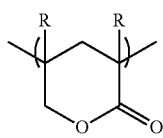

(D-8) 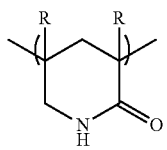

(D-9) 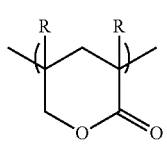

(D-10) 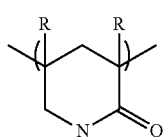

(D-11) 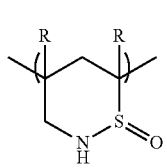

(D-12) 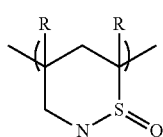

(D-13) 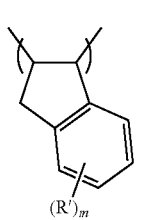

(D-14) 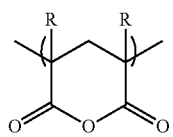

(D-15) 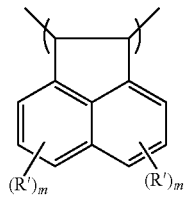

(D-16) 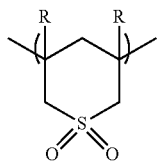

(D-17) 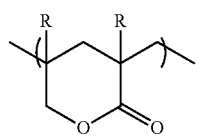

(D-18) 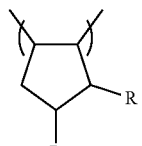

(D-19) 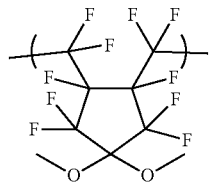

In the formulae, R's each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" represents an alkyl group or fluorinated alkyl group having 1 to 20 carbon atoms), or a carboxyl group. Further, the alkyl group, the cycloalkyl group, the aryl group, the aralkyl group, and the alkenyl group may each have a substituent. In addition, a hydrogen atom bonded to a carbon atom in the group represented by R may be substituted with a fluorine atom or an iodine atom.

In the formulae, R''s each independently represent an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" represents an alkyl group or fluorinated alkyl group having 1 to 20 carbon atoms), or a carboxyl group. Further, the alkyl group, the cycloalkyl group, the aryl group, the aralkyl group, and the alkenyl group may each have a substituent. In addition, a hydrogen atom bonded to a carbon atom in the group represented by R' may be substituted with a fluorine atom or an iodine atom.

m represents of an integer of 0 or more. The upper limit of m is not particularly limited, but is 2 or less in many cases, and 1 or less in more cases.

A specific example of a unit for accomplishing (e) above may be a method in which a repeating unit represented by Formula (E) is introduced into the resin (A).

(E) 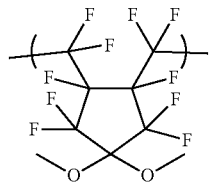

In Formula (E), Re's each independently represent a hydrogen atom or an organic group. Examples of the organic group include an alkyl group, a cycloalkyl group, an aryl group, an aralkyl group, and an alkenyl group, which may have a substituent.

The "Cyclic" is a cyclic group including a carbon atom of the main chain. The number of the atoms included in the cyclic group is not particularly limited.
Specific examples of the repeating unit represented by Formula (E) include the following repeating units.
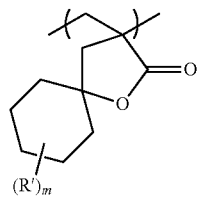
(E-1)
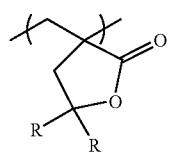
(E-2)
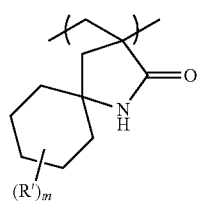
(E-3)
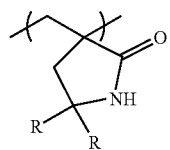
(E-4)
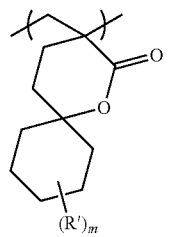
(E-5)
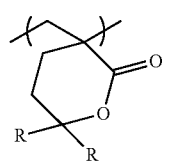
(E-6)
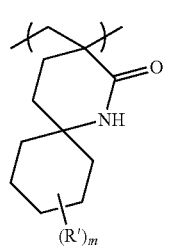
(E-7)
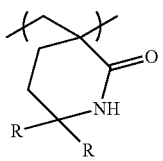
(E-8)
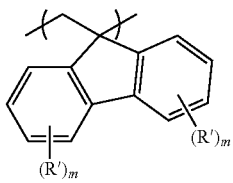
(E-9)
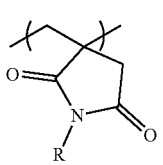
(E-10)
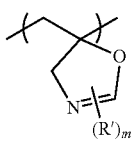
(E-11)
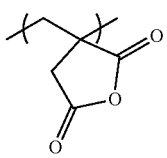
(E-12)
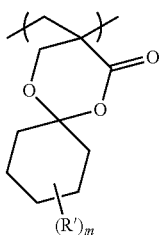
(E-13)
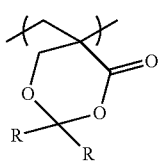
(E-14)
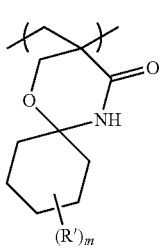
(E-15)

-continued (E-16)

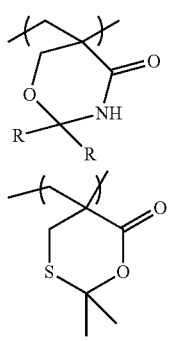

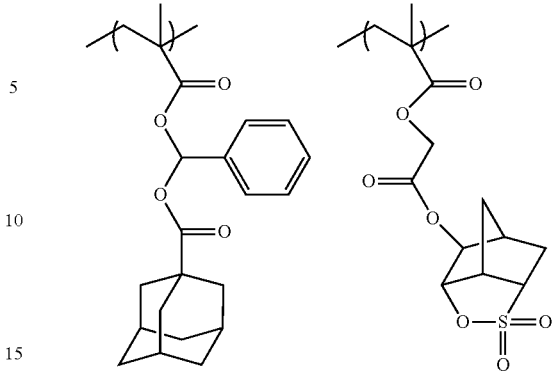

In the formulae, R's each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCR" or —COOR": R" represents an alkyl group or fluorinated alkyl group having 1 to 20 carbon atoms), or a carboxyl group. Further, the alkyl group, the cycloalkyl group, the aryl group, the aralkyl group, and the alkenyl group may each have a substituent. In addition, a hydrogen atom bonded to a carbon atom in the group represented by R may be substituted with a fluorine atom or an iodine atom. In a case where two groups represented by R are contained, they may be bonded to each other to form a ring structure.

R"s each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCR" or —COOR": R" represents an alkyl group or fluorinated alkyl group having 1 to 20 carbon atoms), or a carboxyl group. Further, the alkyl group, the cycloalkyl group, the aryl group, the aralkyl group, and the alkenyl group may each have a substituent. In addition, a hydrogen atom bonded to a carbon atom in the group represented by R' may be substituted with a fluorine atom or an iodine atom.

m represents of an integer of 0 or more. The upper limit of m is not particularly limited, but is 2 or less in many cases, and 1 or less in more cases.

Furthermore, in Formula (E-2), Formula (E-4), Formula (E-6), and Formula (E-8), two R's may be bonded to each other to form a ring.

In the resist composition, the content of the resin (A) is preferably 50% to 99.9% by mass, and more preferably 60% to 99.0% by mass in the total solid content.

In addition, the resin (A) may be used alone or in combination of two or more kinds thereof.

Further, the resin (A) preferably includes a fluorine atom and an iodine atom from the viewpoint that the effect of the present invention is more excellent. In a case where the resin (A) includes both a fluorine atom and an iodine atom, the resin (A) may have one repeating unit including both a fluorine atom and an iodine atom, and the resin (A) may also include two kinds of repeating units, that is, a repeating unit including a fluorine atom and a repeating unit including an iodine atom.

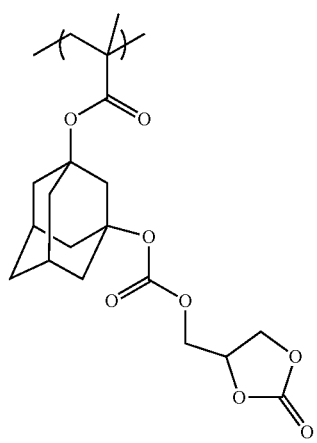

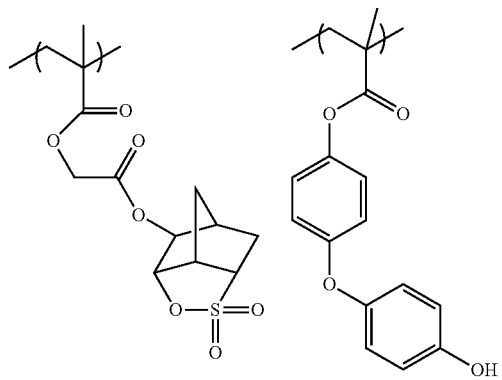

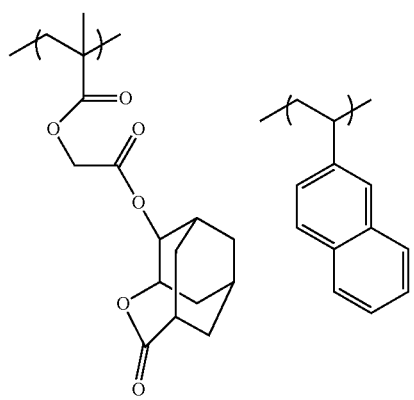

-continued

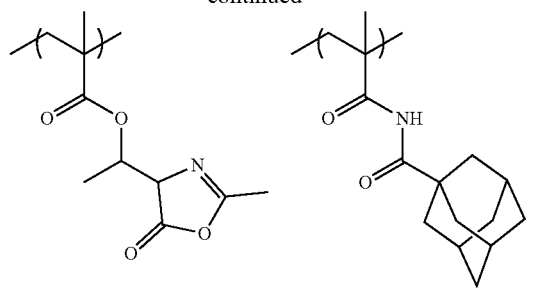
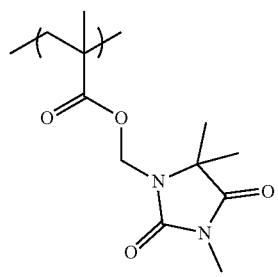
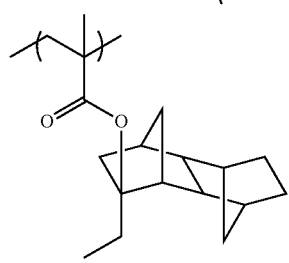
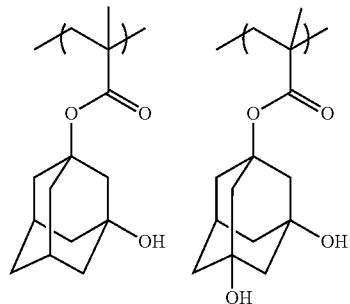
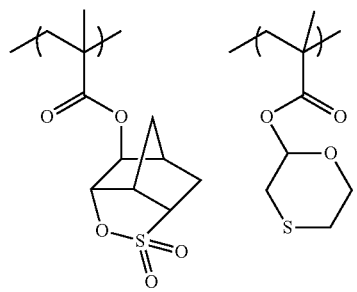
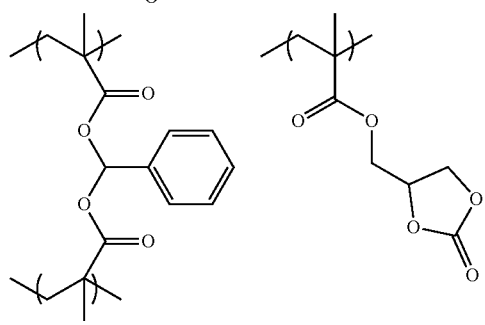

-continued

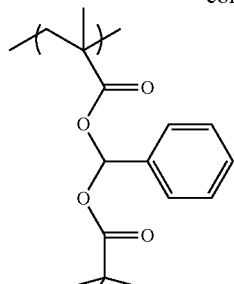
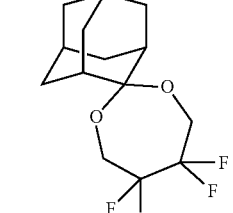
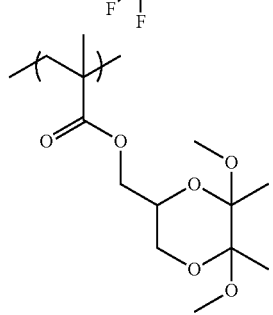
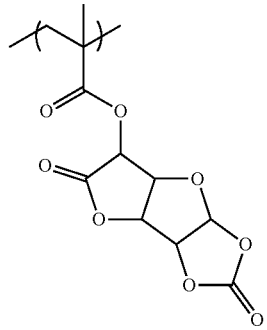

<(B) Photoacid Generator>

The resist composition may include a photoacid generator. The photoacid generator is a compound that generates an acid upon exposure with EUV light.

The photoacid generator may be in a form of a low-molecular-weight compound or in a form incorporated into a part of a polymer. Further, a combination of the form of a low-molecular-weight compound and the form incorporated into a part of a polymer may also be used.

In a case where the photoacid generator (A) of the present invention is in the form of the low-molecular-weight compound, the molecular weight is preferably 3,000 or less, more preferably 2,000 or less, and still more preferably 1,000 or less.

In a case where the photoacid generator is in the form incorporated into a part of a polymer, it may be incorporated into the resin (A) or into a resin that is different from the resin (A).

In the present invention, the photoacid generator is preferably a low-molecular-weight compound.

The photoacid generator is not particularly limited as long as it is a known photoacid generator, but a compound that generates an organic acid upon irradiation with EUV light is preferable, and a photoacid generator having a fluorine atom or an iodine atom in the molecule is more preferable.

Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkylcarboxylic acid), a carbonylsulfonylimide acid, a bis(alkylsulfonyl)imide acid, and a tris(alkylsulfonyl)methide acid.

The volume of an acid generated from the photoacid generator is not particularly limited, but from the viewpoint of suppression of diffusion of an acid generated to the unexposed area upon exposure and improvement of the resolution, the volume is preferably 240 $Å^3$ or more, more preferably 305 $Å^3$ or more, and still more preferably 350 $Å^3$ or more, and particularly preferably 400 $Å^3$ or more.

Furthermore, from the viewpoints of the sensitivity or the solubility in an application solvent, the volume of the acid generated from the photoacid generator is preferably 1,500 $Å^3$ or less, more preferably 1,000 $Å^3$ or less, and still more preferably 700 $Å^3$ or less.

The value of this volume is determined using "WinMOPAC" produced by Fujitsu Limited. That is, first, the chemical structure of the acid according to each example is input, next, using this structure as the initial structure, the most stable conformation of each acid is determined by molecular force field calculation using a Molecular Mechanics (MM) 3 method, and thereafter, with respect to the most stable conformation, molecular orbital calculation using a Parameterized Model number (PM) 3 method is performed, whereby the "accessible volume" of each acid can be computed.

The structure of an acid generated from the photoacid generator is not particularly limited, but from the viewpoint that the diffusion of the acid is suppression and the resolution is improved, it is preferable that the interaction between the acid generated from the photoacid generator and the resin (A) is strong. From this viewpoint, in a case where the acid generated from the photoacid generator is an organic acid, it is preferable that a polar group is further contained, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amido group, an acyl group, a sulfo group, a sulfonyloxy group, a sulfonamido group, a thioether group, a thioester group, a urea group, a carbonate group, a carbamate group, a hydroxyl group, and a mercapto group.

The number of the polar groups contained in the acid generated is not particularly limited, and is preferably 1 or more, and more preferably 2 or more. It should be noted that from the viewpoint that excessive development is suppressed, the number of the polar groups is preferably less than 6, and more preferably less than 4.

As the photoacid generator, photoacid generators that generate acids, as exemplified below, are preferable. Further, in some of the examples, the computed values of the volumes are added (unit: $Å^3$).

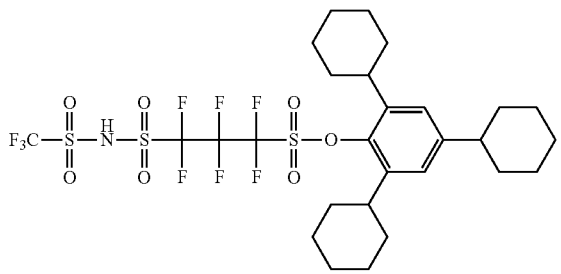

585$Å^3$

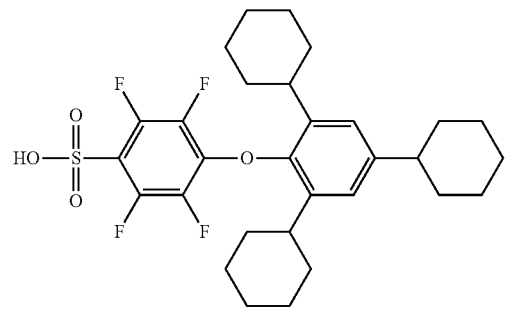

585$Å^3$

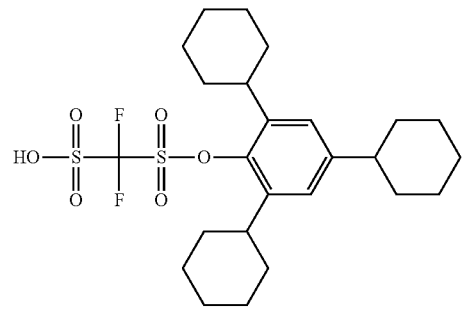

525$Å^3$

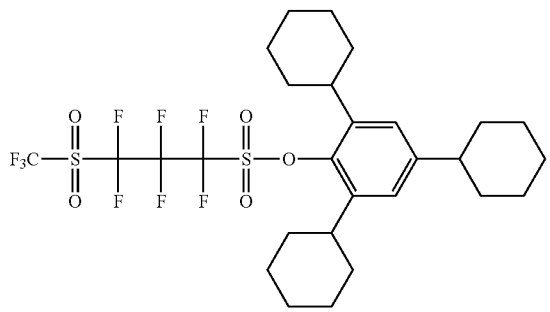

554$Å^3$

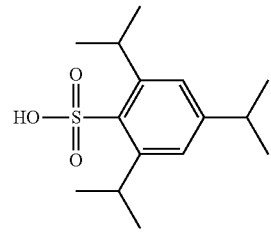

303$Å^3$

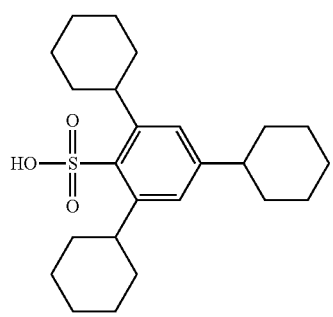
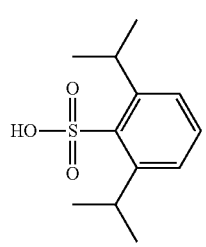
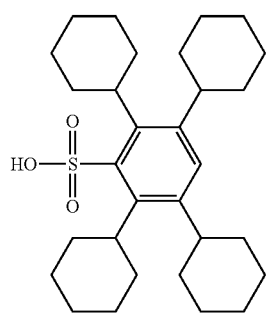
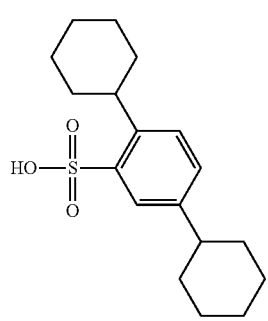
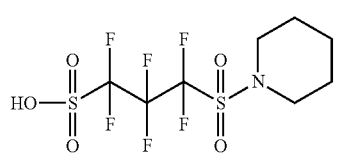
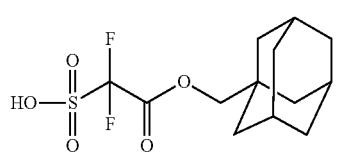
437Å³
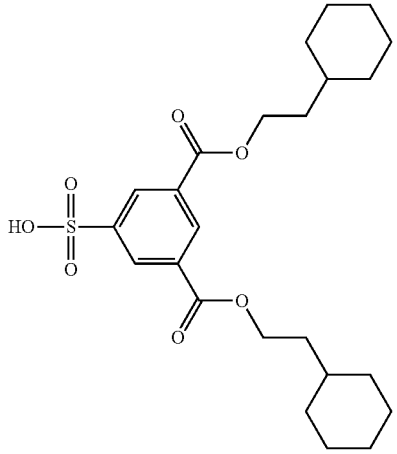
511Å³
529Å³
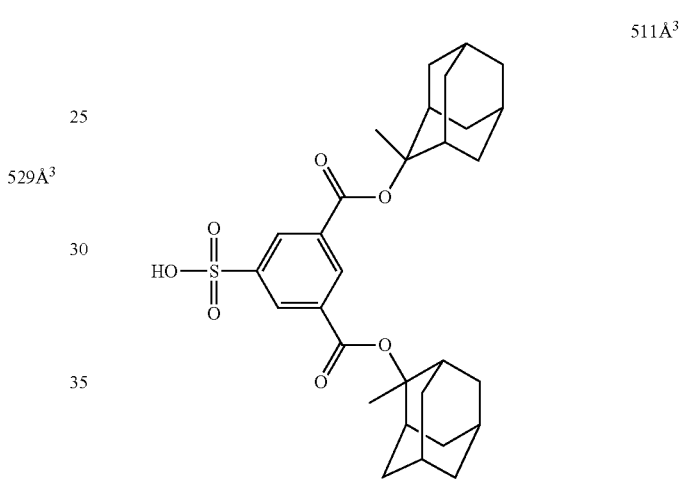
336Å³
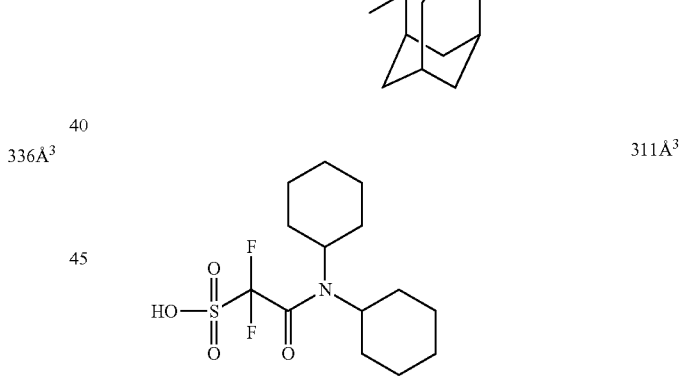
244Å³
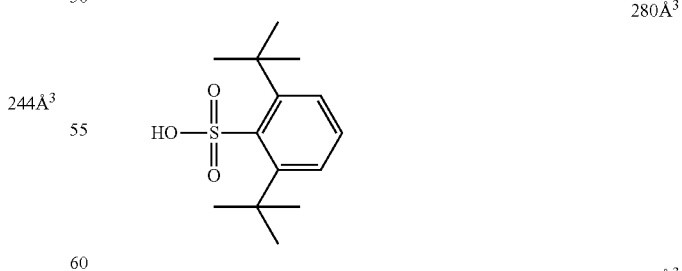
271Å³
457Å³
311Å³
280Å³
266Å³
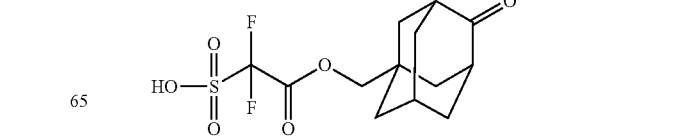

-continued
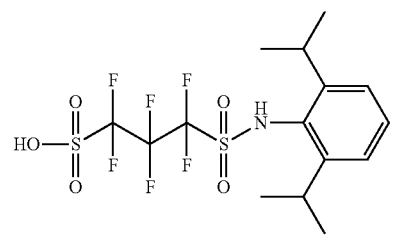
339Å³
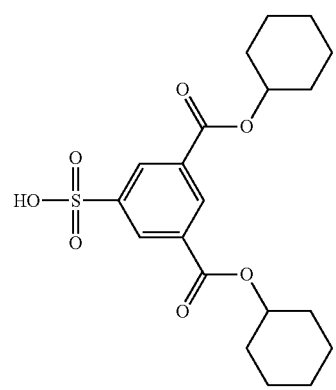
380Å³
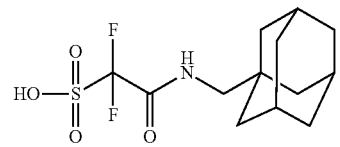
277Å³
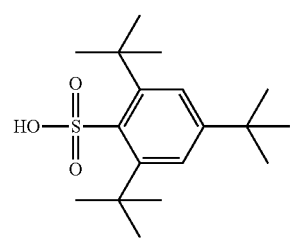
357Å³
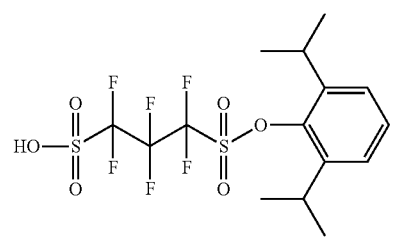
347Å³
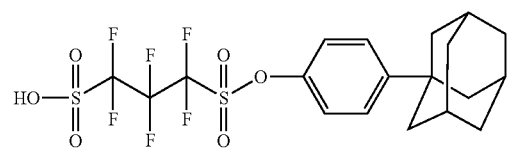
380Å³
-continued
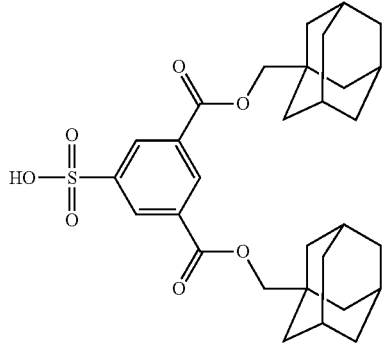
519Å³
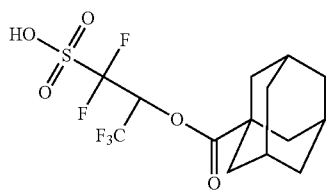
291Å³
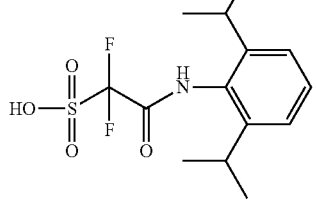
297Å³
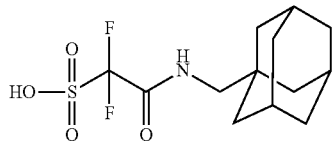
277Å³
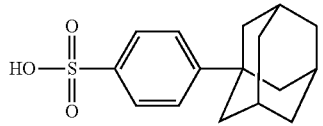
281Å³
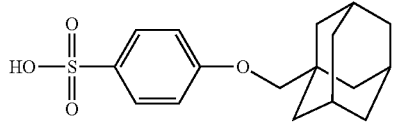
310Å³
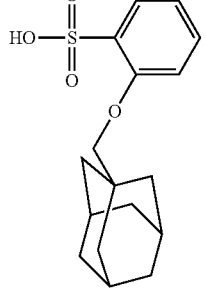
309Å³

-continued

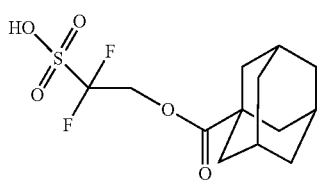
270Å³

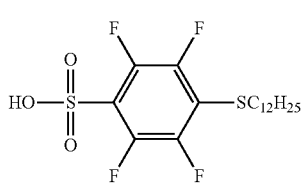
393Å³

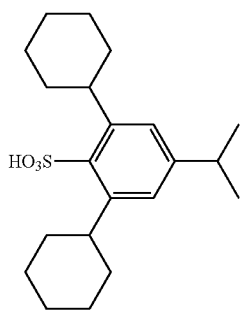
350Å³

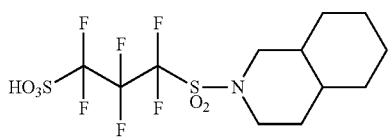
311Å³

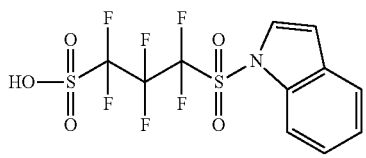
250Å³

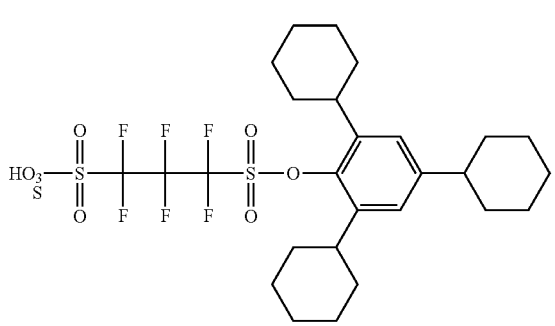
535Å³

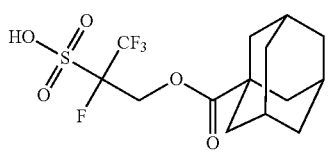
290Å³

-continued

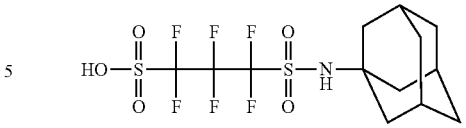
315Å³

Among those, the photoacid generator is preferably a photoacid generator including an anionic moiety and a cationic moiety from the viewpoint that the effect of the present invention is more excellent.

More specifically, the photoacid generator is preferably a compound represented by General Formula (ZI) or General Formula (ZII).

(ZI)

(ZII)

In General Formula (ZI), $R_{201}$, $R_{202}$, and $R_{203}$ each independently represent an organic group.

The number of carbon atoms of the organic group as each of $R_{201}$, $R_{202}$, and $R_{203}$ is preferably 1 to 30, and more preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group.

Examples of the group formed by the bonding of two of $R_{201}$ to $R_{203}$ include an alkylene group (for example, a butylene group and a pentylene group).

$Z^-$ represents a non-nucleophilic anion (anion having a remarkably low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and is preferably a linear or branched alkyl group having 1 to 30 carbon atoms or a cycloalkyl group having 3 to 30 carbon atoms.

As the aromatic ring group in the aromatic sulfonate anion and the aromatic carboxylate anion, an aryl group having 6 to 14 carbon atoms is preferable, and examples thereof include a phenyl group, a tolyl group, and a naphthyl group.

Specific examples of the substituent which may be contained in the alkyl group, the cycloalkyl group, and the aryl group exemplified above include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

As the aralkyl group in the aralkyl carboxylate anion, an aralkyl group having 7 to 12 carbon atoms is preferable, and examples thereof include a benzyl group, a phenethyl group, a naphthylmethyl group, a naphthylethyl group, and a naphthylbutyl group.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of the substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and the fluorine atom or the alkyl group substituted with a fluorine atom is preferable.

In addition, the alkyl groups in the bis(alkylsulfonyl) imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom is preferable. Among these, a perfluoroaliphatic sulfonate anion (more preferably having 4 to 8 carbon atoms) or a fluorine atom-containing benzenesulfonate anion is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of the acid strength, it is preferable that the pKa of the acid generated is −1 or less so as to improve the sensitivity.

Moreover, as the non-nucleophilic anion, an anion represented by General Formula (AN1) is also preferable.

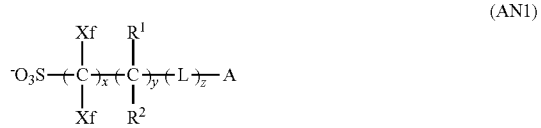

(AN1)

In the formulae,

Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are present in plural numbers, they may be the same as or different from each other.

L represents a divalent linking group, and in a case where L's are present in plural number, they may be the same as or different from each other.

A represents a cyclic organic group.

x represents an integer of 1 to 20, y represent an integer of 0 to 10, and z represents an integer of 0 to 10.

General Formula (AN1) will be described in more detail.

As the alkyl group in the alkyl group substituted with a fluorine atom of Xf, an alkyl group having 1 to 10 carbon atoms is preferable, and an alkyl group having 1 to 4 carbon atoms is more preferable. In addition, as the alkyl group in the alkyl group substituted with a fluorine atom of Xf a perfluoroalkyl group is preferable.

Xf is preferably a fluorine atom or a perfluoroalkyl group having or 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom or $CF_3$ is preferable. In particular, it is preferable that both Xf's are a fluorine atom.

The alkyl group of each of $R^1$ and $R^2$ may have a substituent (preferably a fluorine atom), and the number of carbon atoms in the substituent is preferably 1 to 4. As the substituent, a perfluoroalkyl group having 1 to 4 carbon atoms is preferable. Specific examples of the alkyl group having a substituent of each of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

As each of $R^1$ and $R^2$, the fluorine atom or $CF_3$ is preferable.

x is preferably an integer of 1 to 10, and more preferably 1 to 5.

y is preferably an integer of 0 to 4, and more preferably 0.

z is preferably an integer of 0 to 5, and more preferably an integer of 0 to 3.

The divalent linking group of L is not particularly limited, and examples thereof include —COO—, —CO—, —O—, —S—, —SO—, —SO$_2$—, an alkylene group, a cycloalkylene group, an alkenylene group, a linking group obtained by linking a plurality of these groups to each other, with the linking group having 12 or less carbon atoms in total being preferable. Among those, —COO—, —OCO—, —CO—, or —O— is more preferable, and —COO— or —OCO— is still more preferable.

The cyclic organic group of A is not particularly limited as long as it has a cyclic structure, and examples thereof include an alicyclic group, an aromatic ring group, and a heterocyclic group (including not only a heterocyclic group having aromaticity but also a heterocyclic group having no aromaticity).

The alicyclic group may be either a monocycle or a polycycle, and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among those, an alicyclic group with a bulky structure, having 7 or more carbon atoms, such as a norbornyl group, a tricyclodecanyl group, a tetracyclodecanyl group, a tetracyclododecanyl group, and an adamantyl group is preferable from the viewpoints the in-film diffusion in a heating step after exposure can be suppressed and a mask error enhancement factor (MEEF) is improved.

Examples of the aromatic ring group include a benzene ring, a naphthalene ring, a phenanthrene ring, and an anthracene ring.

Examples of the heterocyclic group include a group derived from a furan ring, a thiophene ring, a benzofuran ring, a benzothiophene ring, a dibenzofuran ring, a dibenzothiophene ring, a pyridine ring, or the like.

Among those, the group derived from the furan ring, the thiophene ring, or the pyridine ring is preferable.

Moreover, the cyclic organic group also includes a lactone structure, and specific examples thereof include the above-mentioned lactone structures represented by General Formulae (LC1-1) to (LC1-17).

The cyclic organic group may have a substituent. Examples of the substituent include an alkyl group (which may be linear, branched, or cyclic, and preferably has 1 to 12 carbon atoms), a cycloalkyl group (which may be either a monocycle or a polycycle, in a case where the cycloalkyl group is the polycycle, it may be a spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group. Incidentally, the carbon constituting the cyclic organic group (the carbon contributing to ring formation) may be a carbonyl carbon.

Examples of the organic group of each of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, and $R_{203}$ are aryl groups. As the aryl group, not only a phenyl group or a naphthyl group but also a heteroaryl group such as an indole residue and a pyrrole residue can be used.

As the alkyl group of each of $R_{201}$ to $R_{203}$, a linear or branched alkyl group having 1 to 10 carbon atoms is preferable, and a methyl group, an ethyl group, an n-propyl group, an i-propyl group, an n-butyl group, or the like is more preferable.

As the cycloalkyl group of each of $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of the substituent which may be contained in these groups include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

In General Formula (ZII), $R_{204}$ and $R_{205}$ each independently represent an aryl group, an alkyl group, or a cycloalkyl group.

The aryl group, the alkyl group, and the cycloalkyl group of each of $R_{204}$ and $R_{205}$ are the same as the above-mentioned groups as the aryl group, the alkyl group, and the cycloalkyl group of each of $R_{201}$ to $R_{203}$ in General Formula (ZI).

Examples of the substituent which may be contained in the aryl group, the alkyl group, and the cycloalkyl group of each of $R_{204}$ and $R_{205}$ include the same ones which may be contained in the above-mentioned groups as the aryl group, the alkyl group, and the cycloalkyl group of each of $R_{201}$ to $R_{203}$ in the above-mentioned compound (ZI).

$Z^-$ represents a non-nucleophilic anion, and examples thereof include the same ones as described as the non-nucleophilic anion of $Z^-$ in General Formula (ZI).

With regard to the photoacid generator, reference can be made to paragraphs <0368> to of JP2014-041328A and paragraphs <0240> to <0262> of JP2013-228681A (corresponding to paragraph <0339> of US2015/0004533A), the contents of which are incorporated herein by reference. In addition, specific preferred examples of the photoacid generator include, but are not limited to, the following compounds.

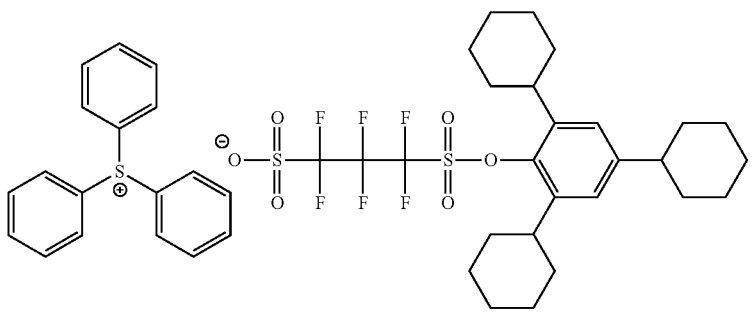

(z1)

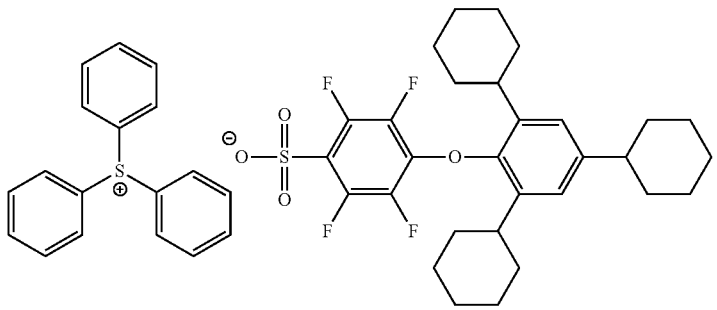

(z2)

-continued
(z3)
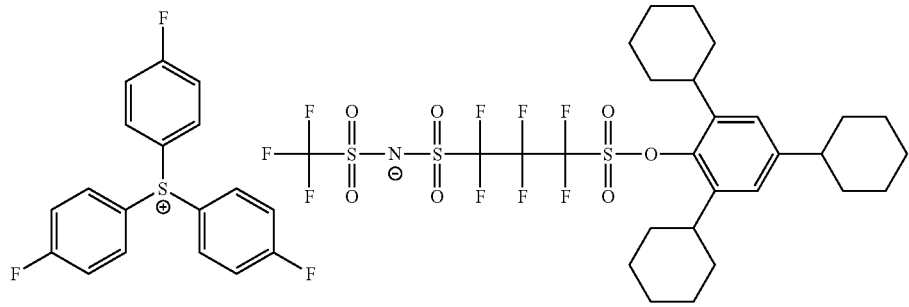
(z4)
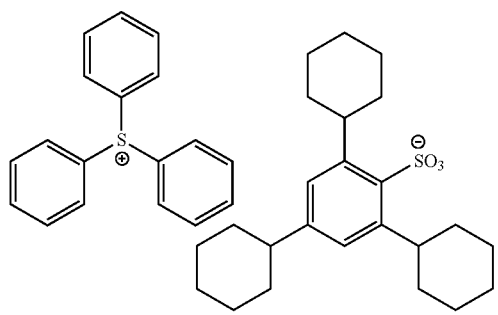
(z5)
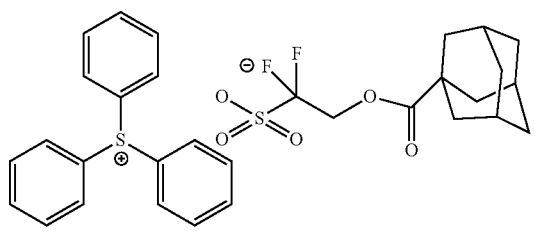
(z6)
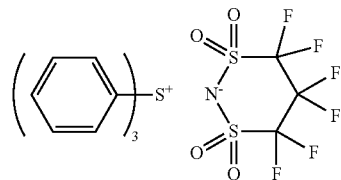
(z7)
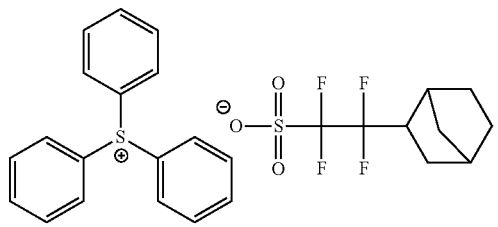
(z8)
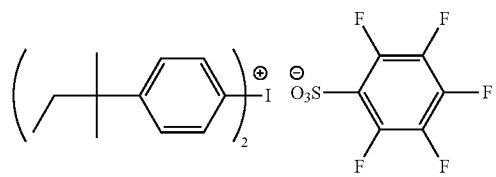
(z9)
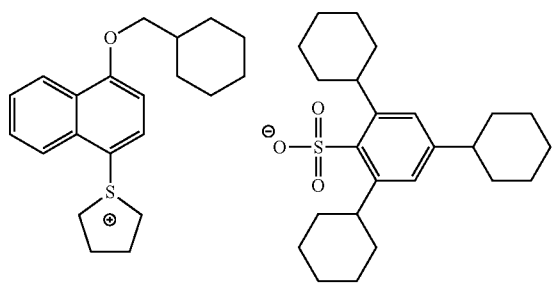
(z10)
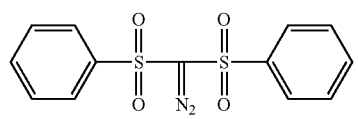
(z11)
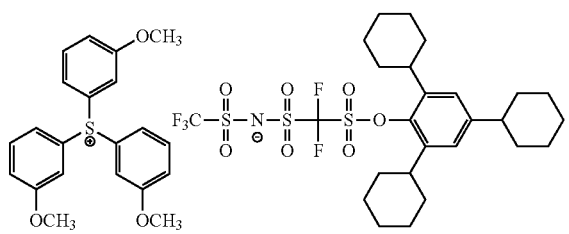

-continued
(z12)
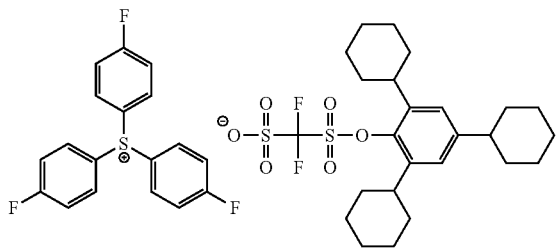
(z13)
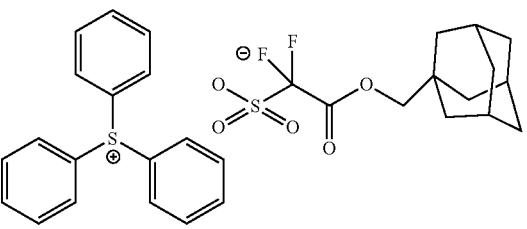
(z14)
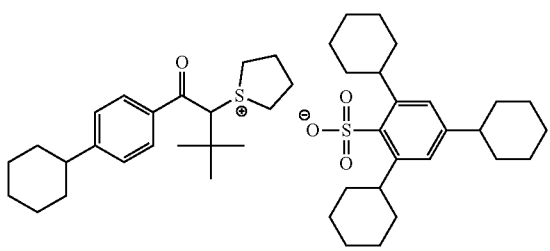
(z15)
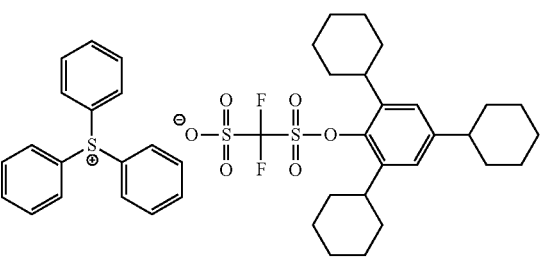
(z16)
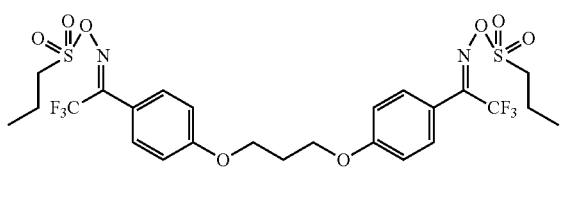
(z17)
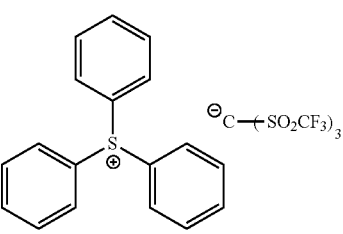
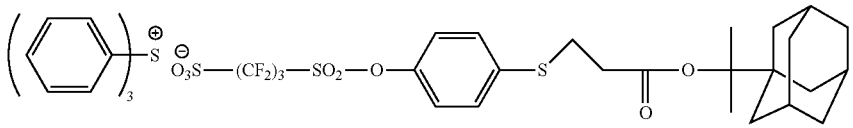
(z18)
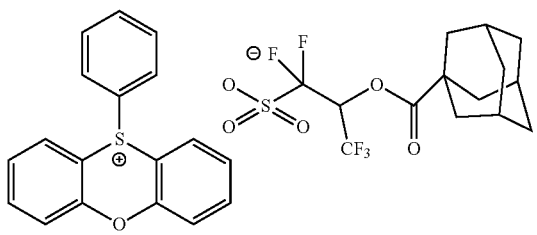
(z19)
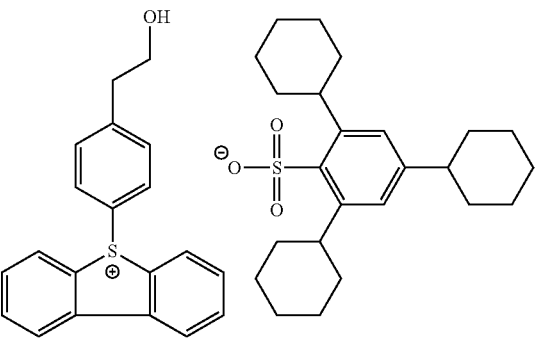
(z20)
(z21)
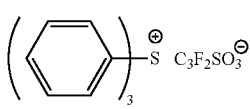
(z22)
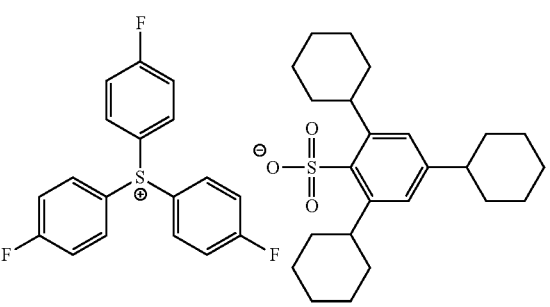

-continued
(z23)
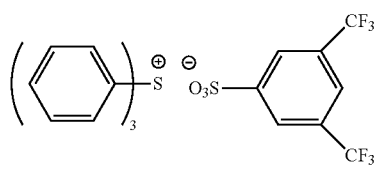
(z24)
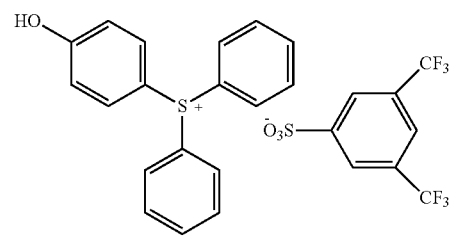
(z25)
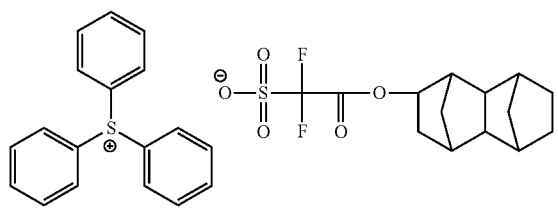
(z26)
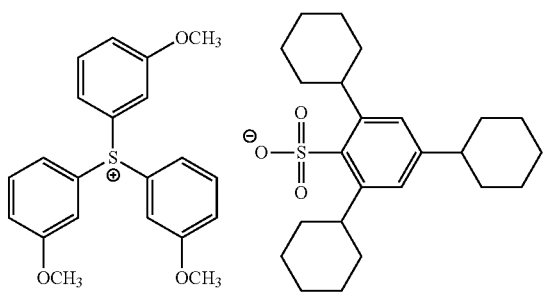
(z27)
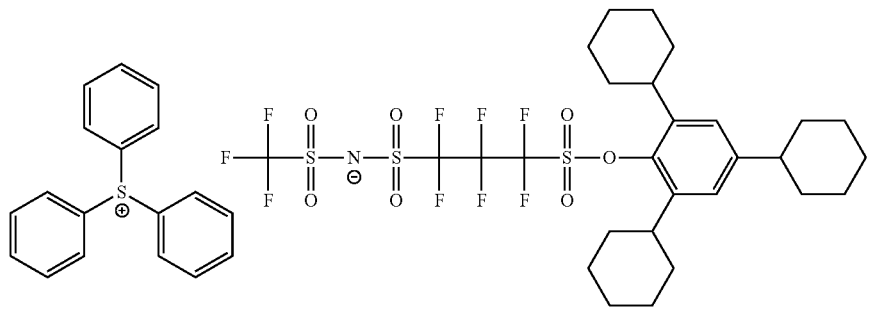
(z28)
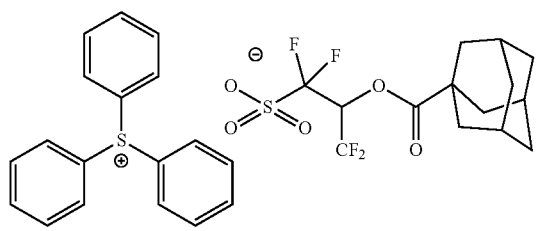
(z29)
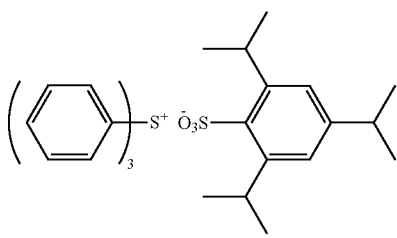
(z30)
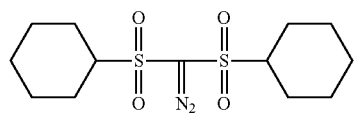
(z31)
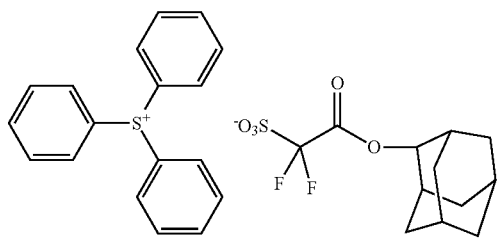

(z32) 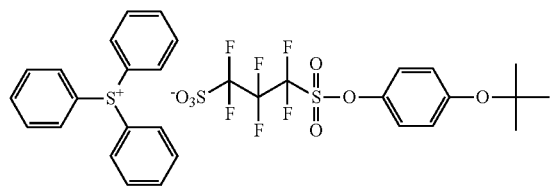
(z33) 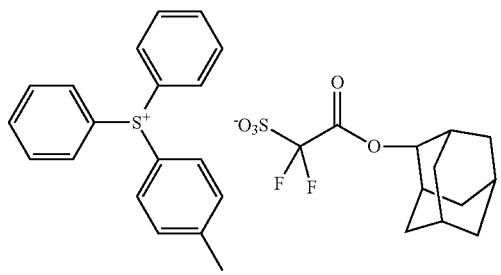
(z34) 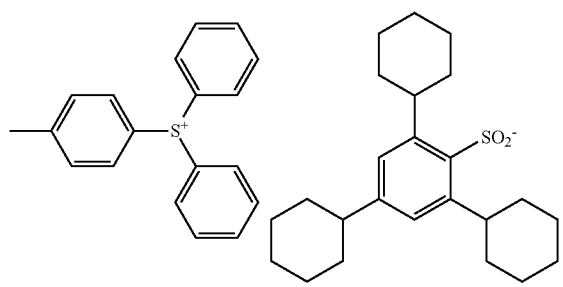
(z35) 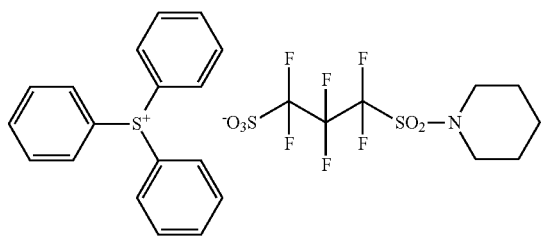
(z36) 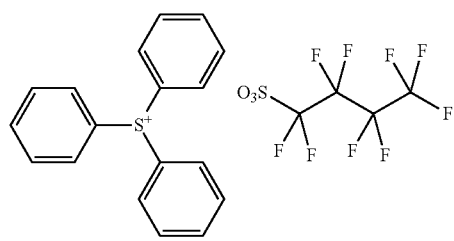
(z37) 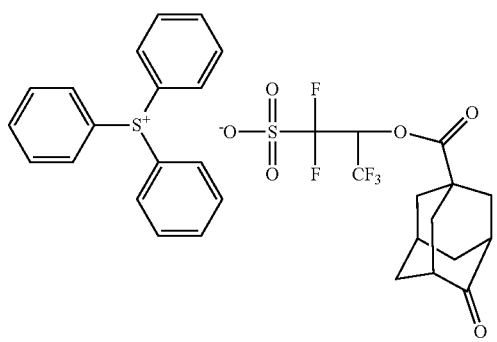
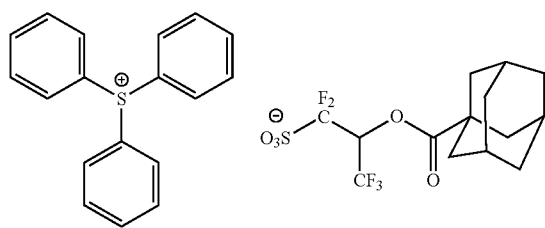
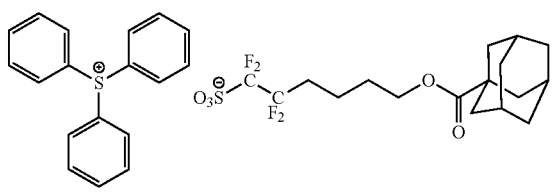
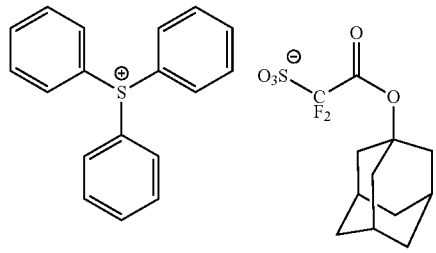
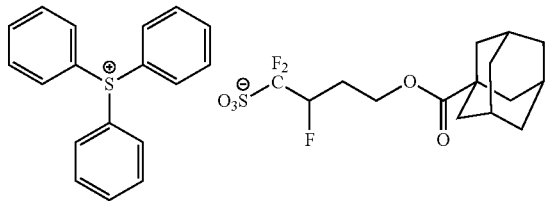
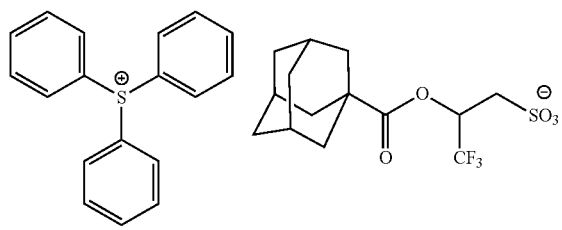
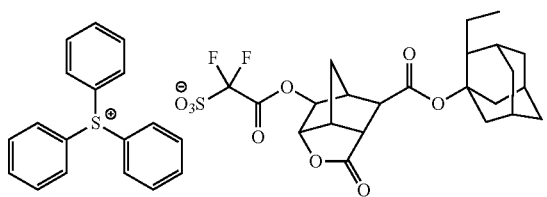

-continued
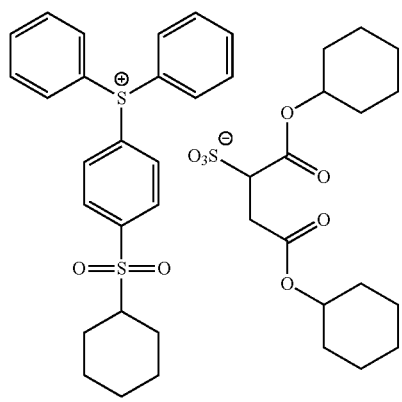
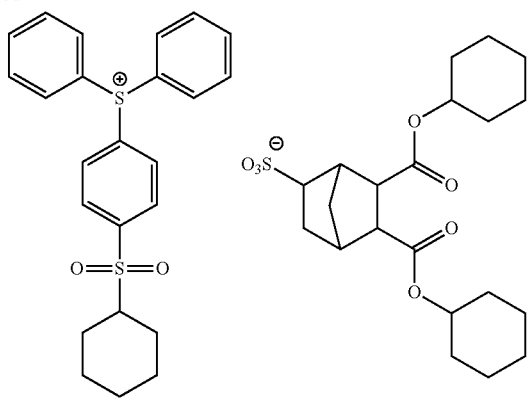
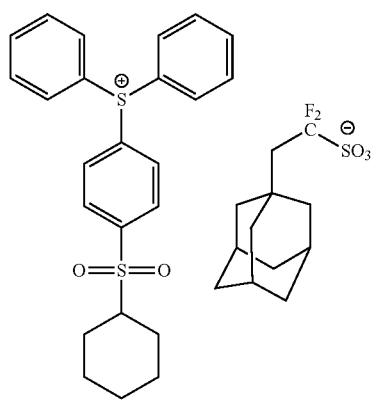
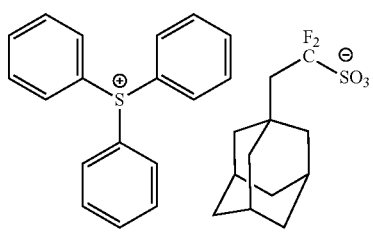
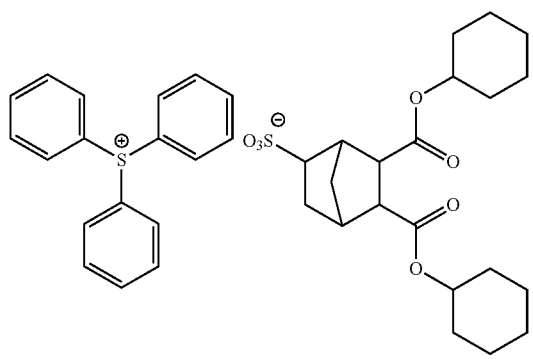
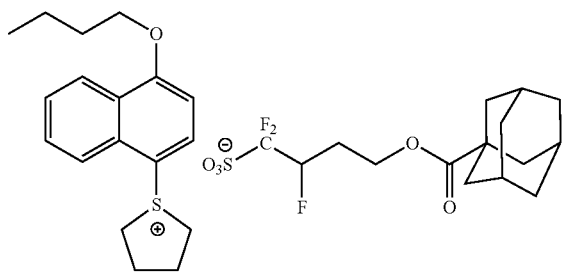
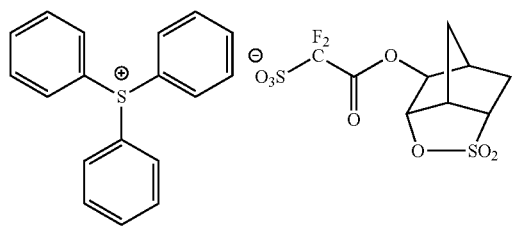
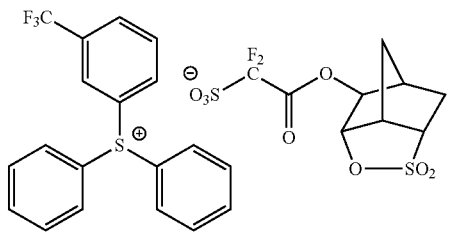
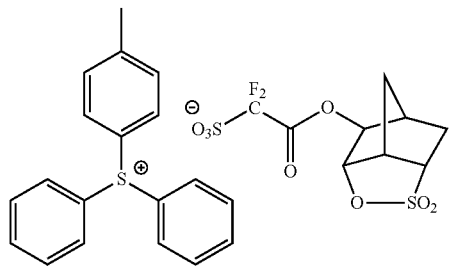
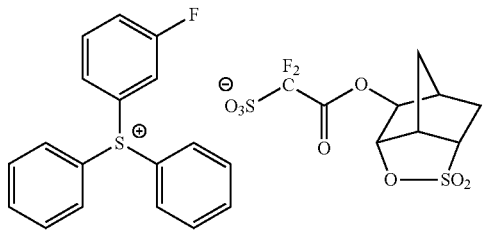

-continued
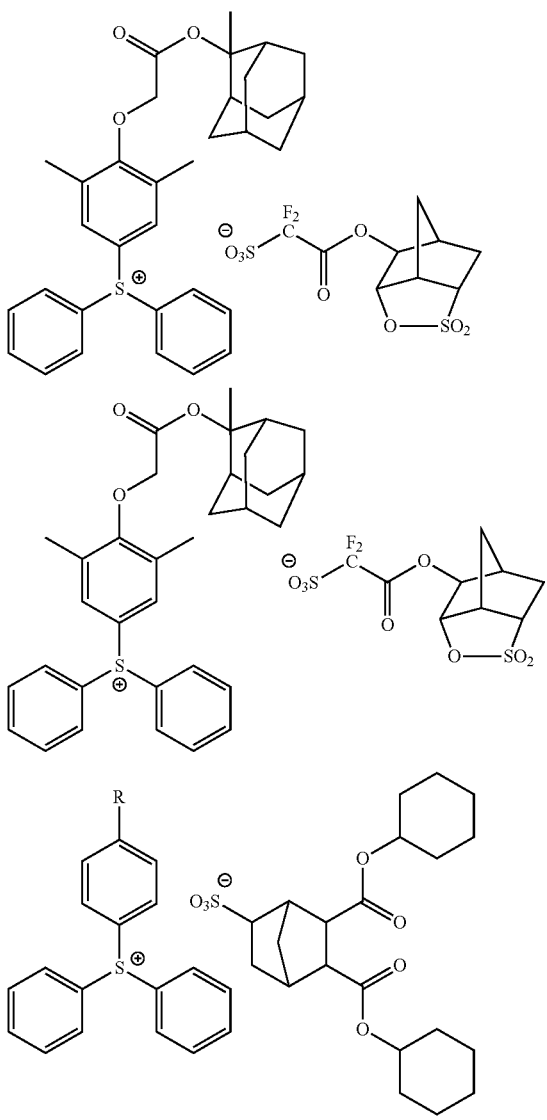
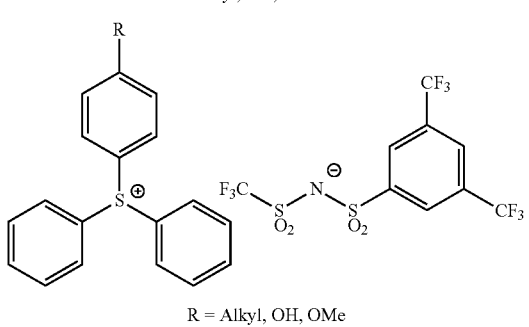
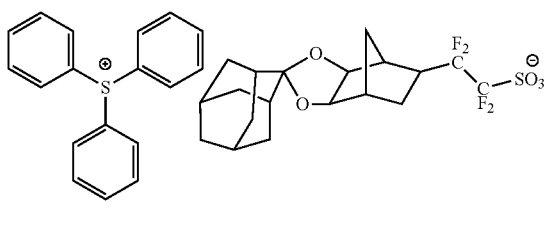
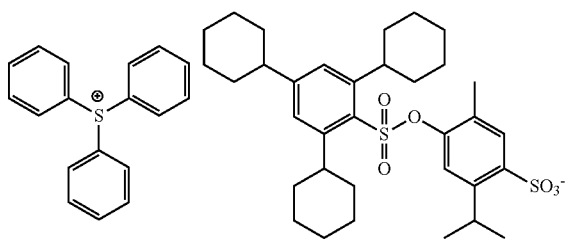

-continued
81
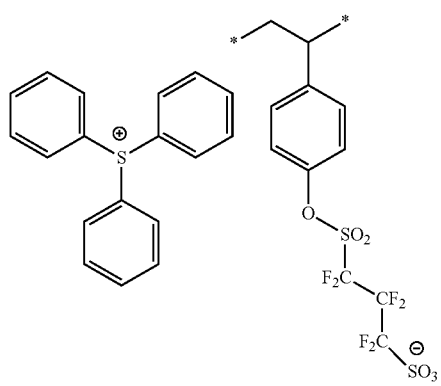
82
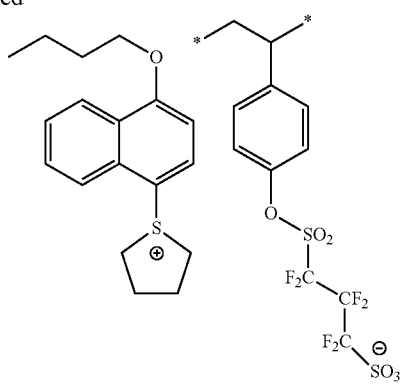
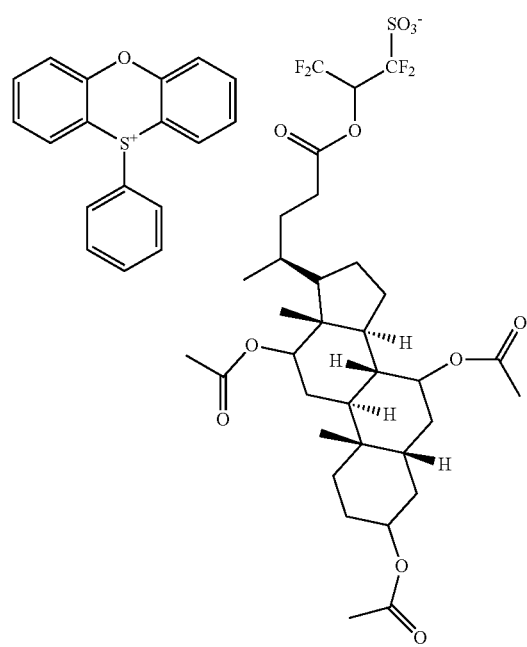
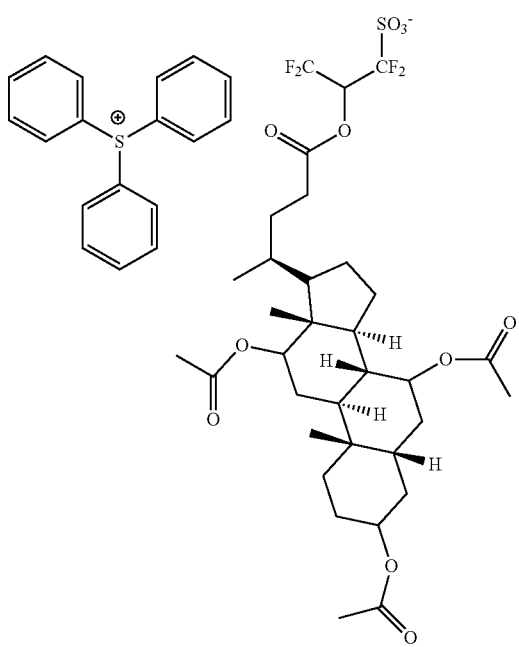
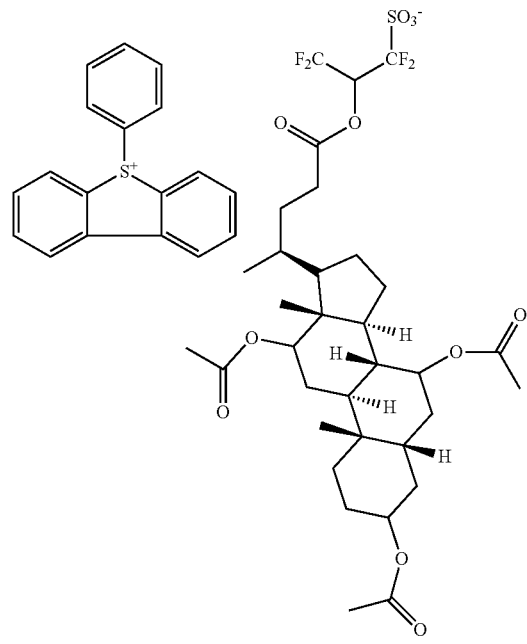
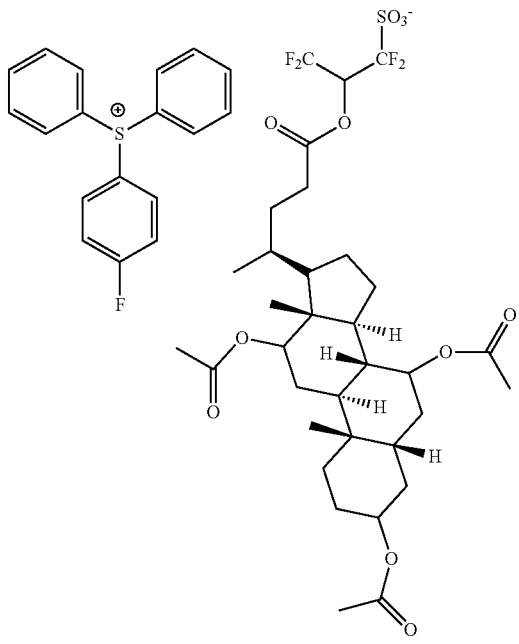

83 84
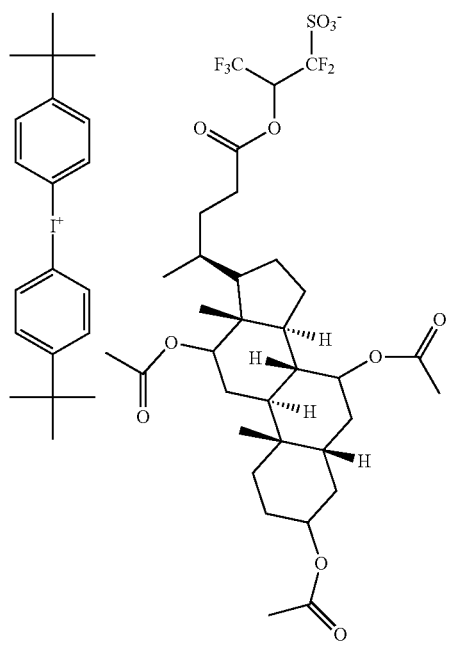
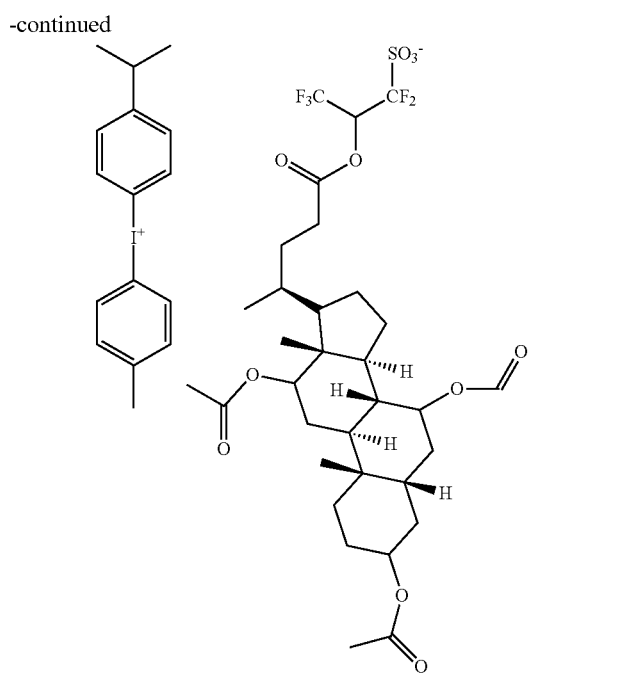
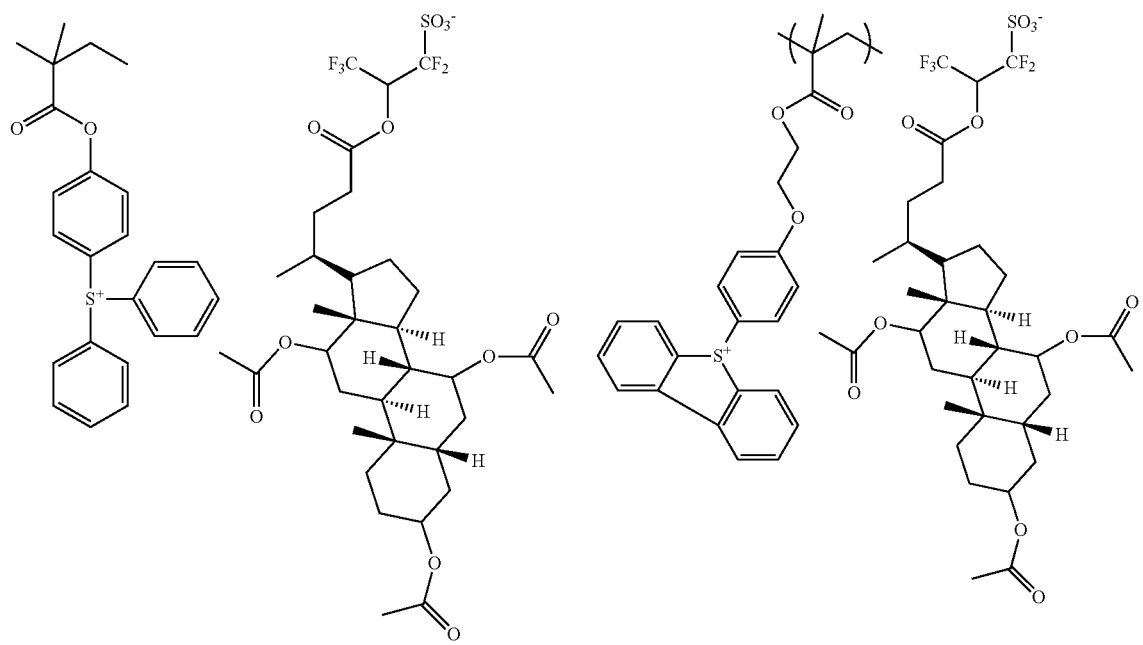
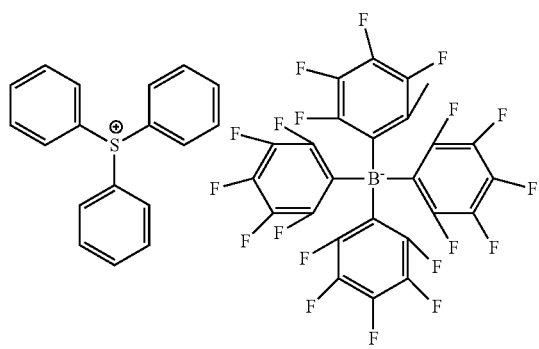
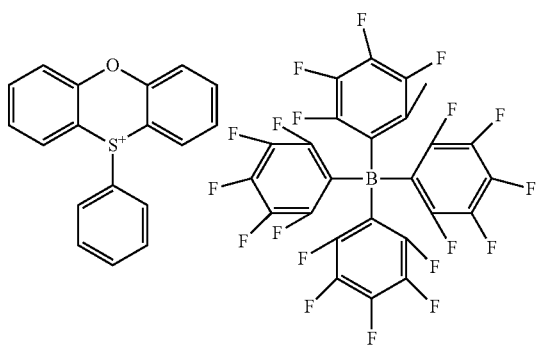

85
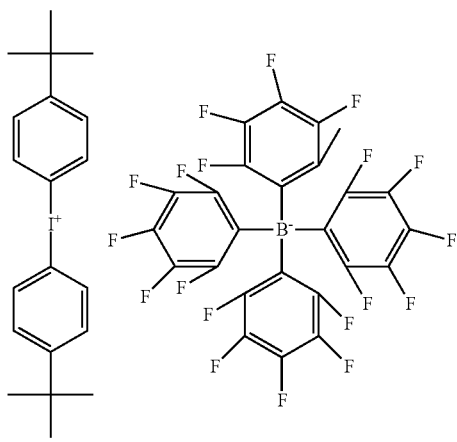
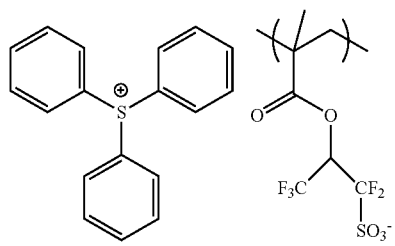
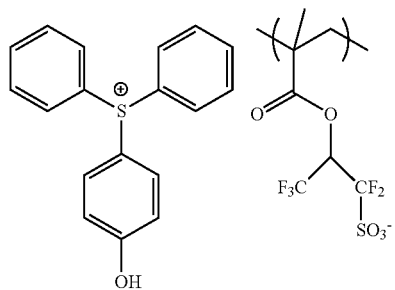
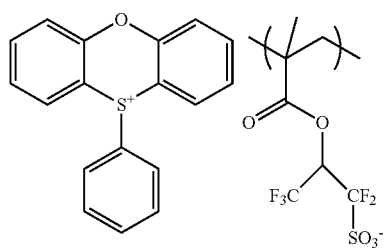
86
-continued
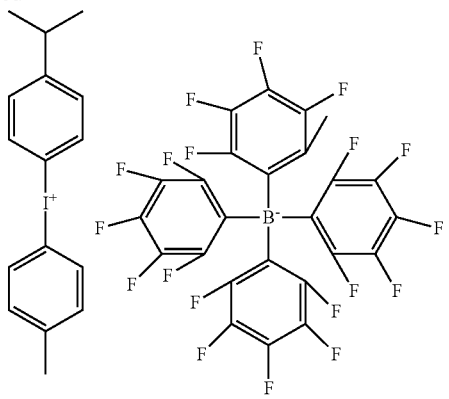
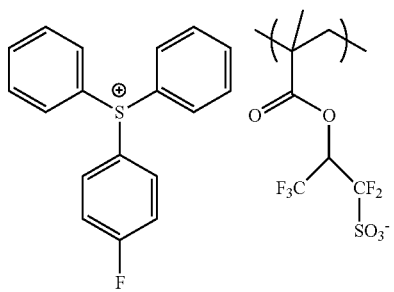
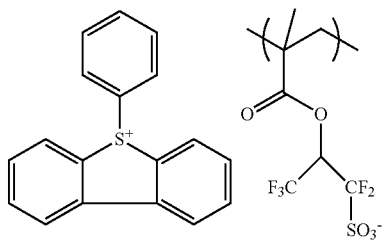
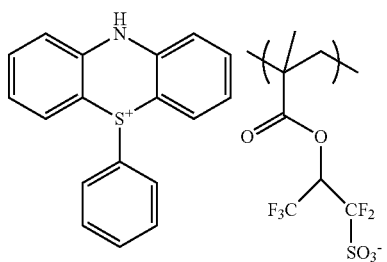

87
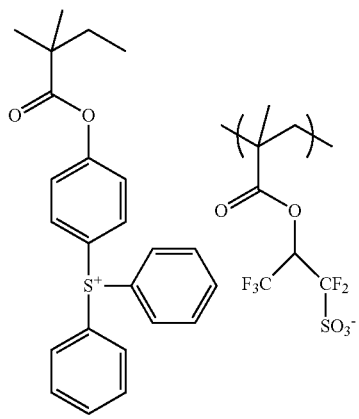
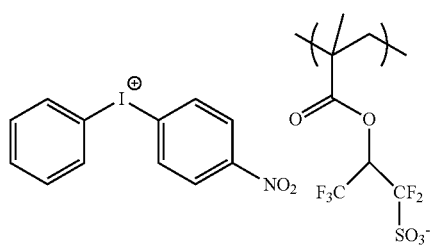
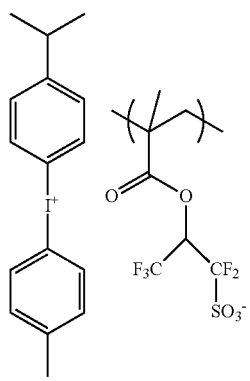
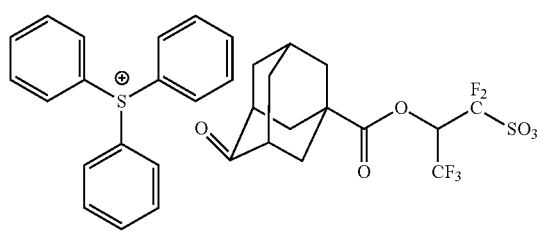
88
-continued
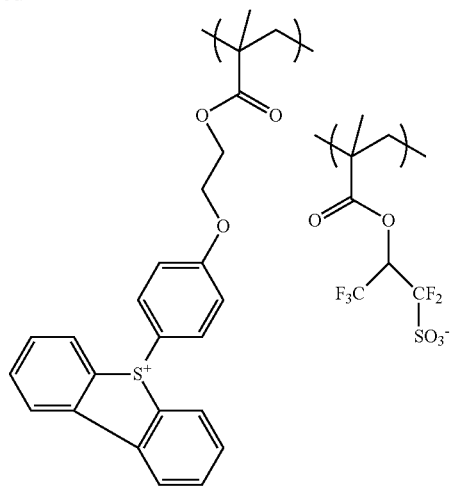
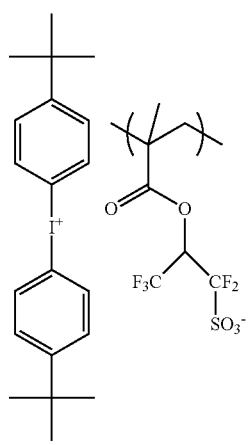
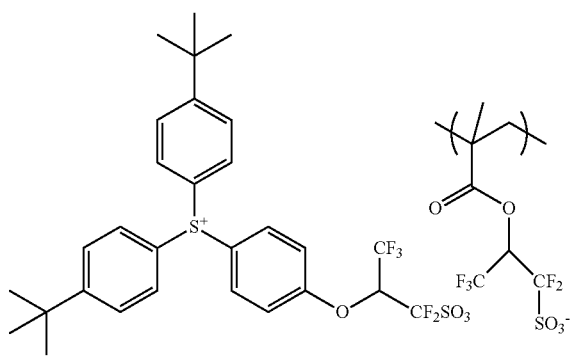
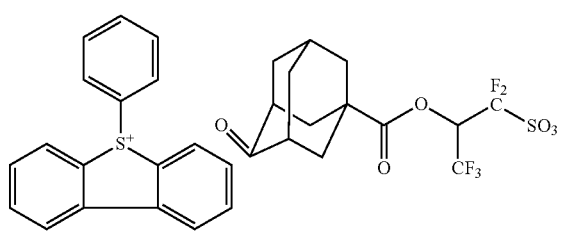

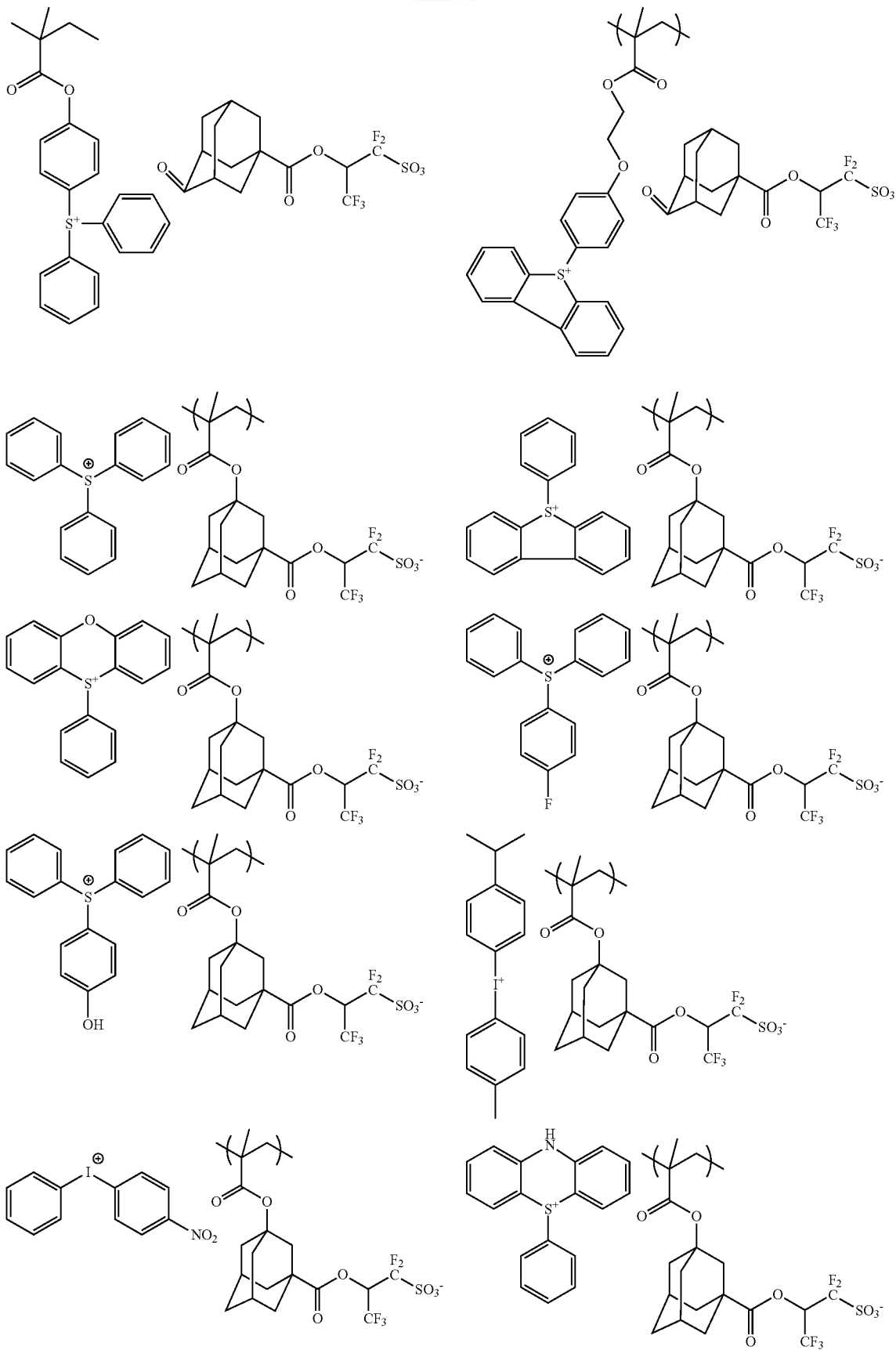

91 92
-continued
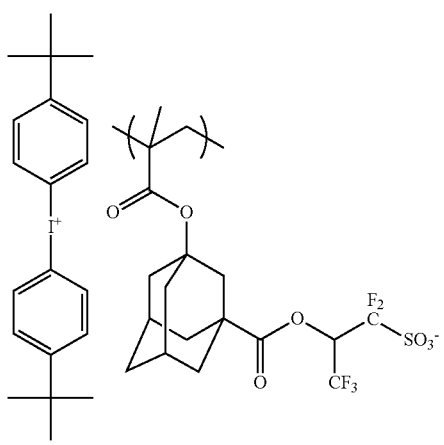
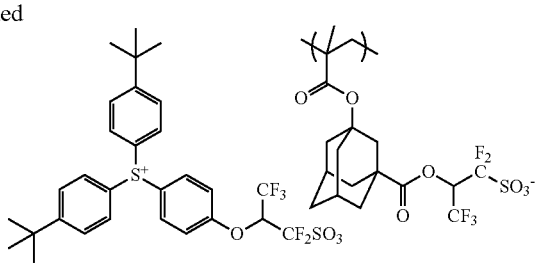
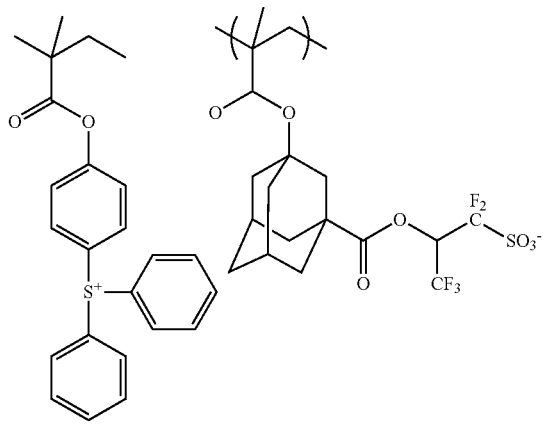
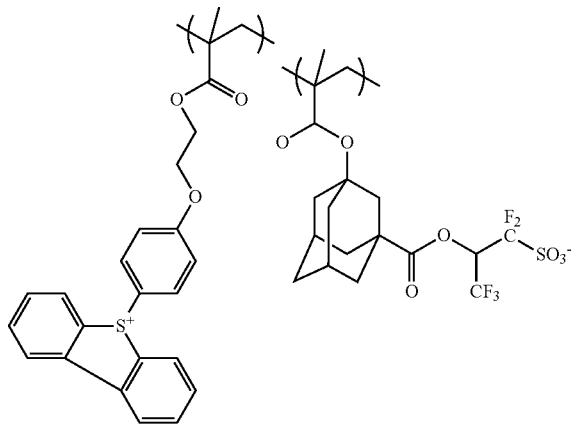
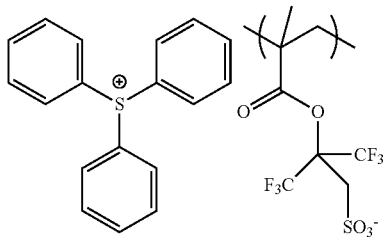
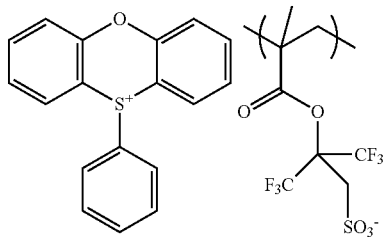
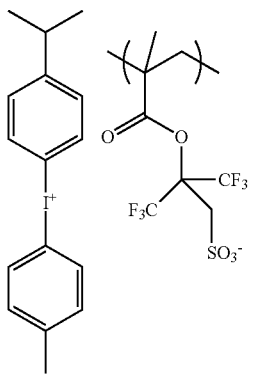
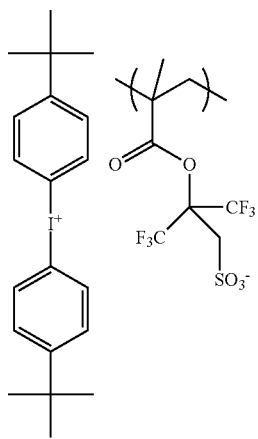

93 94
-continued
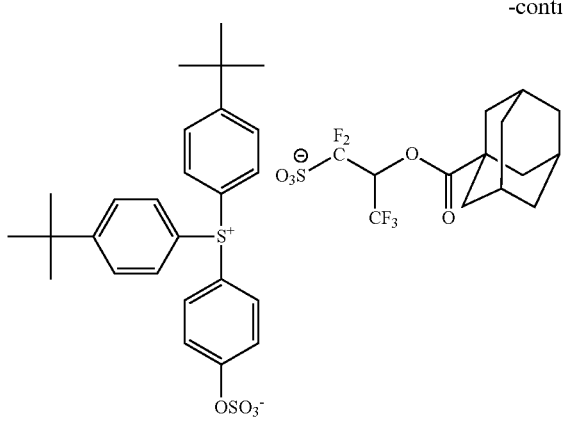
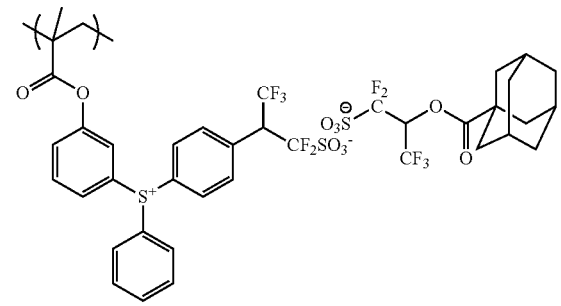
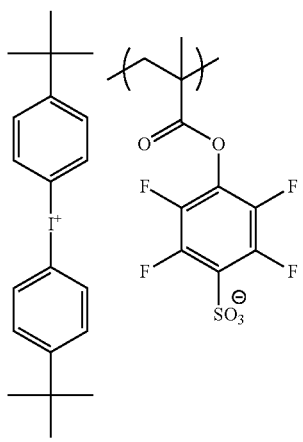
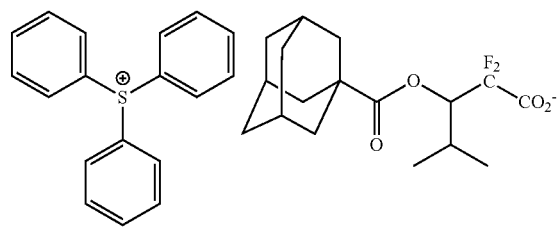
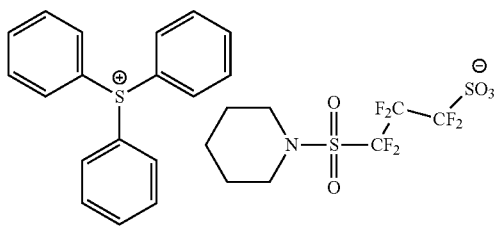
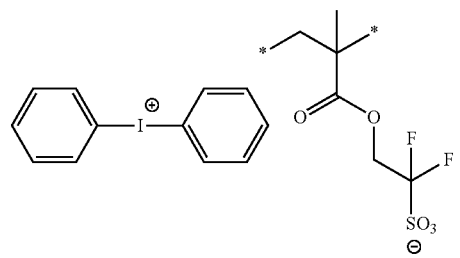
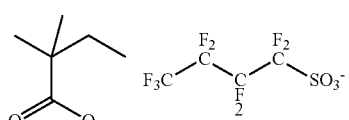
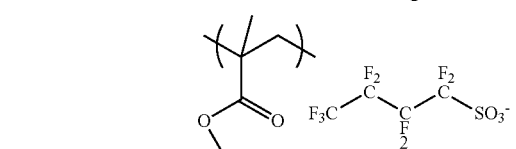
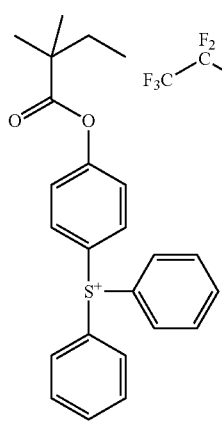
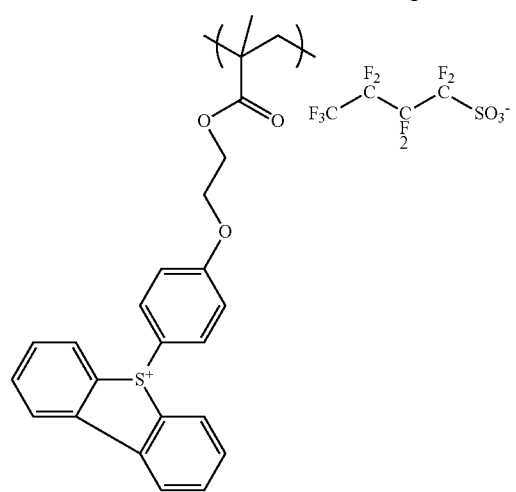

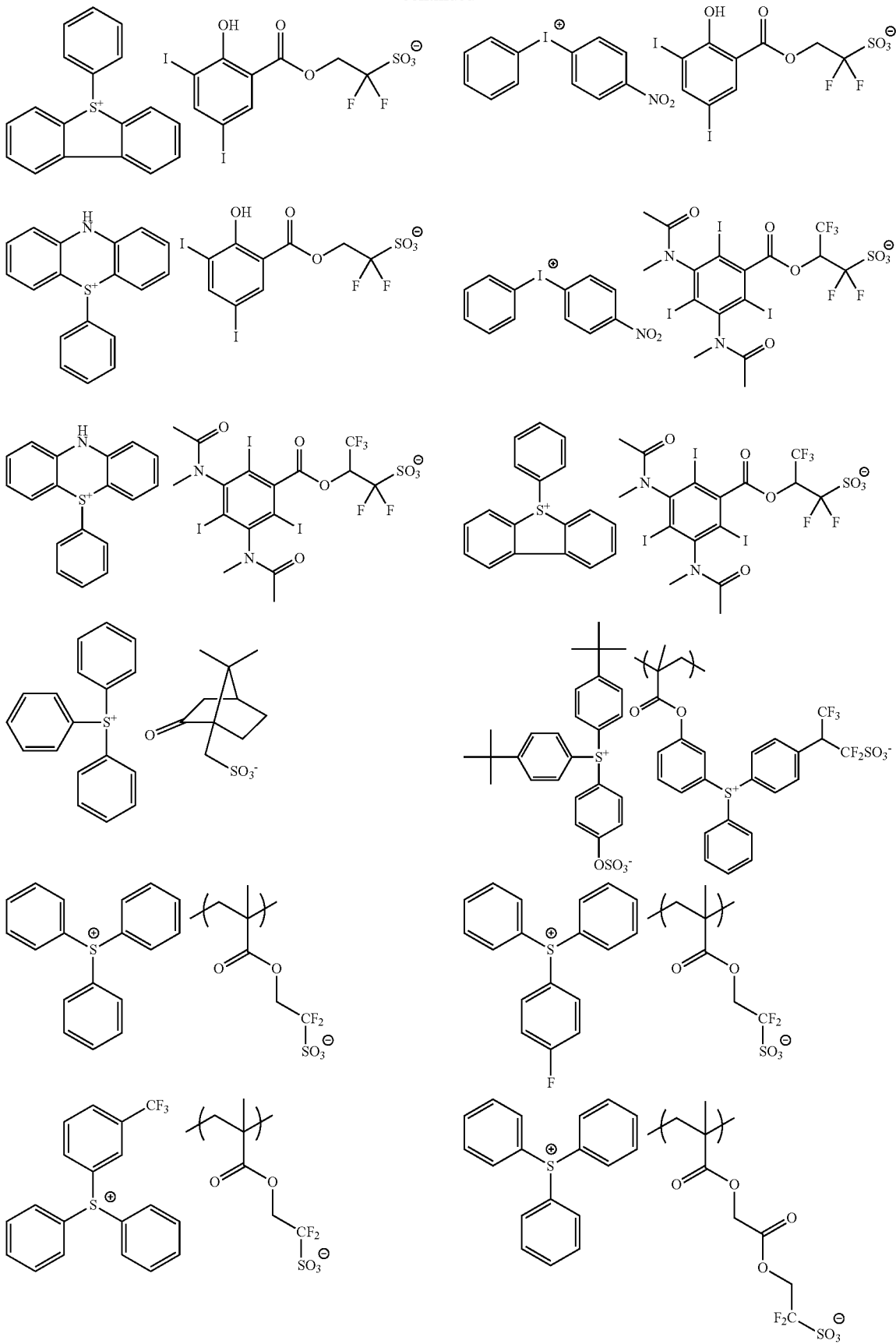

-continued
97
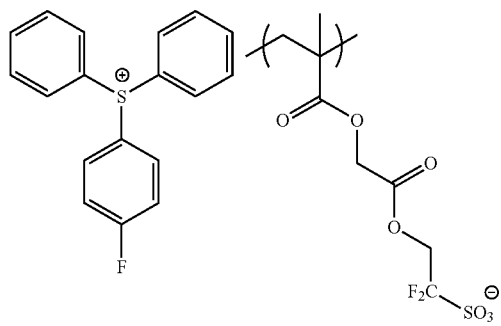
98
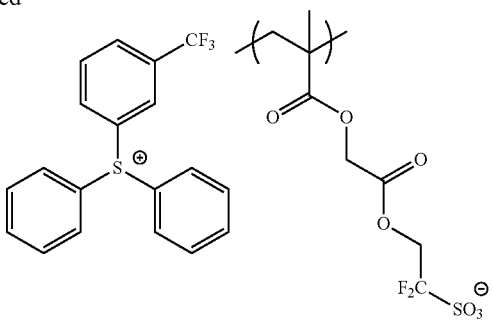
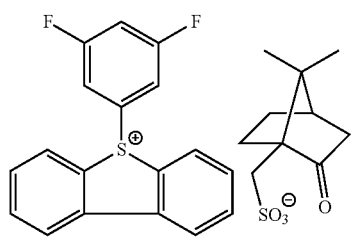
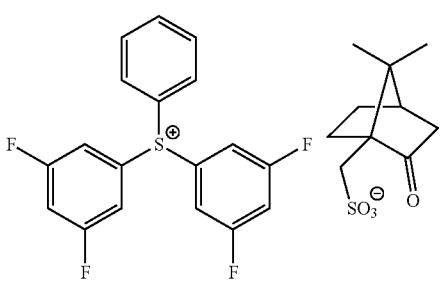
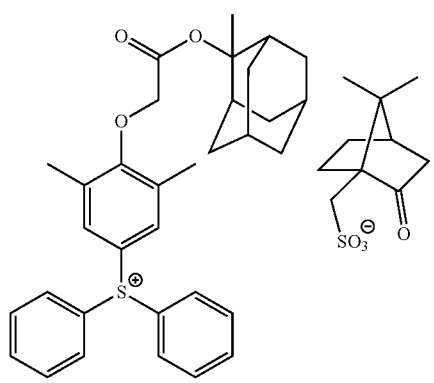
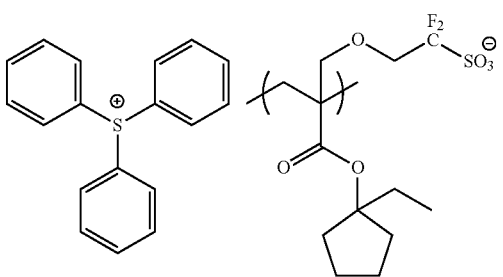
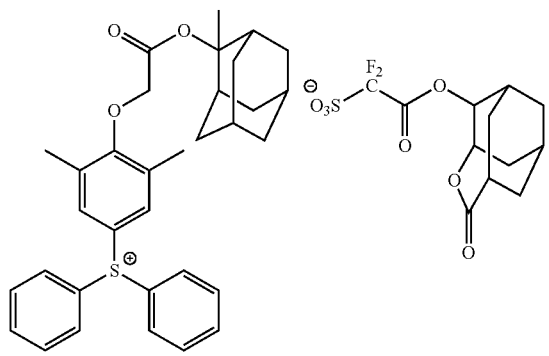
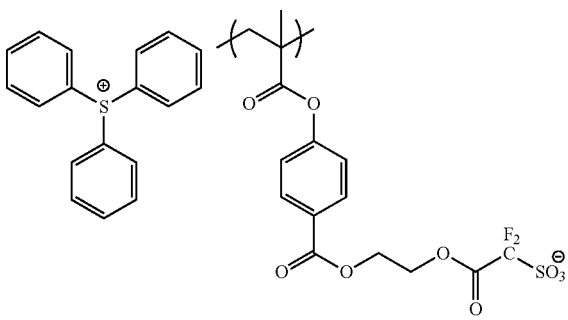
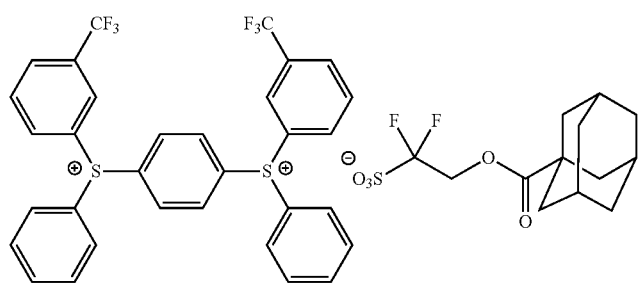

-continued
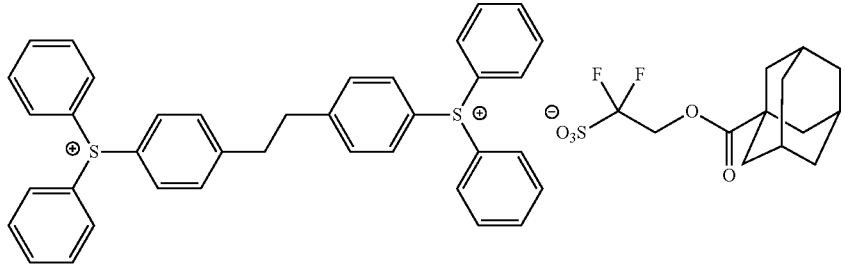
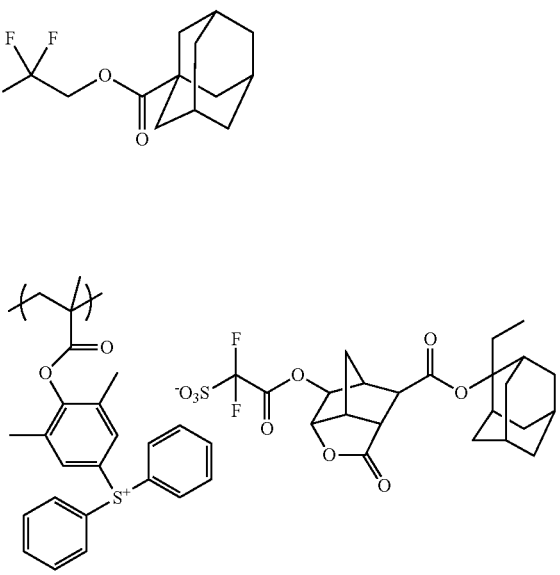
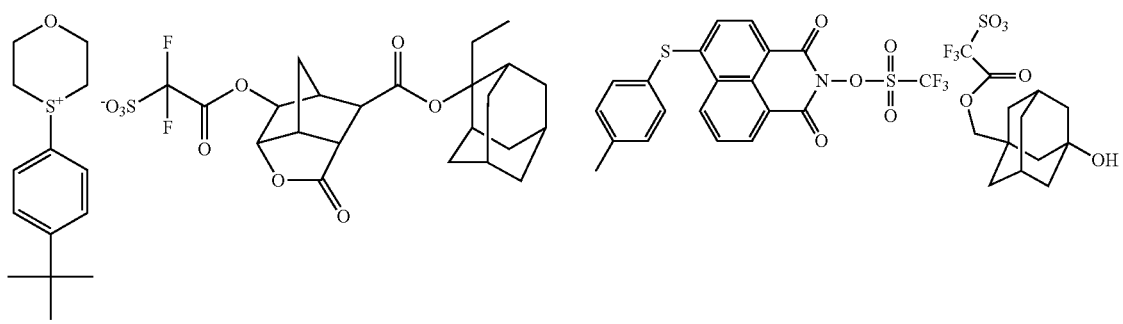
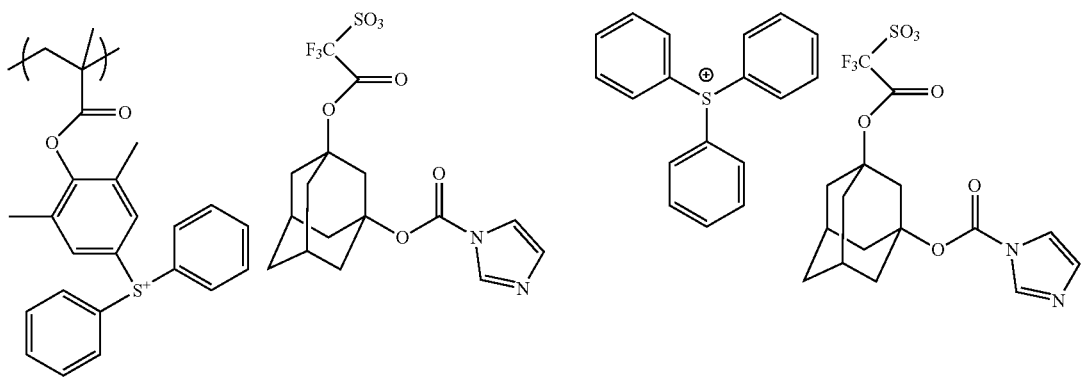
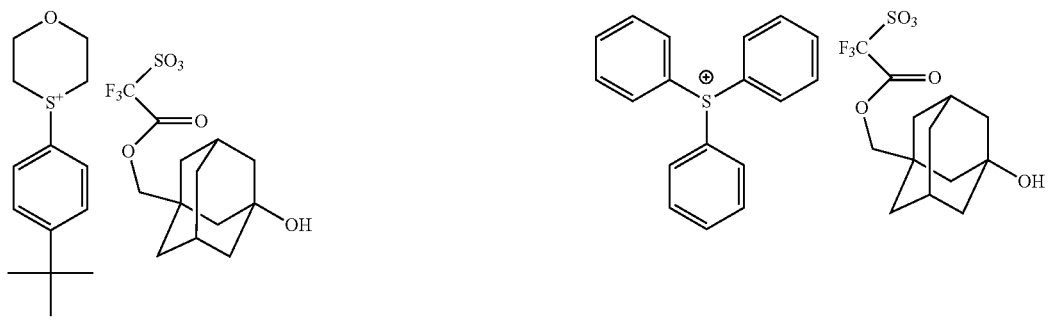

-continued
101 102
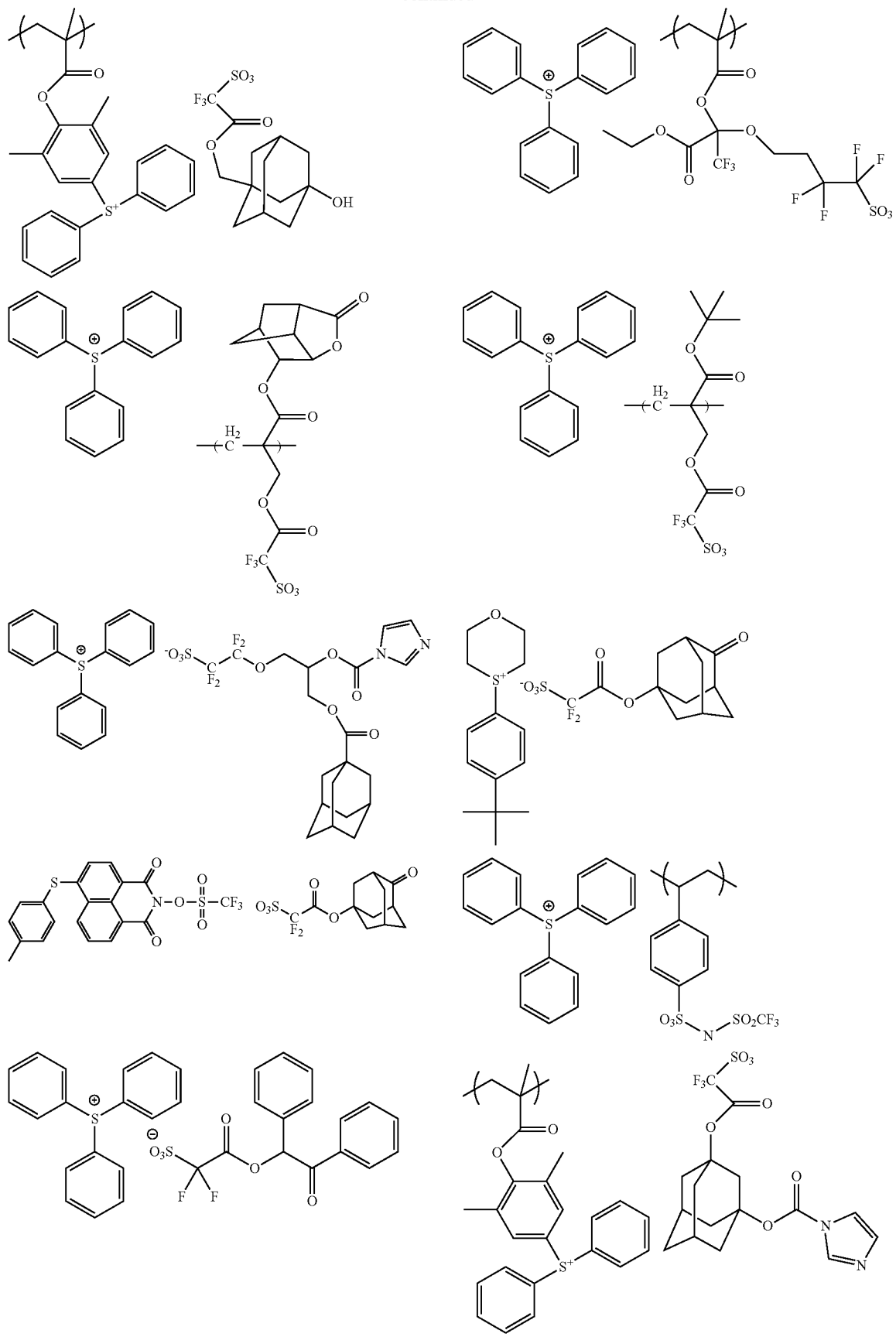

103
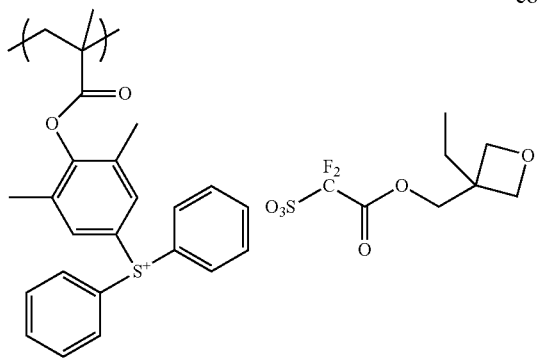
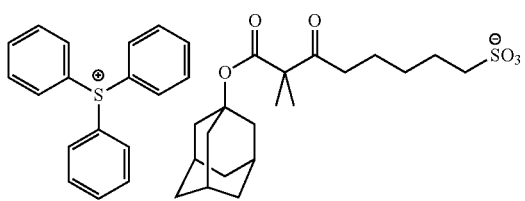
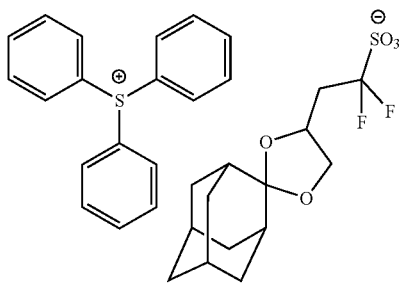
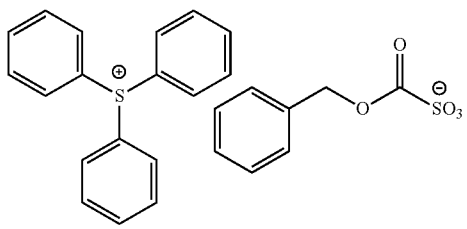
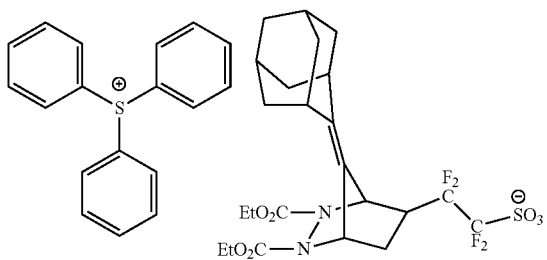
104
-continued
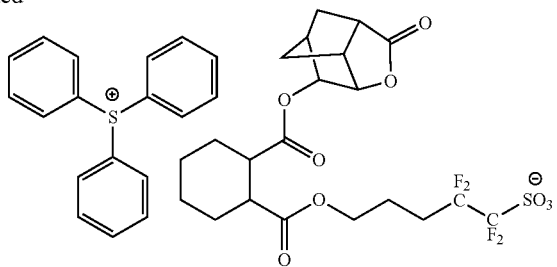
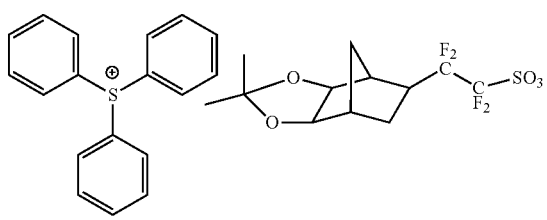
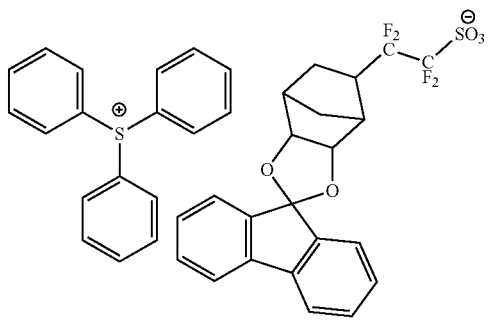
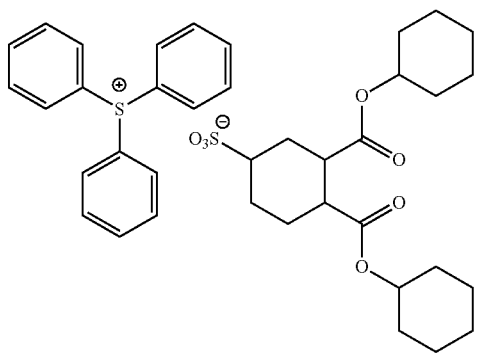
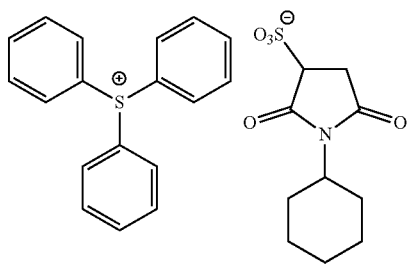

-continued

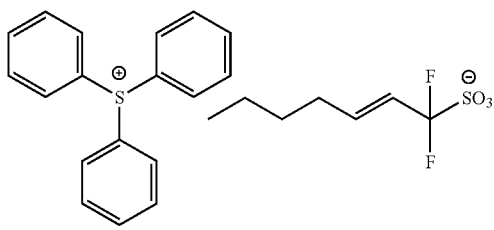
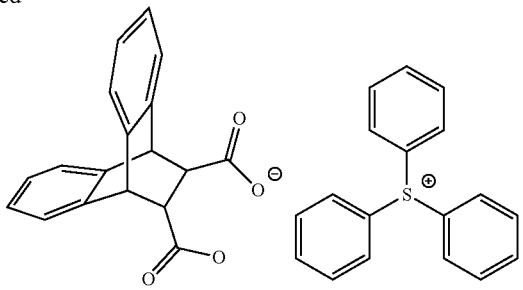
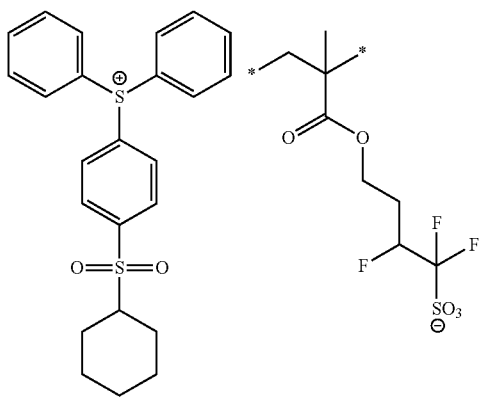
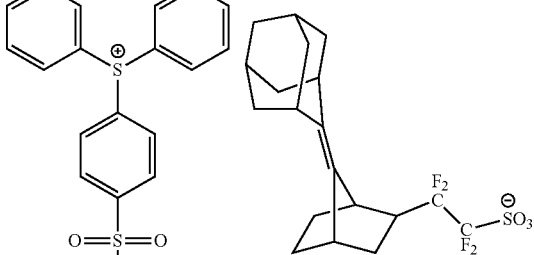
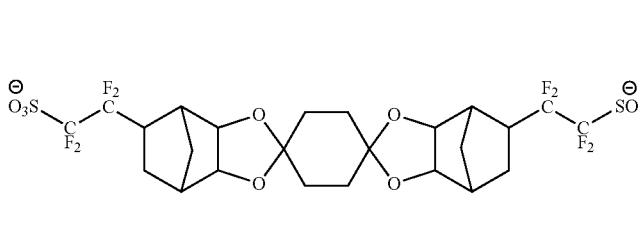
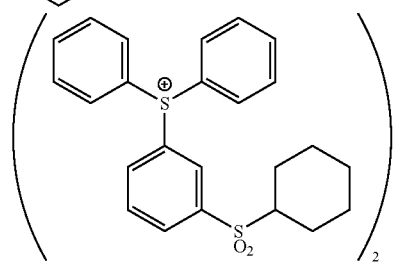

The photoacid generators may be used alone or in combination of two or more kinds thereof. In a case where two or more kinds of the photoacid generators are used in combination, it is preferable that there is a difference in the pKa or the volume between the generated acids.

The difference in the pKa is preferably 0.5 or more, more preferably 1.0 or more, and still more preferably 2.0 or more. The upper limit is not particularly limited, but is 12.0 or less in many cases.

The volume difference is preferably 50 $Å^3$ or more, more preferably 100 $Å^3$ or more, and still more preferably 200 $Å^3$ or more. The upper limit is not particularly limited, but it is 500 $Å^3$ or less in many cases.

<(C) Solvent>

The resist composition may include a solvent.

The solvent preferably includes at least one solvent of (M1) propylene glycol monoalkyl ether carboxylate, or (M2) at least one selected from the group consisting of a propylene glycol monoalkyl ether, a lactic ester, an acetic ester, an alkoxypropionic ester, a chained ketone, a cyclic ketone, a lactone, and a alkylene carbonate as a solvent. The solvent may further include components other than the component (M1) and the component (M2).

The present inventors have found that by using such a solvent and the above-mentioned resin in combination, the coatability of the composition is improved, and a pattern having a small number of development defects can also be formed. A reason therefor is not necessarily clear, but the present inventors have thought that these solvents have a good balance among the solubility, the boiling point, and the viscosity of the above-mentioned resin, and therefore, unevenness of the film thickness of a composition film, generation of precipitates during spin coating, and the like can be suppressed.

As the component (M1), at least one selected from the group consisting of propylene glycol monomethyl ether acetate (PGMEA), propylene glycol monomethyl ether propionate, and propylene glycol monoethyl ether acetate is preferable, and propylene glycol monomethyl ether acetate (PGMEA) is more preferable.

As the component (M2), the following ones are preferable.

As the propylene glycol monoalkyl ether, propylene glycol monomethyl ether (PGME) or propylene glycol monoethyl ether is preferable.

As the lactic ester, preferably ethyl lactate, butyl lactate, or propyl lactate is preferable. As the acetic ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

In addition, butyl butyrate is also preferable.

As the alkoxypropionic ester, methyl 3-methoxypropionate (MMP) or ethyl 3-ethoxypropionate (EEP) is preferable.

As the chain ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the lactone, γ-butyrolactone is preferable.

As the alkylene carbonate, propylene carbonate is preferable.

As the component (M2), propylene glycol monomethyl ether (PGME), ethyl lactate, ethyl 3-ethoxypropionate, methyl amyl ketone, cyclohexanone, butyl acetate, pentyl acetate, γ-butyrolactone, or propylene carbonate is more preferable.

In addition to the components, it is preferable to use an ester-based solvent having 7 or more carbon atoms (preferably 7 to 14 carbon atoms, more preferably 7 to 12 carbon atoms, and still more preferably 7 to 10 carbon atoms) and 2 or less heteroatoms.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is preferable.

As the component (M2), a component having a flash point (hereinafter also referred to as fp) of 37° C. or higher is preferably used. As such a component (M2), propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or ethyl lactate is still more preferable.

In addition, the "flash point" herein is intended to mean the value described in a reagent catalog of Tokyo Chemical Industry Co., Ltd. or Sigma-Aldrich Co. LLC.

It is preferable that the solvent includes the component (M1). It is more preferable that the solvent is formed of substantially only the component (M1) or is a mixed solvent formed by a combined use of the component (M1) and other components.

In a case where the solvent is the mixed solvent, it is still more preferable that the solvent includes both the component (M1) and the component (M2).

The mass ratio (M1/M2) of the content of the component (M1) to the component (M2) is preferably in the range of "100/0" to "15/85", more preferably in the range of "100/0" to "40/60", and still more preferably in the range of "100/0" to "60/40". That is, the solvent includes only the component (M1) or includes both of the component (M1) and the component (M2), and a mass ratio thereof is preferably as follows. That is, in the latter case, the mass ratio of the component (M1) to the component (M2) is preferably 15/85 or more, more preferably 40/60 or more, and still more preferably 60/40 or more. In a case of employing such a configuration, it is possible to further reduce the number of development defects.

Moreover, in a case where both of the component (M1) and the component (M2) are included in the solvent, the mass ratio of the component (M1) to the component (M2) is set to, for example, 99/1 or less.

As described above, the solvent may further include components other than the components (M1) and (M2). In this case, the content of the components other than the components (M1) and (M2) is preferably in the range of 5% to 30% by mass with respect to the total mass of the solvent.

The content of the solvent in the resist composition is preferably set such that the concentration of solid contents is 0.5% to 30% by mass, and more preferably set such that the concentration of solid contents is 1% to 20% by mass. Thus, it is possible to further improve the coatability of the resist composition.

<(D) Acid Diffusion Control Agent>

The resist composition may further include an acid diffusion control agent. The acid diffusion control agent acts as a quencher that traps an acid generated from a photoacid generator and functions to control the phenomenon of acid diffusion in the resist film.

The acid diffusion control agent may include an atom selected from the group consisting of a hydrogen atom, a carbon atom, a nitrogen atom, an oxygen atom, a fluorine atom, a sulfur atom, and an iodine atom. Further, the acid diffusion control agent includes at least the hydrogen atom and the carbon atom in many cases, and in this case, it preferably further includes at least one atom selected from the group consisting of the nitrogen atom, the oxygen atom, the fluorine atom, the sulfur atom, and the iodine atom.

The acid diffusion control agent may be, for example, a basic compound.

As the basic compound, compounds having structures represented by General Formula (A) to General Formula (E) are preferable.

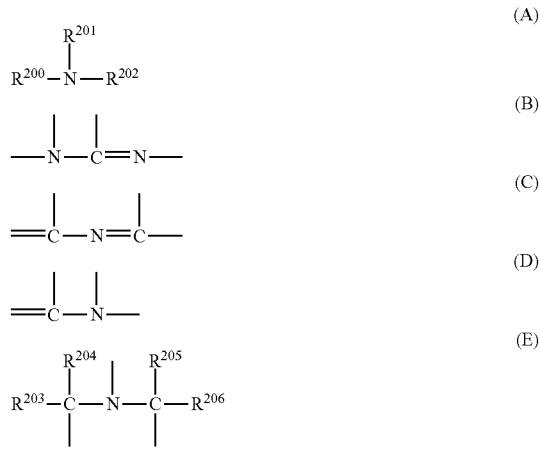

In General Formula (A) and General Formula (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (preferably having 6 to 20 carbon atoms), in which $R^{201}$ and $R^{202}$ may be bonded to each other to form a ring.

With regard to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

It is more preferable that the alkyl groups in General Formula (A) and General Formula (E) are unsubstituted.

As the basic compound, guanidine, aminopyrrolidine, pyrazole, pyrazoline, piperazine, aminomorpholine, aminoalkylmorpholine, piperidine, or the like is preferable. Among these, a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; an aniline derivative having a hydroxyl group and/or an ether bond; or the like is more preferable.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group. Specific examples thereof include triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound include an amine compound having a phenoxy group and an ammonium salt compound having a phenoxy group.

As the amine compound, a primary, secondary, or tertiary amine compound can be used, and an amine compound in which at least one alkyl group is bonded to a nitrogen atom is preferable. The amine compound is more preferably a tertiary amine compound. Any amine compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms), in addition to the alkyl group, may be bonded to the nitrogen atom.

In addition, the amine compound preferably has an oxyalkylene group. The number of the oxyalkylene groups contained in the amine compounds is preferably 1 or more, more preferably 3 to 9, and still more preferably 4 to 6, within the molecule. Among those, as the oxyalkylene group, an oxyethylene group (—$CH_2CH_2O$—) or an oxypropylene group (—$CH(CH_3)CH_2O$— or —$CH_2CH_2CH_2O$—) is preferable, and the oxyethylene group is more preferable.

Examples of the ammonium salt compound include primary, secondary, tertiary, and quaternary ammonium salt compounds, and an ammonium salt compound in which at least one alkyl group is bonded to a nitrogen atom is preferable. Any ammonium salt compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group.

It is preferable that the ammonium salt compound has an oxyalkylene group. The number of the oxyalkylene groups contained in the amine compounds is preferably 1 or more, more preferably 3 to 9, and still more preferably 4 to 6, within the molecule. Among oxyalkylene groups, an oxyethylene group (—$CH_2CH_2O$—) or an oxypropylene group (—$CH(CH_3)CH_2O$— or —$CH_2CH_2CH_2O$—) is preferable, and the oxyethylene group is more preferable.

Examples of the anion of the ammonium salt compound include a halogen atom, a sulfonate, a borate, and a phosphate, and among those, the halogen atom or the sulfonate is preferable. As the halogen atom, chloride, bromide, or iodide is preferable. As the sulfonate, an organic sulfonate having 1 to 20 carbon atoms is preferable. Examples of the organic sulfonate include alkyl sulfonate and aryl sulfonate, having 1 to 20 carbon atoms. The alkyl group of the alkyl sulfonate may have a substituent, and examples of the substituent include a fluorine atom, a chlorine atom, a bromine atom, an alkoxy group, an acyl group, and an aromatic ring group. Specific examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate. Examples of the aryl group of the aryl sulfonate include a benzene ring group, a naphthalene ring group, and an anthracene ring group. As the substituent which can be contained in the benzene ring group, the naphthalene ring group, and the anthracene ring group, a linear or branched alkyl group having 1 to 6 carbon atoms or a cycloalkyl group having 3 to 6 carbon atoms is preferable. Specific examples of the linear or branched alkyl group and the cycloalkyl group include a methyl group, an ethyl group, an n-propyl group, an isopropyl group, an n-butyl group, an i-butyl group, a t-butyl group, an n-hexyl group, and a cyclohexyl group. Examples of other substituents include an alkoxy group having 1 to 6 carbon atoms, a halogen atom, a cyano group, a nitro group, an acyl group, and an acyloxy group.

The amine compound having a phenoxy group and the ammonium salt compound having a phenoxy group are each a compound having a phenoxy group at the terminal on the opposite side to the nitrogen atom of the alkyl group which is contained in the amine compound or the ammonium salt compound.

Examples of a substituent of the phenoxy group include an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group.

The substitution position of the substituent may be any of 2- to 6-positions. The number of the substituents may be any one of 1 to 5.

This compound preferably has at least one oxyalkylene group between the phenoxy group and the nitrogen atom. The number of the oxyalkylene groups contained in the amine compounds is preferably 1 or more, more preferably 3 to 9, and still more preferably 4 to 6, within the molecule. Among oxyalkylene groups, an oxyethylene group (—$CH_2CH_2O$—) or an oxypropylene group (—$CH(CH_3)$ CH$_2$O— or —CH$_2$CH$_2$CH$_2$O—) is preferable, and the oxyethylene group is more preferable.

The amine compound having a phenoxy group can be obtained by heating a mixture of a primary or secondary amine having a phenoxy group and a haloalkyl ether to perform a reaction, then adding an aqueous solution of a strong base (for example, sodium hydroxide, potassium hydroxide, and tetraalkylammonium) to a reaction system, and extracting the reaction product with an organic solvent (for example, ethyl acetate and chloroform). Alternatively, the amine compound having a phenoxy group can also be obtained by heating a mixture of a primary or secondary amine and a haloalkyl ether having a phenoxy group at a terminal to perform a reaction, then adding an aqueous solution of a strong base to the reaction system, and extracting the reaction product with an organic solvent.

[Compound (PA) Which Has Proton-Accepting Functional Group and Generates Compound That Decomposes upon Irradiation with Actinic Rays or Radiation to Exhibit Deterioration in Proton-Accepting Properties, No Proton-Accepting Properties, or Change from Proton-Accepting Properties to Acidic Properties]

The resist composition may include a compound (hereinafter also referred to as a "compound (PA)") which has a proton-accepting functional group and generates a compound that decomposes upon irradiation with actinic rays or radiation to exhibit deterioration in proton-accepting properties, no proton-accepting properties, or a change from the proton-accepting properties to acidic properties as the basic compound.

The proton-accepting functional group is a functional group having a group or an electron which is capable of electrostatically interacting with a proton, and means, for example, a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following general formula.

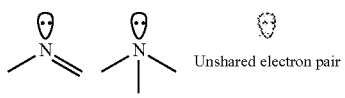

Unshared electron pair

Preferred examples of the partial structure of the proton-accepting functional group include crown ether, azacrown ether, primary to tertiary amines, pyridine, imidazole, and pyrazine structures.

The compound (PA) generates a compound which decomposes upon irradiation with actinic rays or radiation to exhibit deterioration in proton-accepting properties, no proton-accepting properties, or a change from the proton-accepting properties to acidic properties. Here, an expression of generating a compound which exhibits deterioration in proton-accepting properties, no proton-accepting properties, or a change from the proton-accepting properties to acidic properties is a change of proton-accepting properties due to the proton being added to the proton-accepting functional group. Specifically, the expression means a decrease in the equilibrium constant at chemical equilibrium in a case where a proton adduct is generated from the compound (PA) having the proton-accepting functional group and the proton.

The proton-accepting properties can be confirmed by measuring a pH.

The acid dissociation constant pKa of a compound generated by decomposition of the compound (PA) preferably satisfies pKa <−1, more preferably −13<pKa <−1, and still more preferably satisfies −13<pKa <−3.

Moreover, the acid dissociation constant pKa can be obtained by the above-mentioned method.

In the composition of the embodiment of the present invention, an onium salt which is a relatively weak acid with respect to the photoacid generator can also be used as the compound In a case of mixing the photoacid generator and the onium salt that generates an acid which is a relatively weak acid with respect to an acid generated from the photoacid generator, and then using the mixture, in a case where the acid generated from the photoacid generator upon irradiation with actinic rays or radiation collides with an onium salt having an unreacted weak acid anion, a weak acid is discharged by salt exchange, thereby generating an onium salt having a strong acid anion. In this process, since the strong acid is exchanged with a weak acid having a lower catalytic ability, the acid is deactivated in appearance and thus, the acid diffusion can be controlled.

As the onium salt which is a relatively weak acid with respect to the photoacid generator, compounds represented by General Formulae (d1-1) to (d1-3) are preferable.

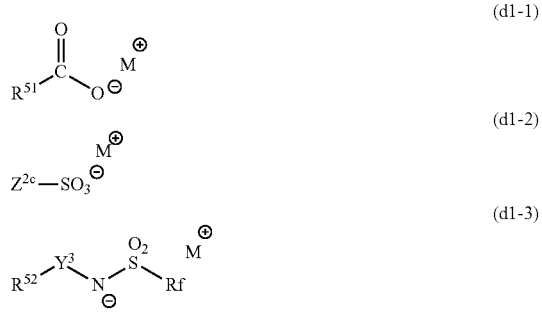

In the formulae, R$^{51}$ is a hydrocarbon group which may have a substituent (for example, a fluorine atom or an iodine atom), Z$^{2c}$ is a hydrocarbon group having 1 to 30 carbon atoms, which may have a substituent (provided that carbon adjacent to S is not substituted with a fluorine atom), R$^{52}$ is an organic group, Y$^3$ is a linear, branched, or cyclic alkylene group or arylene group, Rf is a hydrocarbon group including a fluorine atom, and M$^+$'s are each independently an ammonium cation, a sulfonium cation, or an iodonium cation.

Preferred examples of the sulfonium cation or the iodonium cation represented by M$^+$ include the sulfonium cation represented by General Formula (ZI) and the iodonium cation represented by General Formula (ZII) as described above.

The onium salt (DC) which is a relatively weak acid with respect to the photoacid generator may be a compound (hereinafter also referred to as a "compound (DCA)") having a cationic moiety and an anionic moiety in the same molecule, in which the cationic moiety and the anionic moiety are linked to each other through a covalent bond.

As the compound (DCA), a compound represented by any of General Formulae (C-1) to (C-3) is preferable.

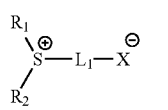
(C-1)

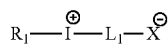
(C-2)

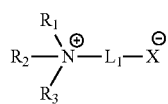
(C-3)

In General Formulae (C-1) to (C-3), $R_1$, $R_2$, and $R_3$ each independently represent a substituent having one or more carbon atoms.

$L_1$ represents a divalent linking group that links a cationic moiety with an anionic moiety, or a single bond.

—$X^-$ represents an anionic moiety selected from —COO$^-$, —SO$_3^-$, —SO$_2^-$, and —N$^-$—R$_4$. $R_4$ represents a monovalent substituent having at least one of a carbonyl group (—C(=O)—), a sulfonyl group (—S(=O)$_2$—), or a sulfinyl group (—S(=O)—) at a site for linking to an adjacent N atom.

$R_1$, $R_2$, $R_3$, $R_4$, and $L_1$ may be bonded to one another to form a ring structure. Further, in General Formula (C-3), two of $R_1$ to $R_3$ may be combined with each other to represent a divalent substituent or $R_1$ to $R_3$ may be bonded to an N atom through a double bond.

Examples of the substituent having one or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. Among those, the alkyl group, the cycloalkyl group, or the aryl group is preferable.

Examples of $L_1$ as a divalent linking group include a linear or branched alkylene group, a cycloalkylene group, an arylene group, a carbonyl group, an ether bond, an ester bond, an amide bond, a urethane bond, a urea bond, and a group formed by a combination of two or more of these groups. As $L_1$, the alkylene group, the arylene group, the ether bond, the ester bond, or the group formed by combination of two or more of these groups is preferable.

With regard to specific examples of the compound (PA), reference can be made to those described in paragraphs <0421> to <0428> of JP2014-041328A or paragraphs <0108> to <0116> of JP2014-134686A, the contents of which are incorporated herein by reference.

Specific examples of the acid diffusion control agent are shown below, but the present invention is not limited.

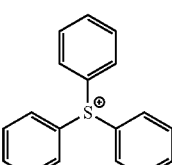
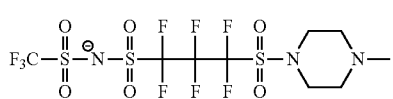

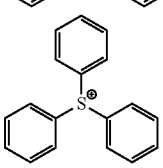

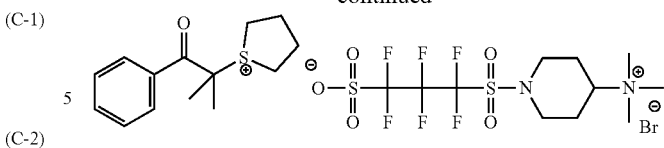

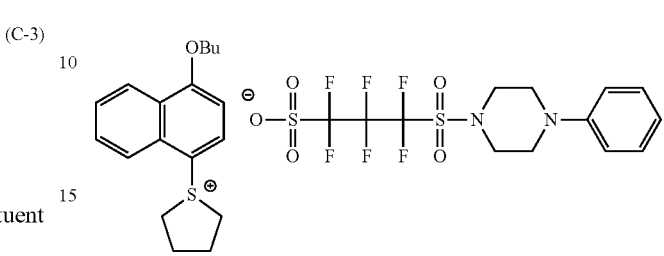

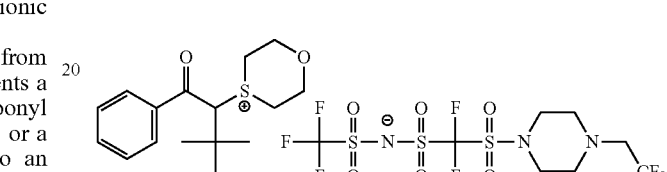

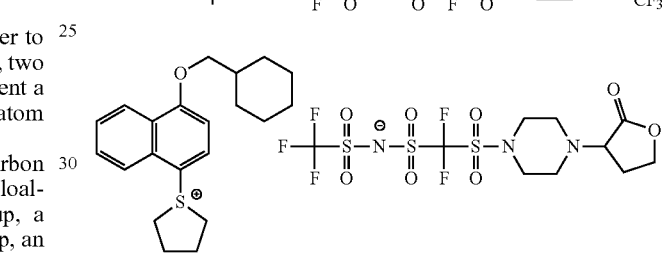

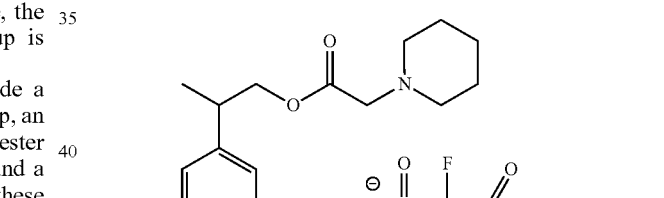

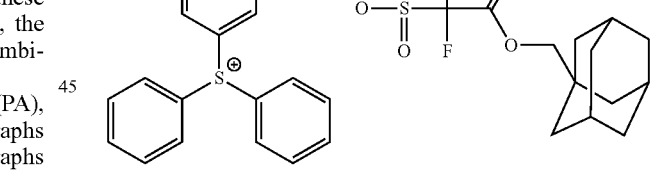

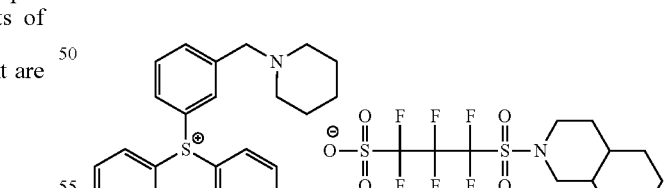

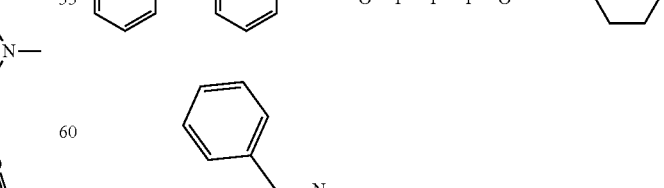

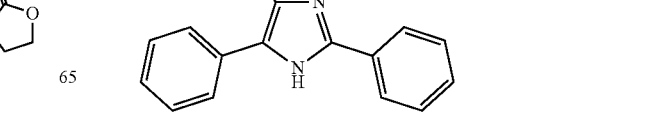

-continued
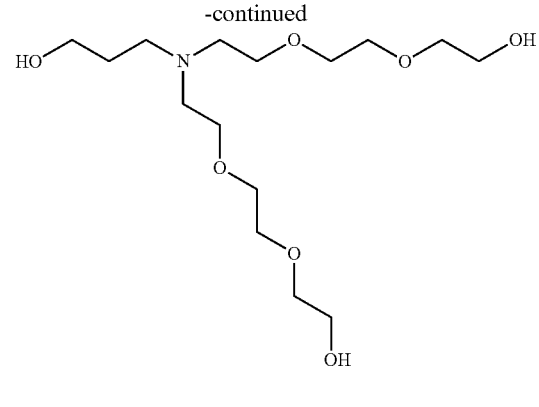
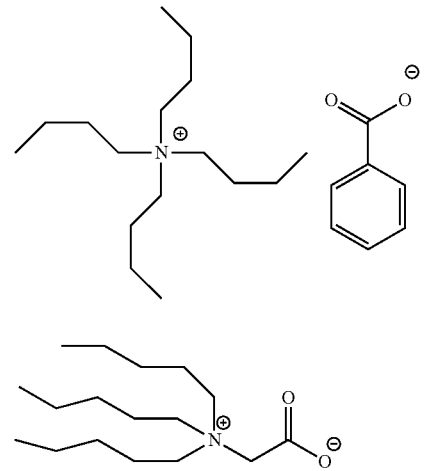
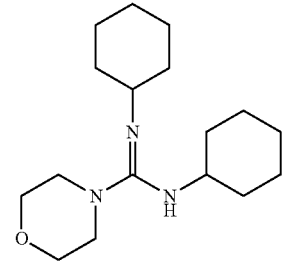
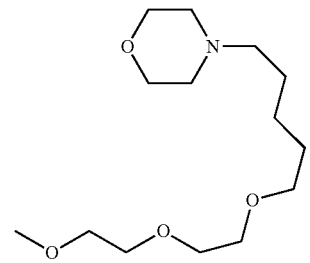
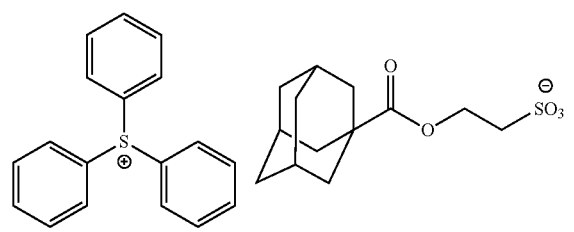
-continued
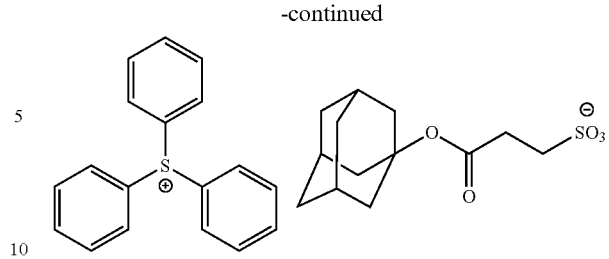
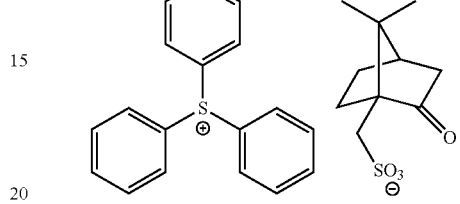
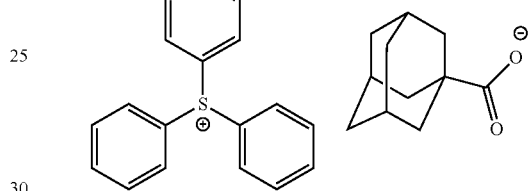
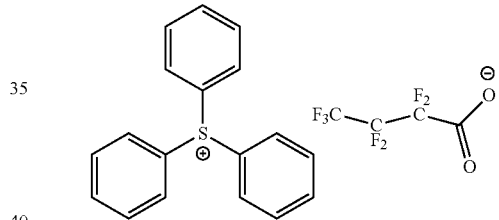
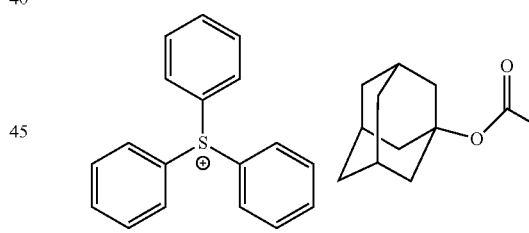
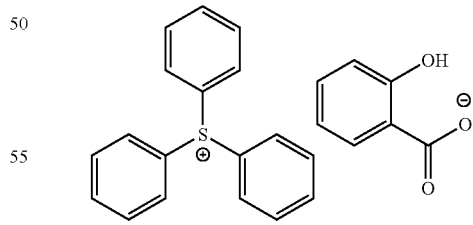
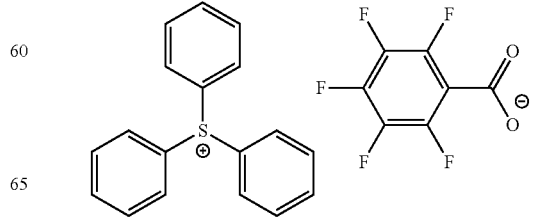

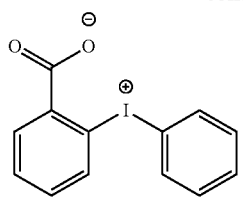
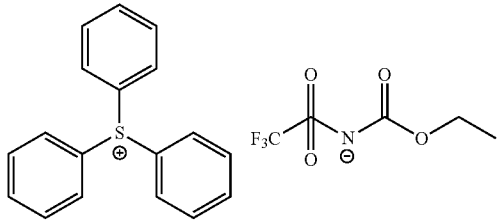
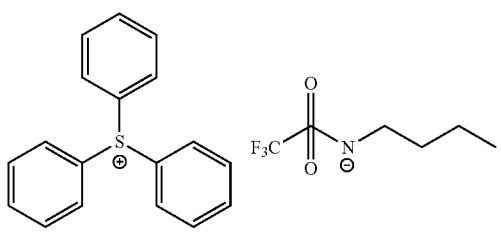
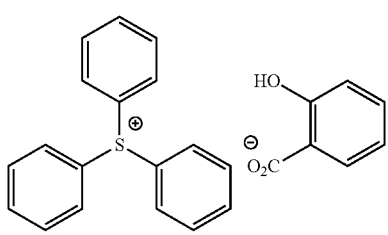
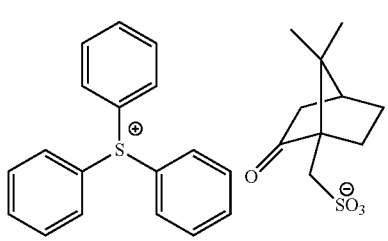
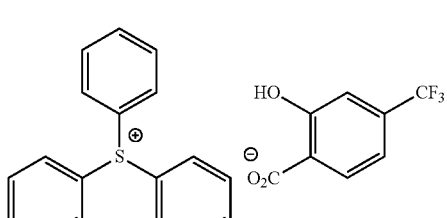
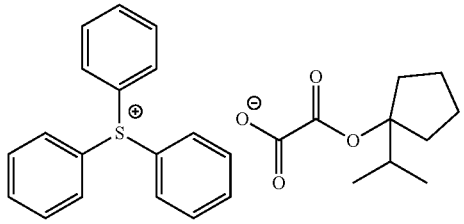
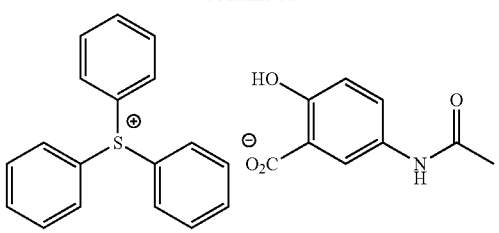
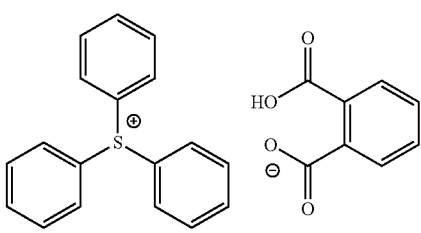
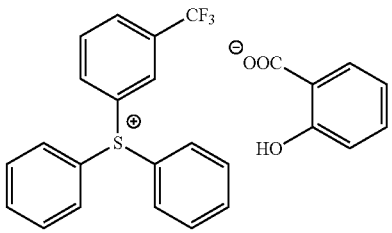
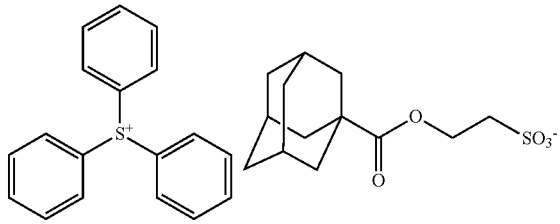
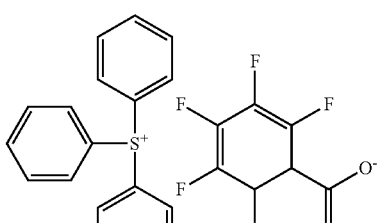
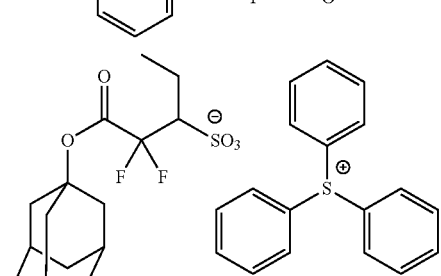
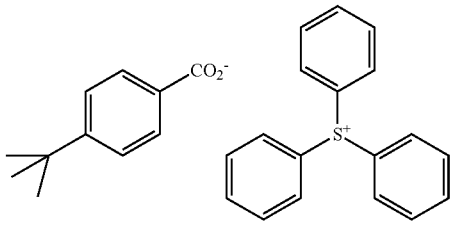

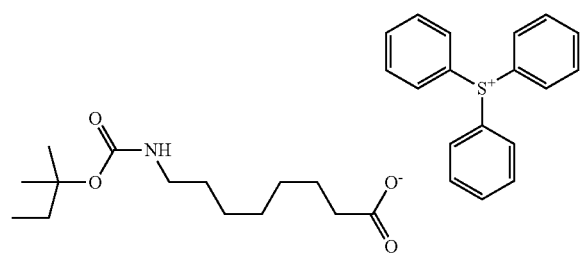
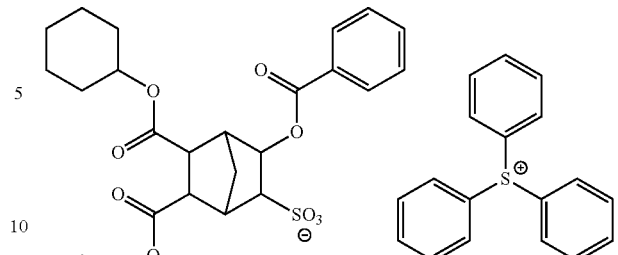
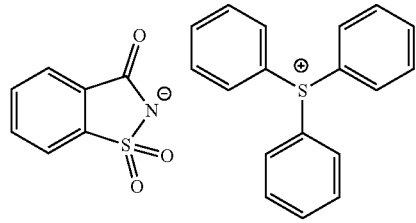
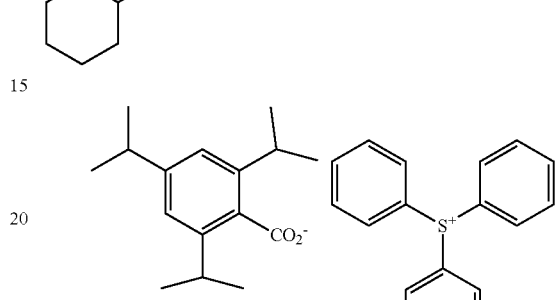
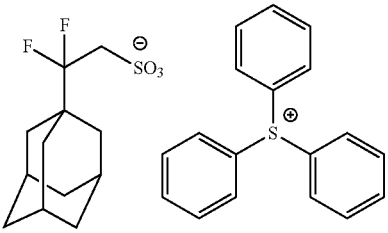
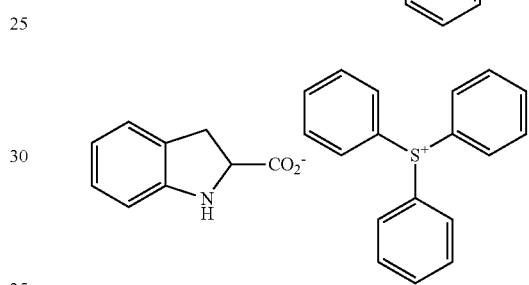
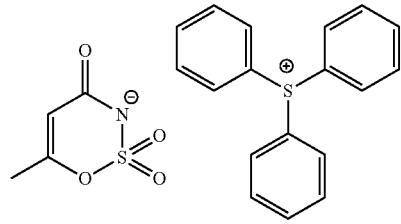
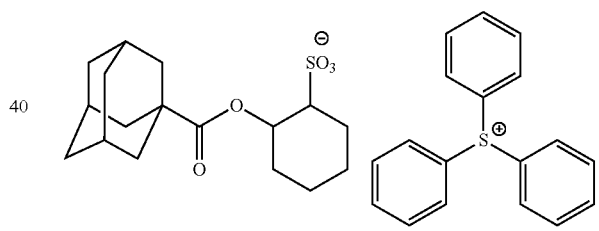
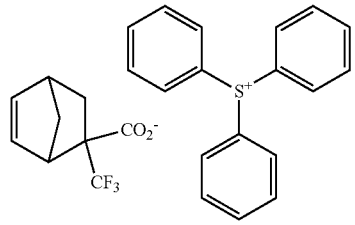
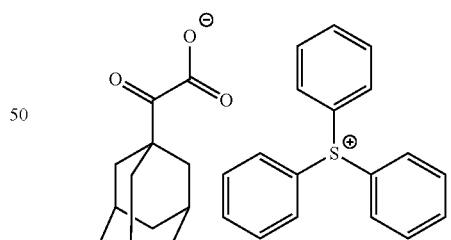
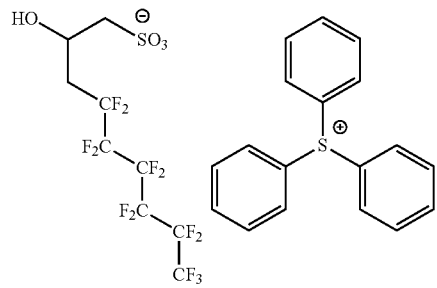
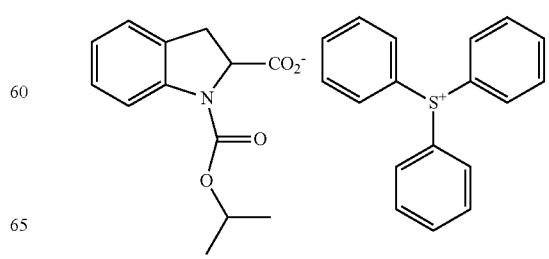
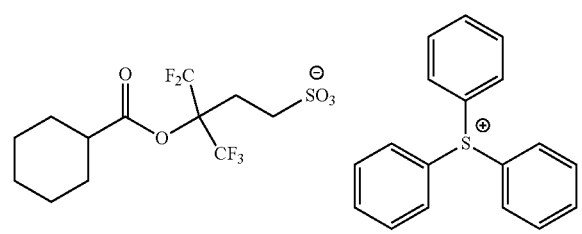

121
-continued
122
-continued
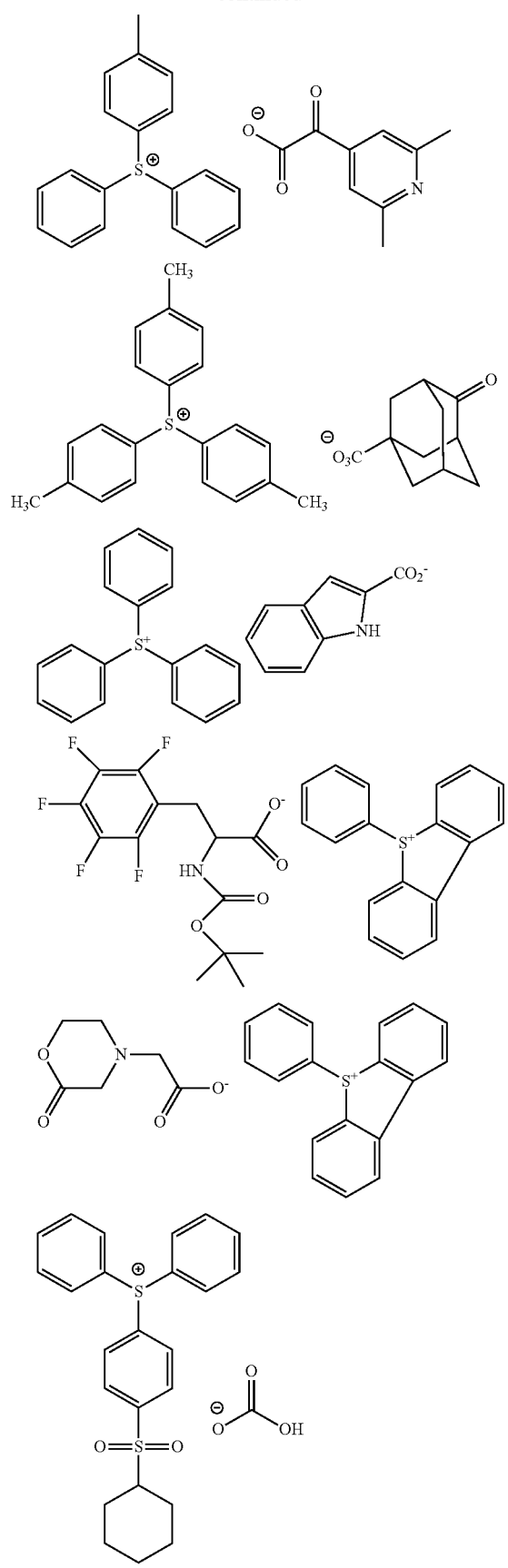
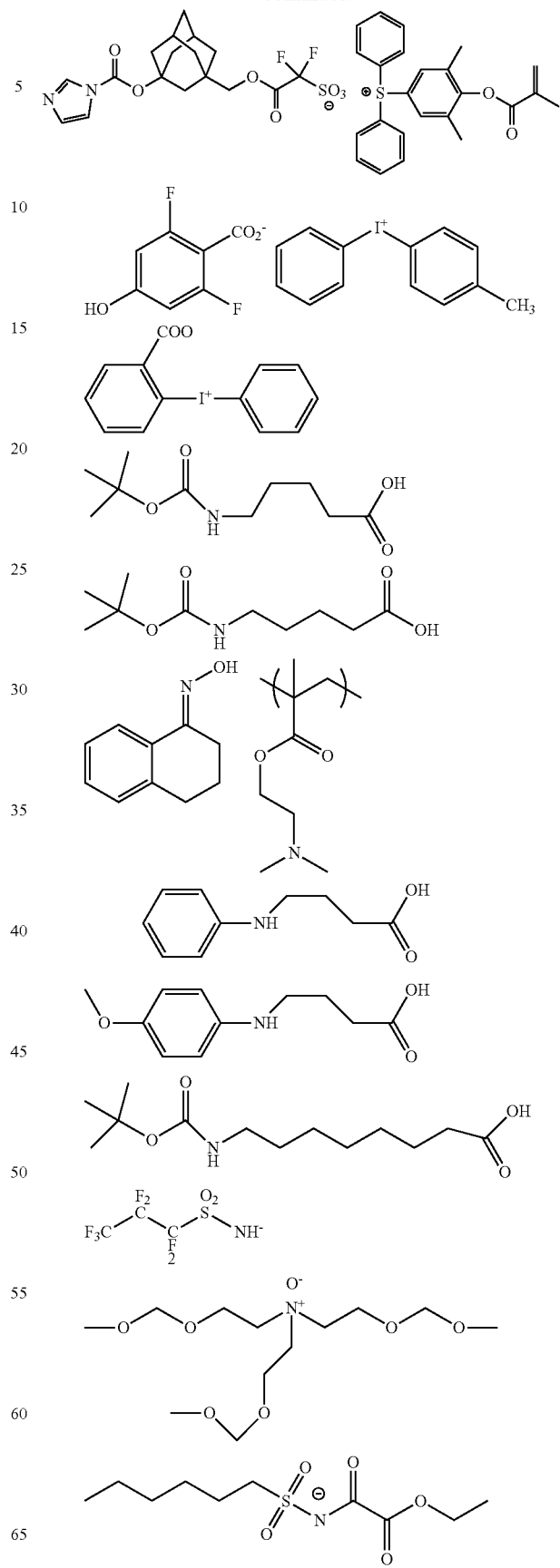

123
-continued
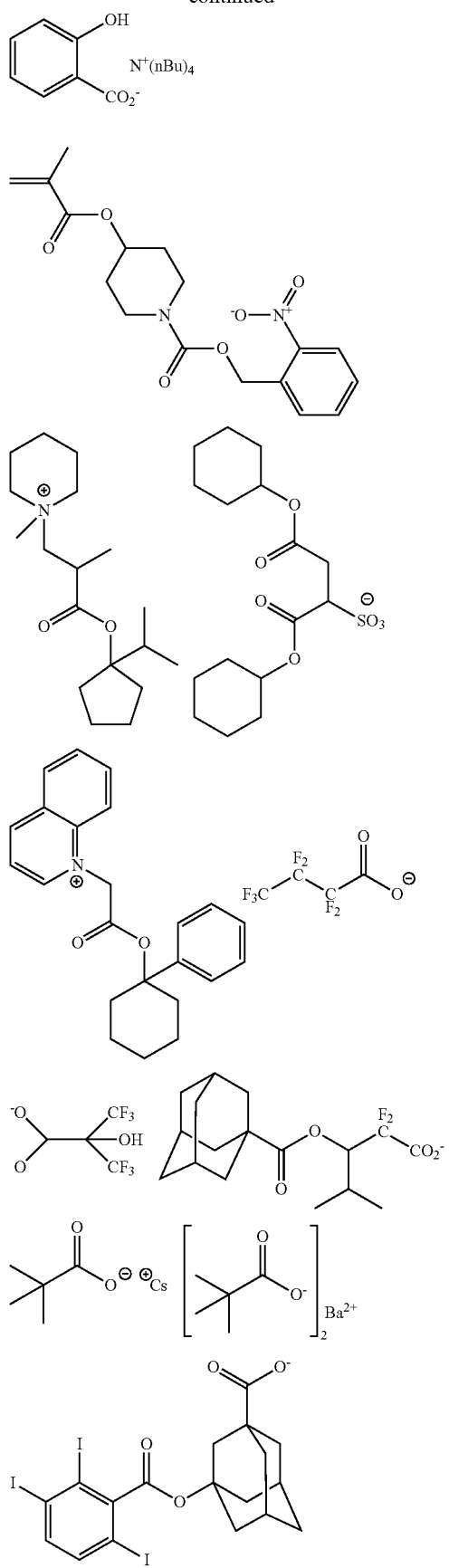
124
-continued
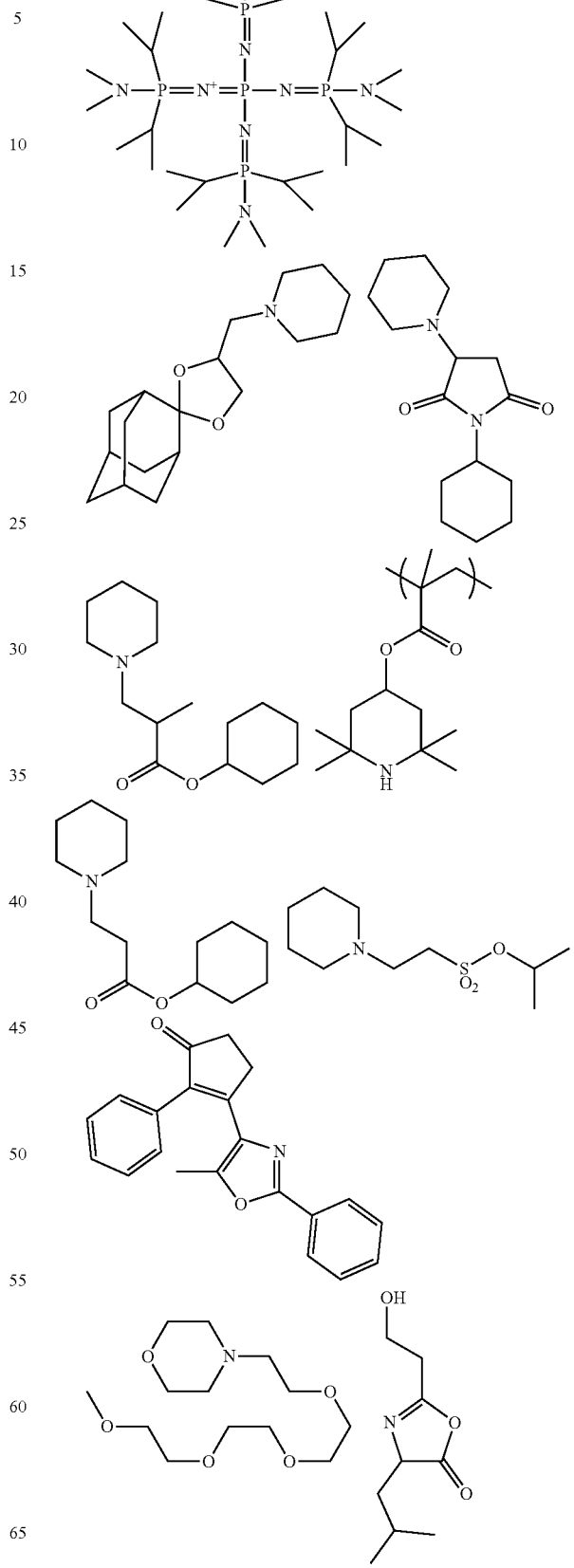

125
-continued
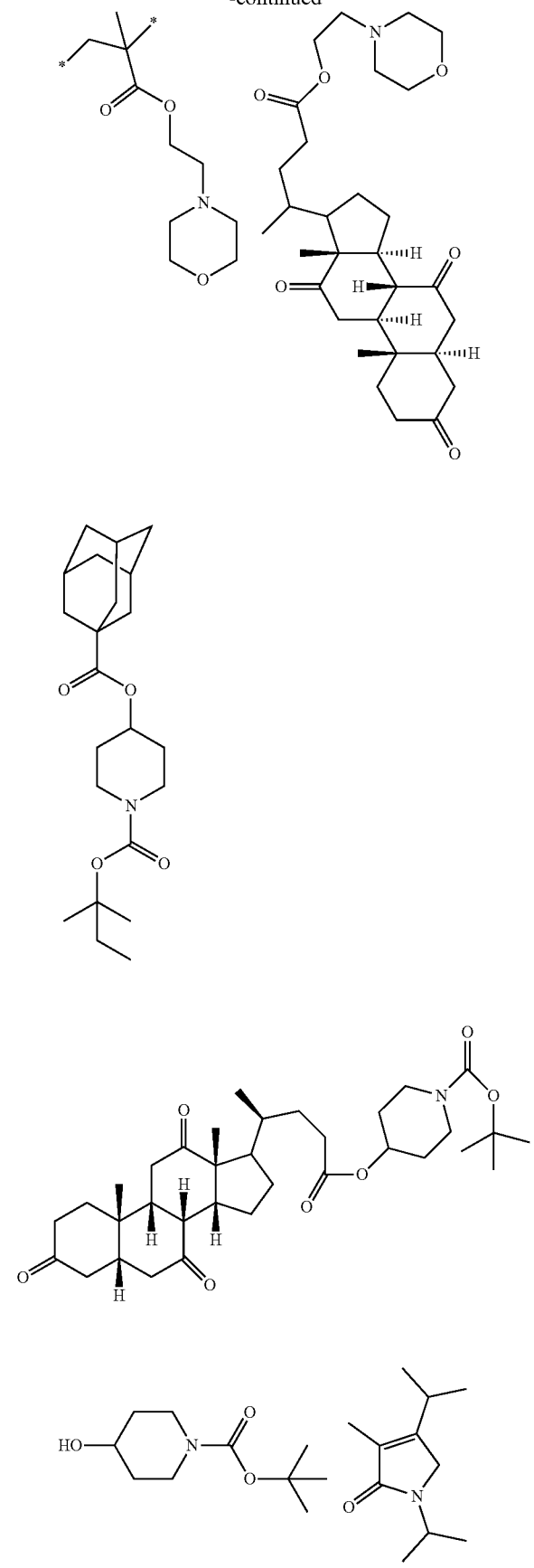
126
-continued
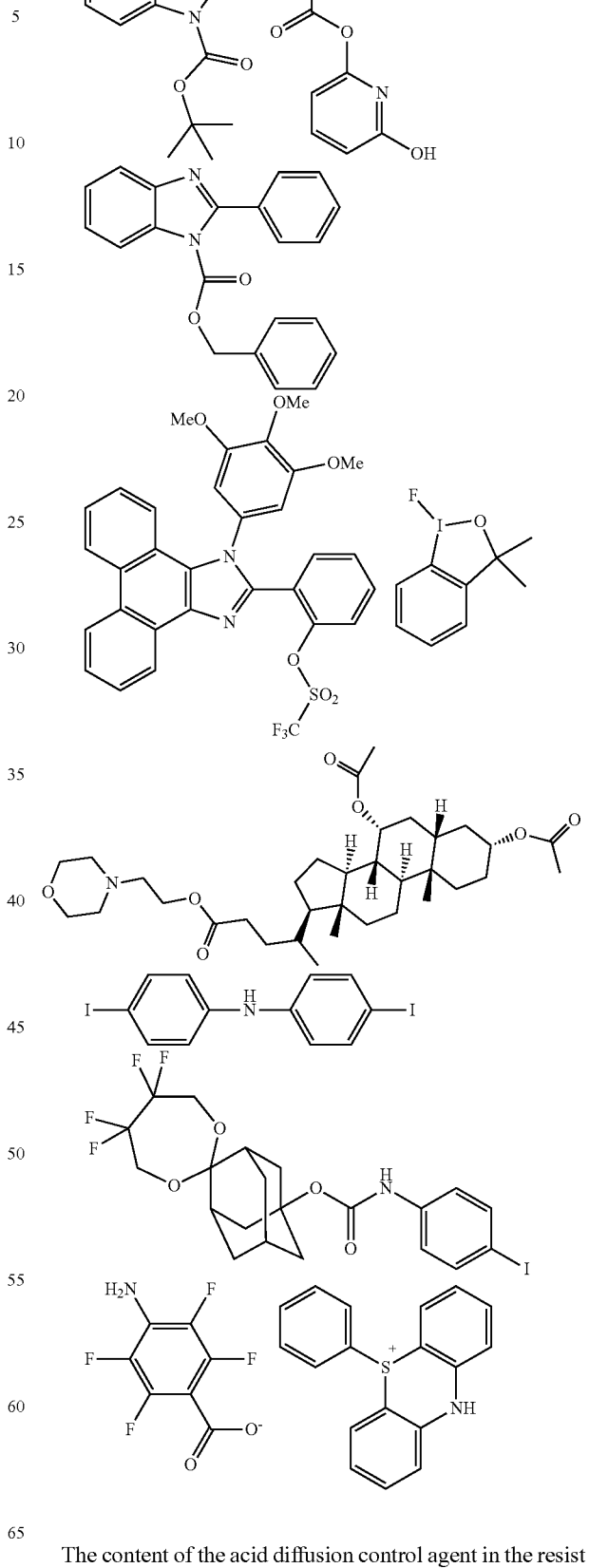
The content of the acid diffusion control agent in the resist composition is preferably 0.001% to 10% by mass, and more preferably 0.01% to 5% by mass with respect to the total solid content of the composition.

The acid diffusion control agents may be used alone or in combination of two or more kinds thereof.

In the resist composition, the acid diffusion control agent is more preferably the compound (PA).

The ratio of the photoacid generator and the acid diffusion control agent in the resist composition, photoacid generator/acid diffusion control agent (molar ratio), is preferably 2.5 to 300. From the viewpoints of the sensitivity and the resolution, the molar ratio is preferably 2.5 or more, and from the viewpoint of suppression of reduction in the resolution as the resist pattern is thickened with aging after exposure until the heating treatment, the molar ratio is preferably 300 or less. The photoacid generator/acid diffusion control agent (molar ratio) is more preferably 5.0 to 200, and still more preferably 7.0 to 150.

Examples of the acid diffusion control agent include the compounds (amine compounds, amido group-containing compounds, urea compounds, nitrogen-containing heterocyclic compounds, and the like) described in paragraphs <0140> to <0144> of JP2013-011833A.

<(E) Hydrophobic Resin>

The resist composition may include a hydrophobic resin other than the resin (A), in addition to the resin (A).

Although it is preferable that the hydrophobic resin is designed to be unevenly distributed on a surface of the resist film, it does not necessarily need to have a hydrophilic group in its molecule as different from the surfactant, and does not need to contribute to uniform mixing of polar materials and nonpolar materials.

Examples of the effect of addition of the hydrophobic resin include a control of static and dynamic contact angles of a surface of the resist film with respect to water and suppression of out gas.

The hydrophobic resin preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds. Incidentally, the hydrophobic resin preferably has a hydrocarbon group having 5 or more carbon atoms. These groups may be contained in the main chain of the resin or may be substituted in the side chain.

In a case where hydrophobic resin includes a fluorine atom and/or a silicon atom, the fluorine atom and/or the silicon atom in the hydrophobic resin may be included in the main chain or the side chain of the resin.

In a case where the hydrophobic resin includes a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom, and may further have a substituent other than a fluorine atom.

Examples of the repeating unit having a fluorine atom or a silicon atom include those exemplified in paragraph <0519> of US2012/0251948A1.

Moreover, it is also preferable that the hydrophobic resin includes a $CH_3$ partial structure in the side chain moiety as described above.

Here, the $CH_3$ partial structure contained in the side chain moiety in the hydrophobic resin includes a $CH_3$ partial structure contained in an ethyl group, a propyl group, and the like.

On the other hand, a methyl group bonded directly to the main chain of the hydrophobic resin (for example, an a-methyl group in the repeating unit having a methacrylic acid structure) makes only a small contribution of uneven distribution to the surface of the hydrophobic resin due to the effect of the main chain, and it is therefore not included in the $CH_3$ partial structure in the present invention.

With regard to the hydrophobic resin, reference can be made to the description in paragraphs <0348> to <0415> of JP2014-010245A, the contents of which are incorporated herein by reference.

In addition, the resins described in JP2011-248019A, JP2010-175859A, and JP2012-032544A can also be preferably used as the hydrophobic resin.

In a case where the resist composition includes a hydrophobic resin, the content of the hydrophobic resin is preferably 0.01% to 20% by mass, and more preferably 0.1% to 15% by mass with respect to the total solid content of the composition.

<Surfactant (F)>

The resist composition may include a surfactant (F). By incorporation of the surfactant, the adhesiveness is more excellent and a pattern having reduced development defects can be obtained.

As the surfactant, fluorine- and/or silicon-based surfactants are preferable.

Examples of the fluorine- and/or silicon-based surfactants include the surfactants described in paragraph <0276> of US2008/0248425A. Further, EFTOP EF301 or EF303 (manufactured by Shin-Akita Chemical Co., Ltd.); FLORAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Chemical Corporation); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Co., Ltd.); or FTX-204G, 208G, 218G, 230G, 204D, 208D, 212D, 218D, or 222D (manufactured by NEOS COMPANY LIMITED) may be used. In addition, Polysiloxane Polymer KP-341 (manufactured by Shin-Etsu Chemical Co., Ltd.) can also be used as the silicon-based surfactant.

Furthermore, as the surfactant, a compound synthesized a fluoroaliphatic compound produced by a telomerization method (also referred to as a telomer method) or an oligomerization method (also referred to as an oligomer method) may be used, in addition to the known surfactants as shown above. Specifically, a polymer comprising a fluoroaliphatic group derived from the fluoroaliphatic compound may also be used as the surfactant. The fluoroaliphatic compound can be synthesized in accordance with the method described in JP2002-090991A.

In addition, another surfactant other than the fluorine-based and/or silicon-based surfactants, described in paragraph <0280> of US2008/0248425A, may also be used.

These surfactants may be used alone or in combination of two or more kinds thereof.

In a case where the resist composition includes a surfactant, the content of the surfactant is preferably 0.0001% to 2% by mass, and more preferably 0.0005% to 1% by mass, with respect to the total solid content of the composition.

<Other Additives (G)>

The resist composition may further include, in addition to the components, a dissolution inhibiting compound, a dye, a plasticizer, a photosensitizer, a light absorber, a compound promoting a solubility in a developer (for example, a phenol compound having a molecular weight of 1,000 or less or an alicyclic or aliphatic compound including a carboxyl group), or the like.

The resist composition may further include a dissolution inhibiting compound. Here, the "dissolution inhibiting compound" is intended to mean a compound having a molecular weight of 3,000 or less, whose solubility in an organic developer decreases by decomposition by action of an acid.

<<Pattern Forming Method>>

The procedure of the pattern forming method using the resist composition is not particularly limited, but preferably has the following steps.

Step 1: a step of forming a resist film on a substrate, using a resist composition;

Step 2: a step of exposing the resist film with EUV light; and

Step 3: a step of developing the exposed resist film using an alkali developer to form a pattern Hereinafter, the procedure of each of the steps will be described in detail.

In addition, aspects using an alkali developer will be described below, but an aspect of forming a pattern using an organic solvent as a developer is also available.

<Step 1: Resist film Forming Step>

The step 1 is a step of forming a resist film on a substrate, using a resist composition.

The definition of the resist composition is as described above.

Examples of a method in which a resist film is formed on a substrate, using a resist composition, include a method in which a resist composition is applied onto a substrate.

In addition, it is preferable that the resist composition before the application is filtered through a filter, as desired. The pore size of the filter is preferably 0.1 μm or less, more preferably 0.05 μm or less, and still more preferably 0.03 μm or less. Further, the filter is preferably a polytetrafluoroethylene-, polyethylene-, or nylon-made filter.

The resist composition is applied to a substrate (examples: a silicon- or silicon dioxide-coated substrate) as used for the manufacture of an integrated circuit element, by an appropriate application method such as a method using a spinner, a coater, or the like. The spin application using a spinner is preferable as the coating method. The rotation speed upon the spin application using a spinner is preferably 1,000 to 3,000 rpm.

After the application of the resist composition, the substrate may be dried to form a resist film. In addition, various base films (an inorganic film, an organic film, or an antireflection film) may be formed below the resist film, as desired.

Examples of the drying method include a method of performing drying by heating. The heating can usually be performed using a unit comprised in a typical exposing machine and/or developing machine, and may be performed using a hot plate or the like. The heating temperature is preferably 80° C. to 150° C., more preferably 80° C. to 140° C., and still more preferably 80° C. to 130° C. The heating time is preferably 30 to 1,000 seconds, more preferably 60 to 800 seconds, and still more preferably 60 to 600 seconds.

The film thickness of the resist film is not particularly limited, but from the viewpoint that a more accurate fine pattern can be formed, the film thickness is preferably 10 to 65 nm, more preferably 15 to 50 nm.

Moreover, a topcoat may be formed on the upper layer of the resist film using a topcoat composition.

It is preferable that the topcoat composition is not mixed with the resist film and can be uniformly applied onto the upper layer of the resist film.

In addition, it is preferable that the resist film is dried before forming the topcoat. Subsequently, a topcoat composition can be applied onto the obtained resist film by the same unit as for the method for forming the resist film, and further dried to form a topcoat.

The film thickness of the topcoat is preferably 10 to 200 nm, more preferably 20 to 100 nm, and still more preferably 40 to 80 nm.

The topcoat is not particularly limited, a topcoat known in the related art can be formed by the methods known in the related art, and a topcoat can be formed in accordance with, for example, the description in paragraphs <0072> to <0082> of JP2014-059543A.

It is preferable that a topcoat including a basic compound as described in JP2013-061648A, for example, is formed on a resist film. Specific examples of the basic compound which can be included in the topcoat include basic compounds which can be included in the resist composition which will be described later.

In addition, the topcoat preferably includes a compound including at least one of a group or bond selected from the group consisting of an ether bond, a thioether bond, a hydroxyl group, a thiol group, a carbonyl bond, and an ester bond.

<Step 2: Exposing Step>

The step 2 is a step of exposing the resist film with EUV light.

Examples of an exposing method include a method in which a resist film formed is irradiated with EUV light through a predetermined mask.

After exposure, it is preferable to perform baking (heating) before performing development. The reaction of the exposed area is promoted by baking, and the sensitivity and the pattern shape are improved.

The heating temperature is preferably 80° C. to 150° C., more preferably 80° C. to 140° C., and still more preferably 80° C. to 130° C.

The heating time is preferably 10 to 1,000 seconds, more preferably 10 to 180 seconds, and still more preferably 30 to 120 seconds.

Heating may be performed using a unit comprised in a typical exposing machine and/or developing machine, or may also be performed using a hot plate or the like.

This step is also referred to as post-exposure baking.

<Step 3: Developing Step>

The step 3 is a step of developing the exposed resist film using an alkali developer to form a pattern.

Examples of the developing method include a method in which a substrate is immersed in a tank filled with a developer for a certain period of time (a dip method), a method in which a developer is heaped up to the surface of a substrate by surface tension and developed by maintaining for a certain period of time (a puddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In addition, a step of stopping development while replacing the solvent with another solvent may be performed after the developing step.

The developing time is not particularly limited as long as it is a period of time where the non-exposed area of a resin is sufficiently dissolved and is preferably 10 to 300 seconds, and more preferably 20 to 120 seconds.

The temperature of the developer is preferably 0° C. to 50° C., and more preferably 15° C. to 35° C.

As the alkali developer, an aqueous alkali solution including an alkali is preferably used. The type of the aqueous alkali solution is not particularly limited, but examples thereof include aqueous alkali solutions of quaternary ammonium salts typified by tetramethylammonium hydroxide, an inorganic alkali, primary amines, secondary amines, tertiary amines, alcohol amines, cyclic amines, or the like. Among those, the aqueous solutions of the quaternary ammonium salts typified by tetramethylammonium hydroxide (TMAH) are preferable as the alkali developer. To the alkali developer may be added an appropriate amount of alcohols, a surfactant, or the like. The alkali concentration of the alkali developer is usually 0.1% to 20% by mass. In addition, the pH of the alkali developer is usually 10.0 to 15.0.

<Other Steps>

The pattern forming method preferably includes a step of performing washing using a rinsing liquid after the step 3.

Examples of the rinsing liquid used in the rinsing step after the step of performing development using an alkali developer include pure water. In addition, an appropriate amount of a surfactant may be added to pure water.

An appropriate amount of a surfactant may be added to the rinsing liquid.

A method for the rinsing step is not particularly limited, but examples thereof include a method in which a rinsing liquid is continuously discharged on a substrate rotated at a constant rate (a rotation application method), a method in which a substrate is immersed in a tank filled with a rinsing liquid for a certain period of time (a dip method), and a method in which a rinsing liquid is sprayed on a substrate surface (a spray method).

Furthermore, the pattern forming method of the embodiment of the present invention may include a heating step (post-baking) after the rinsing step. By the present step, the developer and the rinsing liquid remaining between the patterns and inside the pattern are removed by baking. Furthermore, an effect that the resist pattern is annealed to improve the surface roughness of a pattern is obtained by the present step. The heating step after the rinsing step is usually performed at a heating temperature of 40° C. to 250° C. (preferably 90° C. to 200° C.), usually for 10 seconds to 3 minutes (preferably for 30 seconds to 120 seconds).

Moreover, an etching treatment of a substrate may be carried out using the formed pattern as a mask. That is, the substrate (or the underlayer film and the substrate) may be processed using the pattern formed in the step 3 as a mask, thereby forming a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern formed in the step 3 as a mask is preferable.

The dry etching may be one-stage etching or multi-stage etching. In a case where the etching is etching including a plurality of stages, the etchings at the respective stages may be the same treatment or different treatment.

For etching, any of known methods can be used, and various conditions and the like are appropriately determined according to the type of a substrate, usage, and the like. Etching can be carried out, for example, in accordance with The International Society for Optical Engineering (Proc. of SPIE), Vol. 6924, 692420 (2008), JP2009-267112A, and the like. In addition, etching can also be carried out in accordance with "Chapter 4 Etching" in "Semiconductor Process Text Book, 4th Ed., published in 2007, publisher: SEMI Japan".

Among those, the dry etching is preferably oxygen plasma etching.

It is preferable that various materials (for example, a solvent, a developer, a rinsing liquid, a composition for forming an antireflection film, and a composition for forming a topcoat) used in the resist composition and the pattern forming method of the embodiment of the present invention do not include impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Pb, Ti, V, W, and Zn.

Examples of a method for removing impurities such as metals from the various materials include filtration using a filter. As for the filter pore diameter, the pore size is preferably less than 100 nm, more preferably 10 nm or less, and still more preferably 5 nm or less. As the filter, a polytetrafluoroethylene-made filter, a polyethylene-made filter, or a nylon-made filter is preferable. The filter may be constituted with a composite material formed by combining the filter material with an ion exchange medium. As the filter, a filter which had been washed with an organic solvent in advance may be used. In the step of filtration using a filter, a plurality of kinds of filters may be connected in series or in parallel, and used. In a case of using the plurality of kinds of filters, a combination of filters having different pore diameters and/or materials may be used. In addition, various materials may be filtered plural times, and the step of filtering plural times may be a circulatory filtration step.

In the production of the resist composition, it is preferable that after dissolving the respective components such as a resin and a photoacid generator in a solvent, circulatory filtration is performed using a plurality of filters with different materials. For example, it is preferable to connect a polyethylene-made filter with a pore diameter of 50 nm, a nylon-made filter with a pore diameter of 10 nm, and a polyethylene-made filter with a pore diameter of 3 nm in permuted connection, and then perform circulatory filtration ten times or more. A smaller pressure difference among the filters is preferable, and the pressure difference is generally 0.1 MPa or less, preferably 0.05 MPa or less, and more preferably 0.01 MPa or less. A smaller pressure difference between the filter and the charging nozzle is also preferable, and the pressure difference is generally 0.5 MPa or less, preferably 0.2 MPa or less, and more preferably 0.1 MPa or less.

It is preferable to subject the inside of a device for producing the resist composition to gas replacement with inert gas such as nitrogen. Thus, it is possible to suppress active gas such as oxygen from being dissolved in the composition.

After being filtered by a filter, the resist composition is charged into a clean container. It is preferable that the resist composition charged in the container is subjected to refrigeration storage. Thus, it is possible to suppress performance deterioration over time. A shorter time from completion of the charge of the composition into the container to initiation of refrigeration storage is preferable, and the time is generally within 24 hours, preferably within 16 hours, more preferably within 12 hours, and still more preferably 10 hours. The storage temperature is preferably 0° C. to 15° C., more preferably 0° C. to 10° C., and still more preferably 0° C. to 5° C.

Moreover, examples of the method for reducing the impurities such as a metal included in various materials include a method of selecting raw materials having a low content of metals as raw materials constituting various materials, a method of subjecting raw materials constituting various materials to filtration using a filter, and a method of performing distillation under the condition for suppressing the contamination as much as possible by, for example, lining the inside of a device with TEFLON (registered trademark).

In addition to filtration using a filter, removal of impurities by an adsorbing material may be performed, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used. It is necessary to prevent the incorporation of metal impurities in the production process in order to reduce the impurities such as metals included in the various materials. Sufficient removal of metal impurities from a production device can be checked by measuring the content of metal components included in a washing liquid used to wash the production device. The content of the metal components included in the washing liquid after the use is preferably 100 parts per trillion (ppt) by mass or less, more preferably 10 ppt by mass or less, and still more preferably 1 ppt by mass or less.

An electrically conductive compound may be added to an organic treatment liquid such as a rinsing liquid in order to prevent failure of chemical liquid pipe and various parts (a filter, an O-ring, a tube, or the like) due to electrostatic charge, and subsequently generated electrostatic discharge. The electrically conductive compound is not particularly limited and examples thereof include methanol. The addition amount is not particularly limited, but from the viewpoint that preferred development characteristics or rinsing characteristics are maintained, the addition amount is preferably 10% by mass or less, and more preferably 5% by mass or less.

For members of the chemical liquid pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or a fluorine resin (a polytetrafluoroethylene or perfluoroalkoxy resin, or the like) that has been subjected to an antistatic treatment can be used.

A method for improving the surface roughness of a pattern may be applied to a pattern formed by the method of the present invention. Examples of the method for improving the surface roughness of the pattern include the method of treating a pattern by a plasma of a hydrogen-containing gas disclosed in WO2014/002808A. Additional examples of the method include known methods as described in JP2004-235468A, US2010/0020297A, JP2008-083384A, and Proc. of SPIE Vol. 8328 83280N-1 "EUV Resist Curing Technique for LWR Reduction and Etch Selectivity Enhancement".

In a case where a pattern formed is in the form of a line, an aspect ratio determined by dividing a height of the pattern with a line width is preferably 2.5 or less, more preferably 2.1 or less, and still more preferably 1.7 or less.

In a case where a pattern formed is in the form of a trench (groove) pattern or a contact hole pattern, an aspect ratio determined by dividing a height of the pattern with the trench width or the hole diameter is preferably 4.0 or less, more preferably 3.5 or less, and still more preferably 3.0 or less.

The pattern forming method of the embodiment of the present invention can be used for guide pattern formation in a directed self-assembly (DSA) (see, for example, ACS Nano Vol. 4, No. 8, Pages 4815-4823).

In addition, a pattern formed by the method can be used as a core material (core) of the spacer process disclosed in JP1991-270227A (JP-H03-270227A) and JP2013-164509A.

Moreover, the present invention further relates to a method for manufacturing an electronic device, including the above-described pattern forming method, and an electronic device manufactured by the manufacturing method.

The electronic device of an embodiment of the present invention is suitably mounted on electric or electronic equipment (for example, home electronics, office automation (OA)-related equipment, media-related equipment, optical equipment, telecommunication equipment, and the like).

EXAMPLES

Hereinafter, the present invention will be described in more details with reference to Examples, but the present invention is not limited thereto.

Synthesis Example 1: Synthesis of Polymer P-1

15.5 g, 25.4 g, and 9.8 g, in order from the left side, of monomers corresponding to the respective repeating units (M-2/M-4/M-23) of a polymer P-1 and a polymerization initiator V-601 (manufactured by Wako Pure Chemical Industries, Co., Ltd.) (3.17 g) were dissolved in cyclohexanone (105 g). A solution thus obtained was taken as a monomer solution.

Cyclohexanone (194.3 g) was put into a reaction vessel, and the monomer solution was added dropwise to the reaction vessel in a system that had been adjusted to 85° C. in a nitrogen gas atmosphere, for 4 hours. The obtained reaction solution was stirred at 85° C. for 2 hours in the reaction vessel and then left to be cooled until the reaction solution reached room temperature.

The reaction solution after being left to be cooled was added dropwise to a mixed liquid of methanol and water (methanol/water=5/5 (mass ratio)) for 20 minutes and the precipitated powder was filtered. The obtained powder was dried to obtain a polymer P-1 (31.6 g).

The compositional ratio (mass ratio) of the repeating units determined by a nuclear magnetic resonance (NMR) method was 30/50/20. The weight-average molecular weight in terms of polystyrene as a standard and the dispersity (Mw/Mn) of the polymer P-1 were 8,000 and 1.6, respectively.

The other polymers were also synthesized by the same procedure or a known procedure.

The monomer structures used for polymers P-1 to P-67 are shown below. Further, the compositional ratio (mass ratio), the weight-average molecular weight (Mw), and the dispersity of each of the polymers are shown in Table 1 below. The compositional ratios correspond to the respective repeating units in order from the left side.

The "LUMO" in the following structural formulae represents the energy (eV) of the lowest unoccupied molecular orbital level of the monomers constituting the respective repeating units. The "Tg" represents Tg (° C.) of a homopolymer constituted only with the respective repeating units, as calculated by a Bicerano method.

M-1

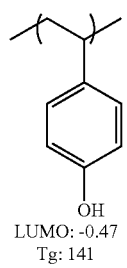

LUMO: -0.47
Tg: 141

M-2

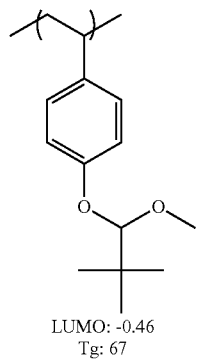

LUMO: -0.46
Tg: 67

M-3

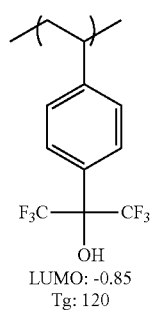

LUMO: -0.85
Tg: 120

-continued

M-4

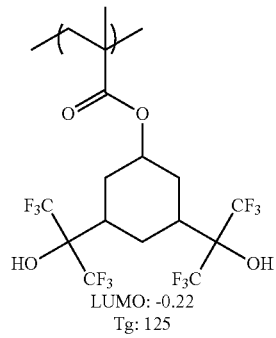

LUMO: -0.22
Tg: 125

M-5

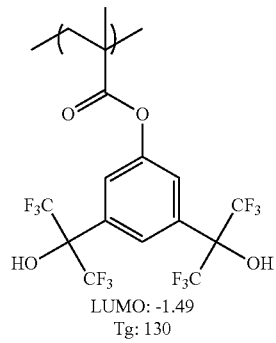

LUMO: -1.49
Tg: 130

M-6

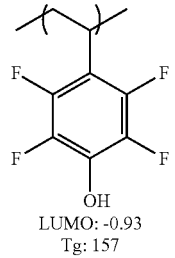

LUMO: -0.93
Tg: 157

M-7

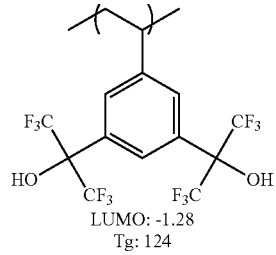

LUMO: -1.28
Tg: 124

M-8

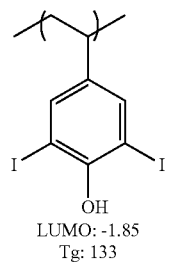

LUMO: -1.85
Tg: 133

M-9
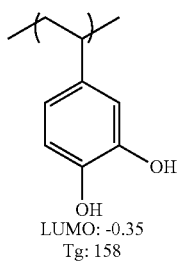
LUMO: -0.35
Tg: 158
M-10
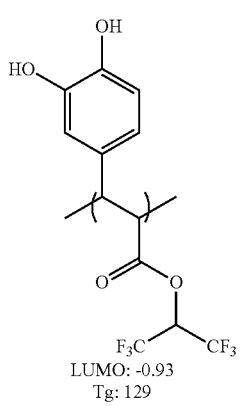
LUMO: -0.93
Tg: 129
M-11
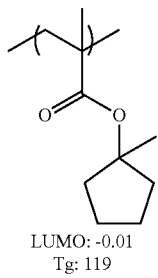
LUMO: -0.01
Tg: 119
M-12
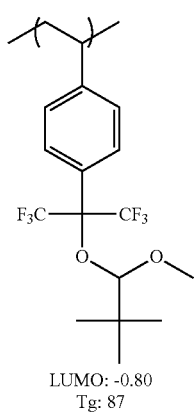
LUMO: -0.80
Tg: 87
M-13
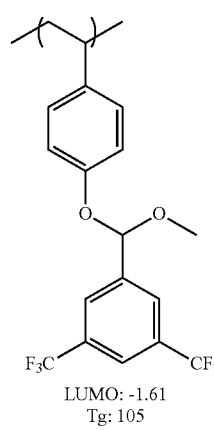
LUMO: -1.61
Tg: 105
M-14
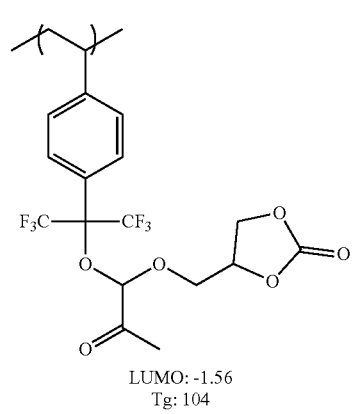
LUMO: -1.56
Tg: 104
M-15
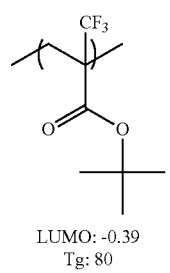
LUMO: -0.39
Tg: 80
M-16
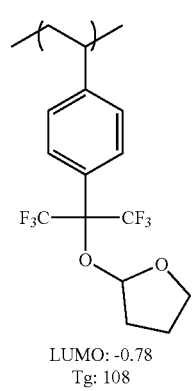
LUMO: -0.78
Tg: 108

-continued
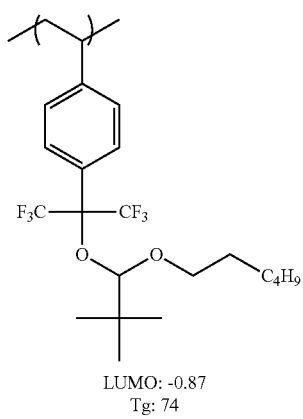
LUMO: -0.87
Tg: 74
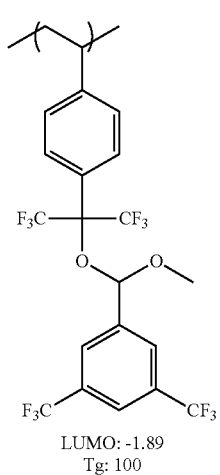
LUMO: -1.89
Tg: 100
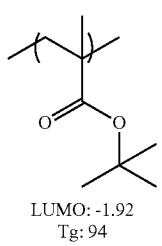
LUMO: -1.92
Tg: 94
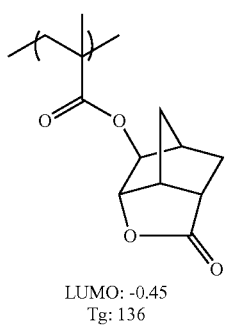
LUMO: -0.45
Tg: 136
-continued
M-17
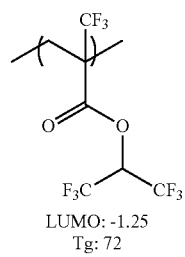
LUMO: -1.25
Tg: 72
M-18
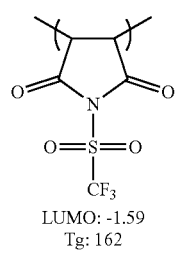
LUMO: -1.59
Tg: 162
M-19
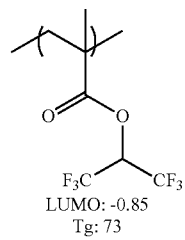
LUMO: -0.85
Tg: 73
M-20
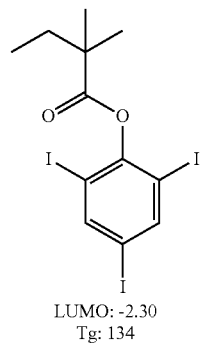
LUMO: -2.30
Tg: 134
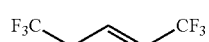
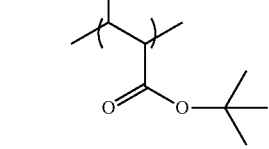
LUMO: -1.72
Tg: 103
M-21
M-22
M-23
M-24
M-25

-continued
M-26
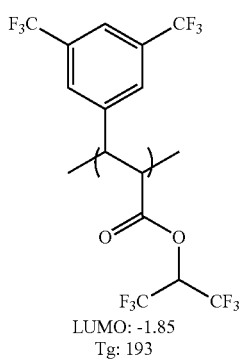
LUMO: -1.85
Tg: 193
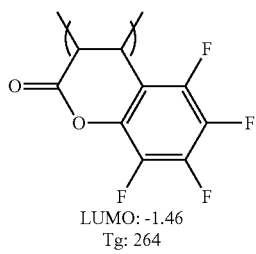
LUMO: -1.46
Tg: 264
M-27
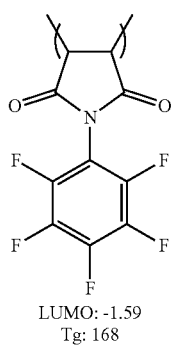
LUMO: -1.59
Tg: 168
M-28
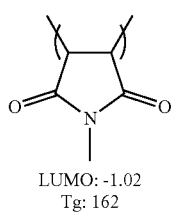
LUMO: -1.02
Tg: 162
M-29
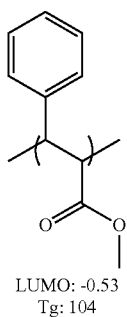
LUMO: -0.53
Tg: 104
M-30
-continued
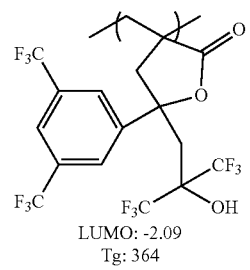
LUMO: -2.09
Tg: 364
M-31
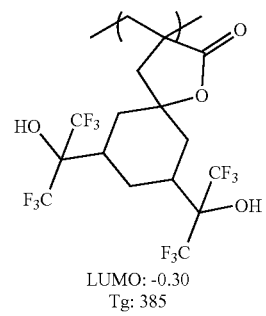
LUMO: -0.30
Tg: 385
M-32
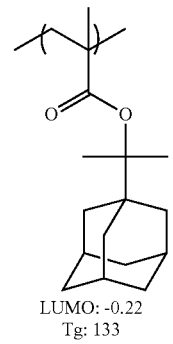
LUMO: -0.22
Tg: 133
M-33
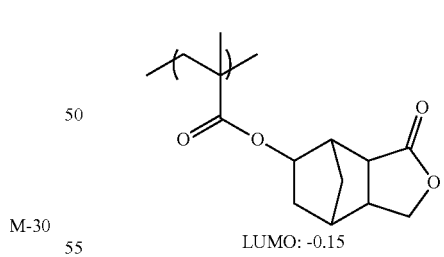
LUMO: -0.15
Tg: 138
M-34
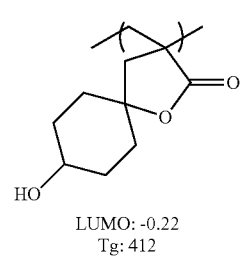
LUMO: -0.22
Tg: 412
M-35

-continued

M-36

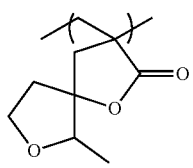

LUMO: -0.20
Tg: 377

M-37

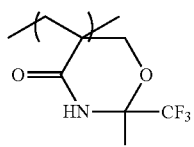

LUMO: -0.55
Tg: 130

M-38

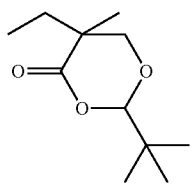

LUMO: -0.42
Tg: 101

M-39

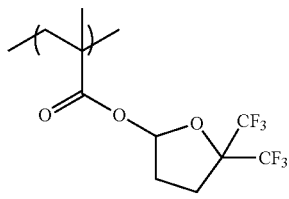

LUMO: -0.50
Tg: 103

TABLE 1

| Polymer | Compositional ratio (mass ratio) | Weight-average molecular weight (Mw) | Dispersity |
|---|---|---|---|
| P-1 | M-2/M-4/M-23 = 30/50/20 | 8,000 | 1.6 |
| P-2 | M-5/M-13/M-21 = 40/35/25 | 8,000 | 1.5 |
| P-3 | M-1/M-3/M-12 = 30/20/50 | 4,000 | 1.4 |
| P-4 | M-4/M-9/M-15/M-23 = 30/10/50/10 | 6,000 | 1.5 |
| P-5 | M-6/M-7/M-14/M-22 = 10/30/40/20 | 8,000 | 1.7 |
| P-6 | M-8/M-17/M-21 = 35/40/25 | 12,000 | 1.8 |
| P-7 | M-8/M-17/M-24 = 35/40/25 | 4,000 | 1.4 |
| P-8 | M-3/M-9/M-16/M-20 = 10/20/50/20 | 6,000 | 1.4 |
| P-9 | M-2/M-5/M-15 = 30/40/30 | 8,000 | 1.5 |
| P-10 | M-5/M-18 = 50/50 | 12,000 | 1.7 |
| P-11 | M-7/M-8/M-18/M-21 = 10/20/40/30 | 6,000 | 1.3 |
| P-12 | M-7/M-19/M-24 = 30/30/40 | 6,000 | 1.4 |
| P-13 | M-10/M-11 = 50/50 | 6,000 | 1.5 |
| P-14 | M-6/M-12/M-23 = 20/70/10 | 6,000 | 1.4 |
| P-15 | M-4/M-13/M-23 = 25/50/25 | 8,000 | 1.6 |
| P-16 | M-7/M-17/M-21 = 20/30/50 | 12,000 | 1.8 |
| P-17 | M-7/M-8/M-15/M-19/M-24 = 10/20/10/20/40 | 12,000 | 1.6 |
| P-18 | M-4/M-9/M-15/M-23 = 40/10/40/10 | 4,000 | 1.3 |
| P-19 | M-5/M-14 = 50/50 | 6,000 | 1.3 |
| P-20 | M-1/M-5/M-17/M-20 = 20/20/50/10 | 2,000 | 1.2 |
| P-21 | M-5/M-12/M-14/M-21 = 30/20/20/30 | 3,000 | 1.4 |
| P-22 | M-4/M-17/M-19/M-21 = 19/41/20/20 | 8,000 | 1.8 |
| P-23 | M-3/M-12/M-22 = 20/50/30 | 8,000 | 1.6 |
| P-24 | M-7/M-11/M-13/M-23 = 15/20/30/35 | 12,000 | 1.6 |

TABLE 1-continued

| Polymer | Compositional ratio (mass ratio) | Weight-average molecular weight (Mw) | Dispersity |
|---|---|---|---|
| P-25 | M-6/M-16/M-18/M-20/M-23 = 15/35/20/5/25 | 4,000 | 1.3 |
| P-26 | M-4/M-14/M-22 = 40/40/20 | 20,000 | 2.0 |
| P-27 | M-10/M-19/M-24 = 5/25/70 | 8,000 | 1.6 |
| P-28 | M-3/M-10/M-16/M-20 = 20/20/40/20 | 15,000 | 1.8 |
| P-29 | M-8/M-19/M-24 = 15/30/55 | 12,000 | 1.8 |
| P-30 | M-7/M-18/M-21 = 40/40/20 | 6,000 | 1.3 |
| P-31 | M-5/M-15/M-21 = 60/30/10 | 15,000 | 1.7 |
| P-32 | M-4/M-18/M-21 = 25/40/35 | 20,000 | 1.8 |
| P-33 | M-1/M-2/M-20 = 40/50/10 | 6,000 | 1.4 |
| P-34 | M-1/M-2/M-3 = 30/50/20 | 8,000 | 1.5 |
| P-35 | M-1/M-11 = 60/40 | 12,000 | 1.7 |
| P-36 | M-1/M-5/M-11 = 30/10/60 | 15,000 | 1.6 |
| P-37 | M-2/M-6/M-12/M-24 = 15/20/50/15 | 3,000 | 1.3 |
| P-38 | M-5/M-15/M-18/M-21 = 10/30/30/30 | 8,000 | 1.5 |
| P-39 | M-8/M-17/M-19/M-21 = 30/20/30/20 | 8,000 | 1.5 |
| P-40 | M-2/M-4/M-26 = 30/50/20 | 8,000 | 1.6 |
| P-41 | M-2/M-4/M-27 = 30/50/20 | 5,000 | 1.7 |
| P-42 | M-2/M-4/M-28 = 30/50/20 | 4,000 | 1.6 |
| P-43 | M-2/M-31/M-23 = 30/50/20 | 6,000 | 1.8 |
| P-44 | M-2/M-32/M-23 = 30/50/20 | 4,500 | 1.8 |
| P-45 | M-2/M-4/M-23/M-29 = 30/50/10/10 | 5,500 | 1.7 |
| P-46 | M-2/M-4/M-23/M-30 = 30/50/10/10 | 5,000 | 1.6 |
| P-47 | M-4/M-17/M-33/M-21 = 19/41/20/20 | 8,000 | 1.5 |
| P-48 | M-7/M-25/M-21 = 20/30/50 | 9,000 | 1.8 |
| P-49 | M-7/M-17/M-26 = 20/30/50 | 8,000 | 1.7 |
| P-50 | M-3/M-9/M-16/M-34 = 10/20/50/20 | 7,000 | 1.6 |
| P-51 | M-3/M-9/M-16/M-35 = 10/20/50/20 | 5,000 | 1.5 |
| P-52 | M-3/M-9/M-16/M-36 = 10/20/50/20 | 6,500 | 1.5 |
| P-53 | M-1/M-2/M-4/M-20 = 20/30/40/10 | 6,000 | 1.4 |
| P-54 | M-3/M-9/M-11/M-29 = 40/15/30/15 | 8,000 | 1.5 |
| P-55 | M-2/M-3/M-4/M-32 = 40/20/20/20 | 12,000 | 1.7 |
| P-56 | M-1/M-17 = 50/50 | 6,000 | 1.3 |
| P-57 | M-4/M-11/M-20/M-32 = 35/30/20/15 | 6,000 | 1.4 |
| P-58 | M-3/M-9/M-17/M-35 = 30/20/35/15 | 6,000 | 1.5 |
| P-59 | M-4/M-9/M-11/M-29 = 40/10/30/20 | 6,000 | 1.4 |
| P-60 | M-2/M-3/M-9/M-32 = 30/20/20/30 | 8,000 | 1.6 |
| P-61 | M-4/M-9/M-17/M-29 = 40/10/40/10 | 12,000 | 1.8 |
| P-62 | M-4/M-11/M-35 = 50/35/15 | 12,000 | 1.6 |
| P-63 | M-3/M-32/M-33 = 30/30/40 | 4,000 | 1.3 |
| P-64 | M-4/M-11/M-17/M-20 = 25/25/25/25 | 6,000 | 1.3 |
| P-65 | M-1/M-4/M-17/M-32/M-33 = 10/20/20/30/20 | 5,500 | 1.7 |
| P-66 | M-1/M-2/M-29/M-32 = 10/40/10/40 | 5,000 | 1.6 |
| P-67 | M-2/M-4/M-9/M-17/M-29 = 25/40/10/15/10 | 8,000 | 1.5 |
| P-68 | M-4/M-37/M-11 = 30/30/40 | 6,000 | 1.5 |
| P-69 | M-7/M-32/M-38 = 20/30/50 | 7,000 | 1.6 |
| P-70 | M-4/M-37/M-39 = 30/30/40 | 6,000 | 1.5 |

<Cationic Moiety of Photoacid Generator>

The "LUMO" in the following structural formulae represents the energy (eV) of the lowest unoccupied molecular orbital levels of the respective cationic moieties.

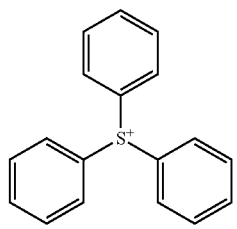

PAG-Cation1
LUMO: -2.04

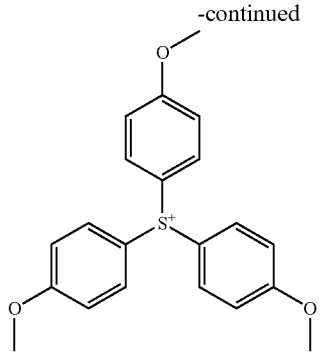

PAG-Cation2
LUMO: -1.63

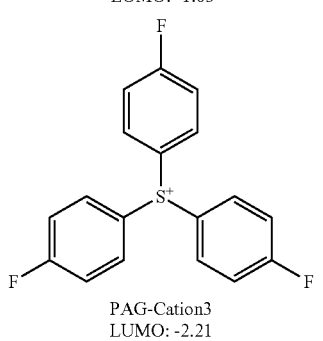

PAG-Cation3
LUMO: -2.21

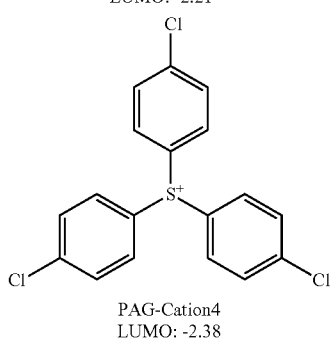

PAG-Cation4
LUMO: -2.38

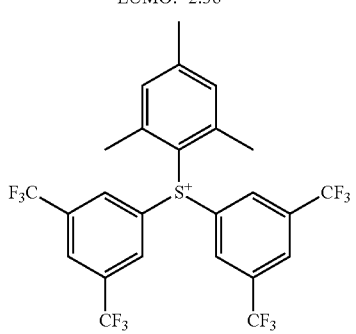

PAG-Cation5
LUMO: -2.79

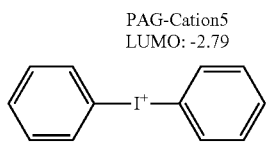

PAG-Cation6
LUMO: -2.58

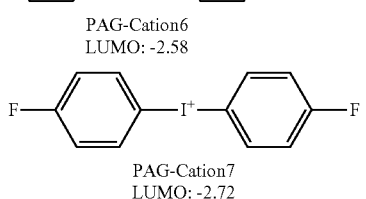

PAG-Cation7
LUMO: -2.72

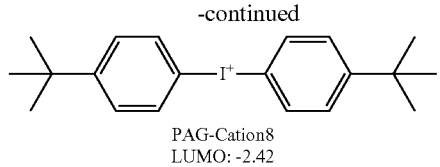

PAG-Cation8
LUMO: -2.42

<Anionic Moiety of Photoacid Generator>

The volumes ($Å^3$) in the following structural formulae represent volumes of acids (generated acids) in which a hydrogen atom is attached to each anion.

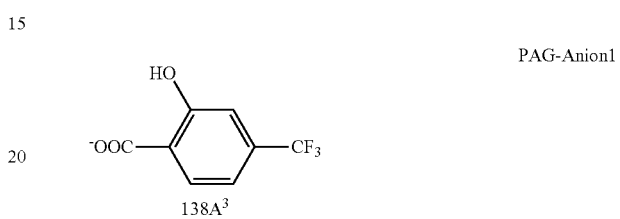

PAG-Anion1

$138Å^3$

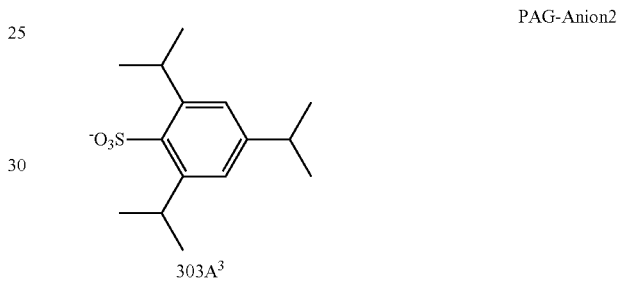

PAG-Anion2

$303Å^3$

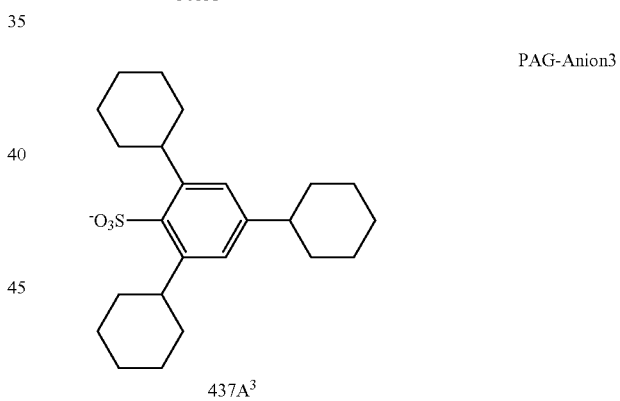

PAG-Anion3

$437Å^3$

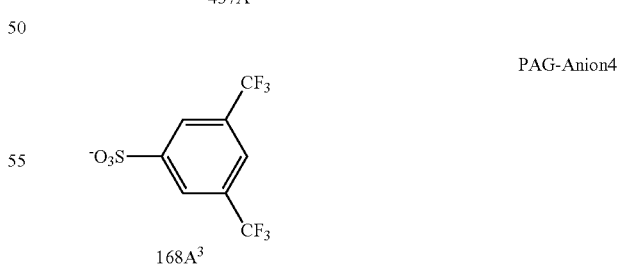

PAG-Anion4

$168Å^3$

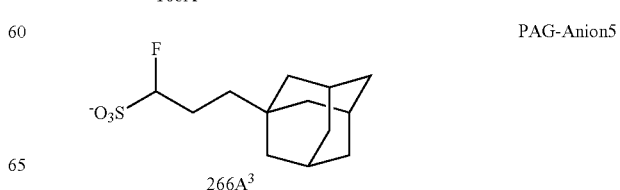

PAG-Anion5

$266Å^3$

-continued
PAG-Anion6
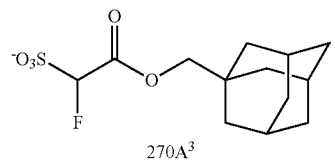
270A³
PAG-Anion7
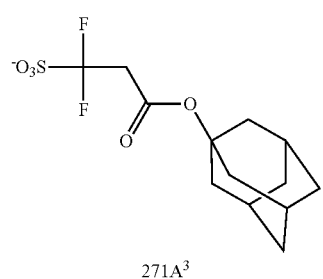
271A³
PAG-Anion8
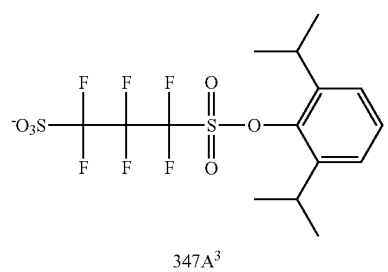
347A³
PAG-Anion9
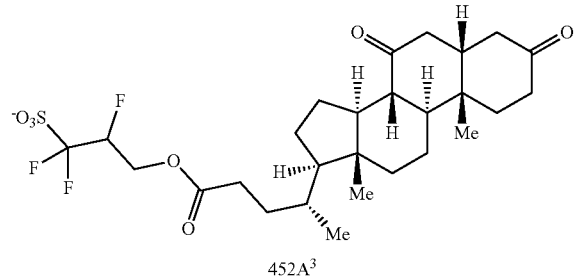
452A³
PAG-Anion10
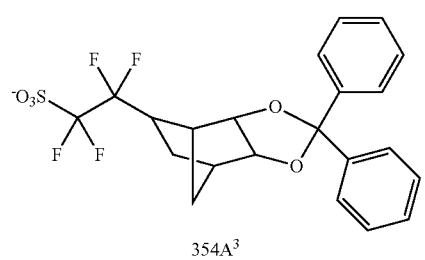
354A³
PAG-Anion11
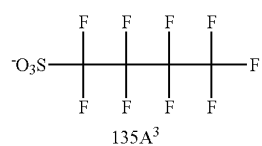
135A³
-continued
PAG-Anion12
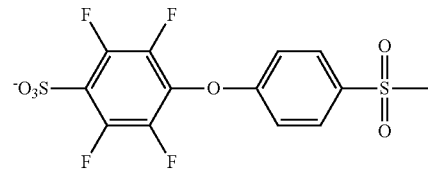
257A³
PAG-Anion13
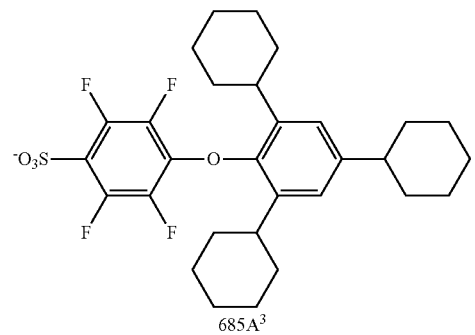
685A³
PAG-Anion14
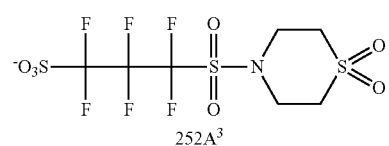
252A³
PAG-Anion15
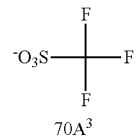
70A³
PAG-Anion16
244A³
The volume marked with * is a volume of an acid generated.
<Acid Diffusion Control Agent>
Quencher1
Quencher2
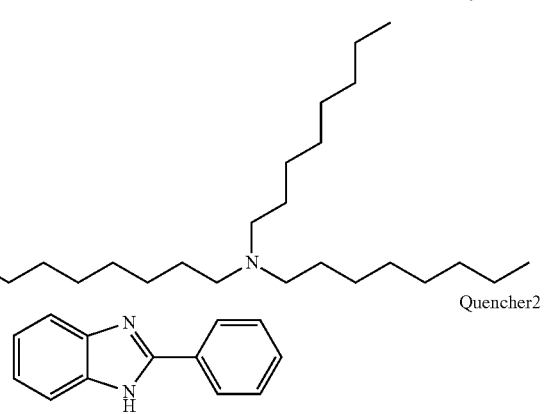

Quencher3

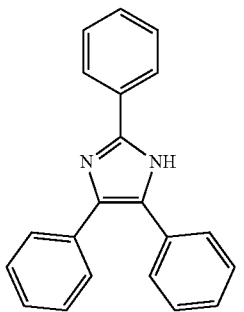

Quencher4

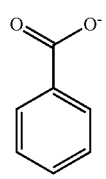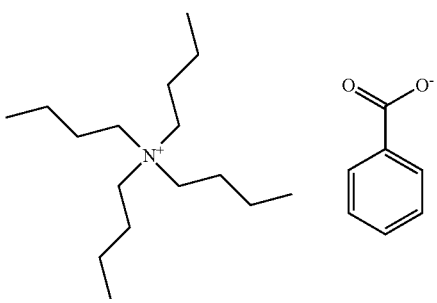

Quencher5

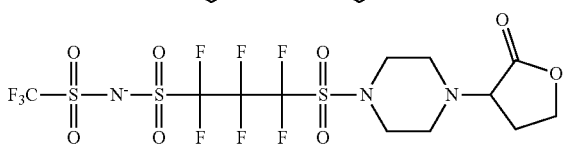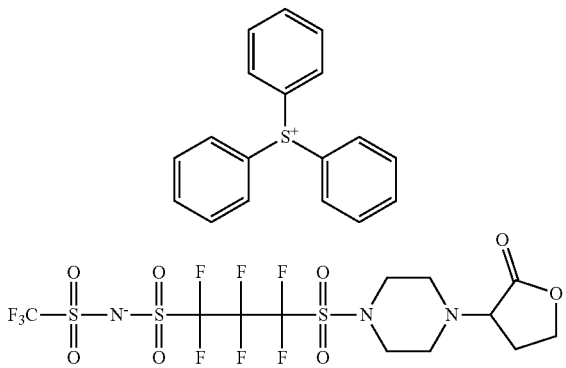

Quencher6

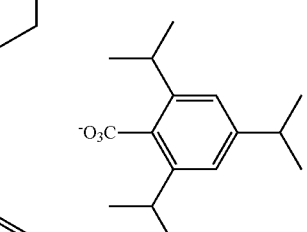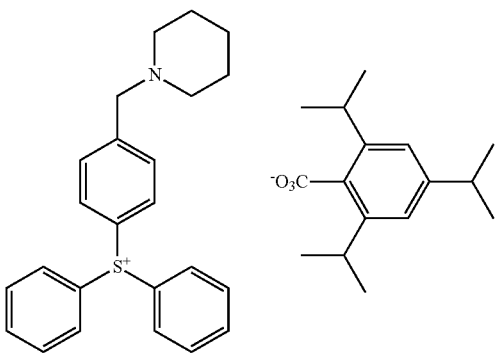

Quencher7

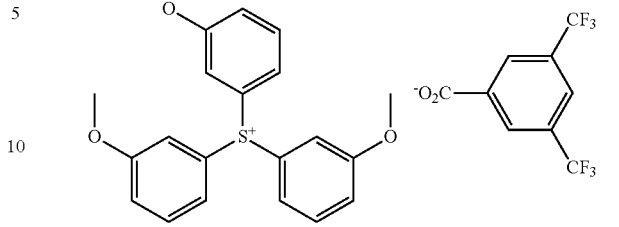

Quencher8

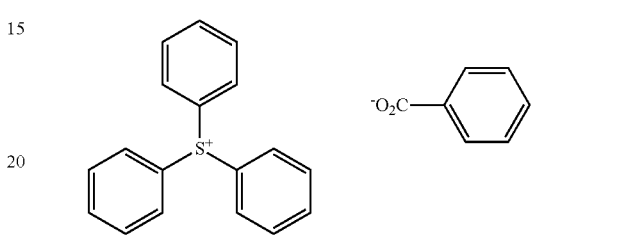

<Hydrophobic Resin>

In addition, the numerical values in the following formulae represent % by mole of the respective repeating units.

ADP-1

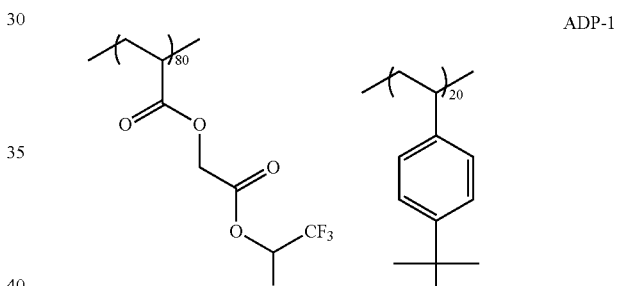

Mw = 14,000
Mw/Mn = 1.7

<Surfactant>

W-1: MEGAFACE F176 (manufactured by DIC Corporation; fluorine-based) W-2: MEGAFACE R08 (manufactured by DIC Corporation; fluorine- and silicon-based)

<Solvent>

SL-1: Propylene glycol monomethyl ether acetate (PGMEA)

SL-2: Propylene glycol monomethyl ether (PGME)

SL-3: Ethyl lactate

SL-4: γ-Butyrolactone

SL-5: Cyclohexanone

<Developer and Rinsing Liquid>

D-1: 3.00%-by-mass aqueous tetramethylammonium hydroxide solution

D-2: 2.38%-by-mass aqueous tetramethylammonium hydroxide solution

D-3: 1.50%-by-mass aqueous tetramethylammonium hydroxide solution

D-4: 1.00%-by-mass aqueous tetramethylammonium hydroxide solution

D-5: 0.80%-by-mass aqueous tetramethylammonium hydroxide solution

D-6: Pure water
D-7: FIRM Extreme 10 (manufactured by AZEM)
<Underlayer Film>
UL-1: AL412 (manufactured by Brewer Science Ltd.)
UL-2: SHB-A940 (manufactured by Shin-Etsu Chemical Co., Ltd.)

<Preparation of Composition>

Materials were mixed at the concentration of solid contents and the composition shown in Table 2 to prepare a resist material, and the resist material was filtered through a polyethylene filter having a pore size of 0.03 μm to prepare each of the compositions.

The content (% by mass) of each component described in the following "Polymer" section, "Photoacid generator" section, "Acid diffusion control agent" section, "Polymer added" section, and "Surfactant" section represent a ratio of each component with respect to the total solid content.

[Table 2-1]

TABLE 2

| Resist composition | Concentration of solid contents (% by mass) | Polymer Type | Polymer Content (% by mass) | Photoacid generator Cationic moiety | Photoacid generator Anionic moiety | Photoacid generator Content (% by mass) | Photoacid generator Cationic moiety | Photoacid generator Anionic moiety | Photoacid generator Content (% by mass) | Acid diffusion control agent Type | Acid diffusion control agent Content (% by mass) | Additive polymer (Content: % by mass) | Surfactant (Content: % by mass) | Solvent |
|---|---|---|---|---|---|---|---|---|---|---|---|---|---|---|
| R-1 | 2.9 | P-1 | 74.0 | PAG-Cation 1 | PAG-Anion 3 | 15.0 | PAG-Cation 1 | PAG-Anion 12 | 10.0 | Quencher 2 | 1.0 | — | — | SL-1/SL-2/SL-3 = 30/20/50 |
| R-2 | 3.4 | P-2 | 79.2 | PAG-Cation 8 | PAG-Anion 7 | 20.0 | | | | Quencher 3 | 0.8 | — | — | SL-1/SL-3 = 60/40 |
| R-3 | 2.6 | P-3 | 83.8 | PAG-Cation 1 | PAG-Anion 12 | 15.0 | | | | Quencher 1 | 1.2 | — | — | SL-1/SL-2 = 60/40 |
| R-4 | 2.7 | P-4 | 71.9 | PAG-Cation 3 | PAG-Anion 14 | 26.0 | | | | Quencher 4 | 2.1 | — | — | SL-1/SL-2 = 90/10 |
| R-5 | 3.4 | P-5 | 80.0 | PAG-Cation 5 | PAG-Anion 12 | 8.0 | | | | Quencher 5 | 4.0 | — | — | SL-1 = 100 |
| R-6 | 2.9 | P-6 | 74.7 | PAG-Cation 5 | PAG-Anion 8 | 20.0 | PAG-Cation 3 | PAG-Anion 6 | 8.0 | Quencher 6 | 5.0 | — | W-1(0.3) | SL-3 = 100 |
| R-7 | 2.7 | P-7 | 80.7 | PAG-Cation 7 | PAG-Anion 13 | 13.0 | PAG-Cation 7 | PAG-Anion 7 | 3.0 | Quencher 5 | 1.3 | ADP-1 (2.0) | — | SL-1 = 100 |
| R-8 | 2.9 | P-8 | 69.5 | PAG-Cation 1 | PAG-Anion 3 | 12.0 | PAG-Cation 5 | PAG-Anion 12 | 9.0 | Quencher 3 | 9.0 | — | W-2(0.5) | SL-1/SL-3 = 80/20 |
| R-9 | 3.4 | P-9 | 84.3 | PAG-Cation 5 | PAG-Anion 13 | 14.0 | | | | Quencher 5 | 1.7 | — | — | SL-1/SL-3 = 80/20 |
| R-10 | 2.7 | P-10 | 86.6 | PAG-Cation 4 | PAG-Anion 12 | 12.0 | | | | Quencher 3 | 1.4 | — | — | SL-1/SL-3 = 90/10 |
| R-11 | 2.9 | P-11 | 77.6 | PAG-Cation 6 | PAG-Anion 13 | 20.0 | | | | Quencher 4 | 2.4 | — | — | SL-1/SL-2/SL-3 = 30/20/50 |
| R-12 | 3.4 | P-12 | 80.0 | PAG-Cation 7 | PAG-Anion 12 | 14.0 | | | | Quencher 6 | 6.0 | — | — | SL-1/SL-2/SL-3 = 60/20/20 |
| R-13 | 3.4 | P-13 | 72.0 | PAG-Cation 6 | PAG-Anion 3 | 20.0 | | | | Quencher 6 | 8.0 | — | — | SL-1/SL-2 = 70/30 |
| R-14 | 2.9 | P-14 | 75.3 | PAG-Cation 5 | PAG-Anion 12 | 20.0 | | | | Quencher 4 | 3.2 | — | — | SL-1/SL-2 = 90/10 |
| R-15 | 3.7 | P-15 | 76.0 | PAG-Cation 5 | PAG-Anion 13 | 18.0 | | | | Quencher 5 | 6.0 | — | — | SL-1/SL-2 = 80/20 |
| R-16 | 3.8 | P-16 | 82.6 | PAG-Cation 5 | PAG-Anion 10 | 15.0 | | | | Quencher 3 | 2.4 | — | — | SL-3/SL-4 = 95/5 |
| R-17 | 2.7 | P-17 | 80.0 | PAG-Cation 7 | PAG-Anion 14 | 12.0 | | | | Quencher 5 | 8.0 | — | — | SL-1/SL-4 = 90/10 |
| R-18 | 2.9 | P-18 | 78.9 | PAG-Cation 5 | PAG-Anion 3 | 17.0 | | | | Quencher 4 | 4.1 | — | — | SL-1/SL-2 = 70/30 |
| R-19 | 3.2 | P-19 | 76.5 | PAG-Cation 1 | PAG-Anion 14 | 15.0 | PAG-Cation 1 | PAG-Anion 1 | 6.0 | Quencher 5 | 2.5 | — | — | SL-1/SL-3 = 80/20 |
| R-20 | 1.4 | P-20 | 76.2 | PAG-Cation 2 | PAG-Anion 13 | 22.0 | | | | Quencher 3 | 1.8 | — | — | SL-1 = 100 |
| R-21 | 1.5 | P-21 | 78.4 | PAG-Cation 2 | PAG-Anion 8 | 20.0 | | | | Quencher 1 | 1.6 | — | — | SL-1/SL-3/SL-4 = 30/90/10 |
| R-22 | 1.5 | P-22 | 83.8 | PAG-Cation 3 | PAG-Anion 16 | 15.0 | | | | Quencher 4 | 1.2 | — | — | SL-1/SL-3/SL-5 = 30/40/30 |
| R-23 | 4.9 | P-23 | 75.0 | PAG-Cation 4 | PAG-Anion 7 | 5.0 | PAG-Cation 4 | PAG-Anion 5 | 10.0 | Quencher 5 | 10.0 | — | — | SL-1/SL-2 = 90/10 |
| R-24 | 4.5 | P-24 | 73.0 | PAG-Cation 5 | PAG-Anion 13 | 25.0 | | | | Quencher 4 | 2.0 | — | — | SL-1/SL-2 = 90/10 |
| R-25 | 1.4 | P-25 | 72.4 | PAG-Cation 4 | PAG-Anion 7 | 20.0 | | | | Quencher 3/Quencher 6 | 1.6/6.0 | — | — | SL-1/SL-2 = 90/10 |
| R-26 | 2.5 | P-26 | 78.4 | PAG-Cation 3 | PAG-Anion 15 | 20.0 | | | | Quencher 4 | 1.6 | — | — | SL-1/SL-2/SL-3 = 30/20/50 |
| R-27 | 2.1 | P-27 | 88.2 | PAG-Cation 7 | PAG-Anion 4 | 11.0 | | | | Quencher 3 | 0.8 | — | — | SL-1/SL-3 = 60/40 |
| R-28 | 1.5 | P-28 | 78.4 | PAG-Cation 5 | PAG-Anion 9 | 20.0 | | | | Quencher 4 | 1.6 | — | — | SL-1/SL-2 = 60/40 |
| R-29 | 1.5 | P-29 | 92.0 | PAG-Cation 7 | PAG-Anion 13 | 6.0 | | | | Quencher 5 | 2.0 | — | — | SL-1/SL-2 = 90/10 |
| R-30 | 2.1 | P-30 | 89.2 | PAG-Cation 8 | PAG-Anion 14 | 10.0 | | | | Quencher 3 | 0.8 | — | — | SL-1/SL-2/SL-3 = 30/20/50 |
| R-31 | 1.8 | P-31 | 62.2 | PAG-Cation 4 | PAG-Anion 3 | 20.0 | PAG-Cation 5 | PAG-Anion 12 | 15.0 | Quencher 4 | 2.8 | — | — | SL-1/SL-3 = 60/40 |
| R-32 | 2.4 | P-32 | 56.8 | PAG-Cation 6 | PAG-Anion 8 | 40.0 | | | | Quencher 4 | 3.2 | — | — | SL-1/SL-2 = 60/40 |
| R-33 | 2.9 | P-33 | 93.5 | PAG-Cation 2 | PAG-Anion 8 | 6.0 | | | | Quencher 3 | 0.5 | — | — | SL-1 = 100 |
| R-34 | 3.4 | P-34 | 89.2 | PAG-Cation 4 | PAG-Anion 4 | 10.0 | | | | Quencher 4 | 0.8 | — | — | SL-3 = 100 |
| R-35 | 3.2 | P-35 | 79.8 | PAG-Cation 1 | PAG-Anion 11 | 18.0 | | | | Quencher 3 | 2.2 | — | — | SL-1 = 100 |

TABLE 2-continued

| Resist composition | Concentration of solid contents (% by mass) | Polymer Type | Polymer Content (% by mass) | Photoacid generator Cationic moiety | Photoacid generator Anionic moiety | Photoacid generator Content (% by mass) | Photoacid generator Cationic moiety | Photoacid generator Anionic moiety | Photoacid generator Content (% by mass) | Acid diffusion control agent Type | Acid diffusion control agent Content (% by mass) | Additive polymer (Content: % by mass) | Surfactant (Content: % by mass) | Solvent |
|---|---|---|---|---|---|---|---|---|---|---|---|---|---|---|
| R-36 | 3.4 | P-36 | 54.9 | PAG-Cation 2 | PAG-Anion 3 | 40.0 | | | | Quencher 4 | 4.8 | — | W-1 (0.3% by weight) | SL-3/SL-5 = 90/10 |
| R-37 | 3.5 | P-37 | 95.6 | PAG-Cation 6 | PAG-Anion 13 | 4.0 | | | | Quencher 3 | 0.4 | — | — | SL-3/SL-5 = 80/20 |
| R-38 | 5.6 | P-38 | 79.8 | PAG-Cation 5 | PAG-Anion 14 | 18.0 | | | | Quencher 4 | 2.2 | — | — | SL-1 = 100 |
| R-39 | 6.5 | P-39 | 77.6 | PAG-Cation 4 | PAG-Anion 8 | 20.0 | | | | Quencher 4 | 2.4 | — | — | SL-1 = 100 |
| R-40 | 3.4 | P-40 | 74.0 | PAG-Cation 5 | PAG-Anion 13 | 15.0 | PAG-Cation 5 | PAG-Anion 12 | 10.0 | Quencher 2 | 1.0 | — | — | SL-1/SL-2/SL-3 = 30/20/50 |
| R-41 | 2.9 | P-41 | 74.0 | PAG-Cation 1 | PAG-Anion 3 | 15.0 | PAG-Cation 1 | PAG-Anion 12 | 10.0 | Quencher 2 | 1.0 | — | — | SL-1/SL-2/SL-3 = 30/20/50 |
| R-42 | 2.7 | P-42 | 74.0 | PAG-Cation 1 | PAG-Anion 3 | 15.0 | PAG-Cation 1 | PAG-Anion 12 | 10.0 | Quencher 2 | 1.0 | — | — | SL-1/SL-2/SL-3 = 30/20/50 |
| R-43 | 2.9 | P-43 | 74.0 | PAG-Cation 5 | PAG-Anion 3 | 15.0 | PAG-Cation 5 | PAG-Anion 12 | 10.0 | Quencher 2 | 1.0 | — | — | SL-1/SL-2/SL-3 = 30/20/50 |
| R-44 | 2.9 | P-44 | 74.0 | PAG-Cation 1 | PAG-Anion 3 | 15.0 | PAG-Cation 1 | PAG-Anion 12 | 10.0 | Quencher 2 | 1.0 | — | — | SL-1/SL-2/SL-3 = 30/20/50 |
| R-45 | 2.9 | P-45 | 74.0 | PAG-Cation 1 | PAG-Anion 3 | 15.0 | PAG-Cation 1 | PAG-Anion 12 | 10.0 | Quencher 2 | 1.0 | — | — | SL-1/SL-2/SL-3 = 30/20/50 |
| R-46 | 2.9 | P-46 | 74.0 | PAG-Cation 1 | PAG-Anion 3 | 15.0 | PAG-Cation 1 | PAG-Anion 12 | 10.0 | Quencher 2 | 1.0 | — | — | SL-1/SL-2/SL-3 = 30/20/50 |
| R-47 | 1.6 | P-47 | 83.8 | PAG-Cation 3 | PAG-Anion 16 | 15.0 | | | | Quencher 4 | 1.2 | — | — | SL-1/SL-3/SL-5 = 30/40/30 |
| R-48 | 4.0 | P-48 | 82.6 | PAG-Cation 5 | PAG-Anion 10 | 15.0 | | | | Quencher 3 | 2.4 | — | — | SL-3/SL-4 = 95/5 |
| R-49 | 4.0 | P-49 | 82.6 | PAG-Cation 5 | PAG-Anion 10 | 15.0 | | | | Quencher 3 | 2.4 | — | — | SL-3/SL-4 = 95/5 |
| R-50 | 2.9 | P-50 | 69.5 | PAG-Cation 1 | PAG-Anion 3 | 12.0 | PAG-Cation 5 | PAG-Anion 12 | 9.0 | Quencher 5 | 9.0 | — | W-2 (0.5) | SL-1/SL-3 = 80/20 |
| R-51 | 2.9 | P-51 | 69.5 | PAG-Cation 1 | PAG-Anion 3 | 12.0 | PAG-Cation 5 | PAG-Anion 12 | 9.0 | Quencher 5 | 9.0 | — | W-2 (0.5) | SL-1/SL-3 = 80/20 |
| R-52 | 2.9 | P-52 | 69.5 | PAG-Cation 1 | PAG-Anion 3 | 12.0 | PAG-Cation 5 | PAG-Anion 12 | 9.0 | Quencher 5 | 9.0 | — | W-2 (0.5) | SL-1/SL-3 = 80/20 |
| R-53 | 2.9 | P-53 | 81.0 | PAG-Cation 2 | PAG-Anion 14 | 15.0 | | | | Quencher 4 | 4.0 | — | — | SL-1/SL-3 = 80/20 |
| R-54 | 3.4 | P-54 | 80.0 | PAG-Cation 1 | PAG-Anion 3 | 5.0 | PAG-Cation 1 | PAG-Anion 11 | 8.0 | Quencher 7 | 7.0 | — | — | SL-1/SL-3 = 80/20 |
| R-55 | 3.2 | P-55 | 81.0 | PAG-Cation 1 | PAG-Anion 3 | 8.0 | PAG-Cation 1 | PAG-Anion 10 | 8.0 | Quencher 4 | 3.0 | — | — | SL-1/SL-3 = 90/10 |
| R-56 | 1.8 | P-56 | 88.1 | PAG-Cation 1 | PAG-Anion 7 | 10.0 | | | | Quencher 2 | 1.9 | — | — | SL-1/SL-2/SL-3 = 30/20/50 |
| R-57 | 3.4 | P-57 | 86.4 | PAG-Cation 2 | PAG-Anion 13 | 11.0 | | | | Quencher 4 | 2.1 | — | W-2 (0.5) | SL-1/SL-2/SL-3 = 60/20/20 |
| R-58 | 3.3 | P-58 | 77.0 | PAG-Cation 1 | PAG-Anion 3 | 11.0 | PAG-Cation 1 | PAG-Anion 7 | 6.0 | Quencher 7 | 6.0 | — | — | SL-1/SL-2 = 70/30 |
| R-59 | 2.9 | P-59 | 78.5 | PAG-Cation 1 | PAG-Anion 3 | 12.0 | PAG-Cation 1 | PAG-Anion 7 | 5.0 | Quencher 8 | 3.0 | — | — | SL-1/SL-2 = 90/10 |
| R-60 | 2.7 | P-60 | 78.0 | PAG-Cation 1 | PAG-Anion 14 | 18.0 | | | | Quencher 4 | 4.0 | — | — | SL-1/SL-2 = 80/20 |
| R-61 | 4.0 | P-61 | 81.5 | PAG-Cation 1 | PAG-Anion 3 | 6.0 | PAG-Cation 1 | PAG-Anion 7 | 7.0 | Quencher 7 | 5.0 | — | W-2 (0.5) | SL-3/SL-4 = 95/5 |
| R-62 | 3.2 | P-62 | 86.0 | PAG-Cation 2 | PAG-Anion 5 | 8.0 | PAG-Cation 2 | PAG-Anion 10 | 5.0 | Quencher 4 | 1.0 | — | — | SL-1/SL-4 = 90/10 |
| R-63 | 2.3 | P-63 | 92.6 | PAG-Cation 1 | PAG-Anion 13 | 6.0 | | | | Quencher 4 | 1.4 | — | — | SL-1/SL-2 = 70/30 |
| R-64 | 2.1 | P-64 | 73.0 | PAG-Cation 1 | PAG-Anion 3 | 5.0 | PAG-Cation 1 | PAG-Anion 6 | 20.0 | Quencher 4 | 2.0 | — | — | SL-1/SL-2 = 80/20 |
| R-65 | 3.2 | P-65 | 83.0 | PAG-Cation 1 | PAG-Anion 5 | 5.0 | PAG-Cation 1 | PAG-Anion 10 | 8.0 | Quencher 8 | 4.0 | — | — | SL-1 = 100 |
| R-66 | 3.4 | P-66 | 73.0 | PAG-Cation 1 | PAG-Anion 10 | 23.0 | | | | Quencher 4 | 4.0 | — | — | SL-1/SL-3/SL-4 = 30/90/10 |

TABLE 2-continued

| Resist composition | Concentration of solid contents (% by mass) | Polymer Type | Polymer Content (% by mass) | Photoacid generator Cationic moiety | Photoacid generator Anionic moiety | Photoacid generator Content (% by mass) | Acid diffusion control agent Type | Acid diffusion control agent Content (% by mass) | Additive polymer (Content: % by mass) | Surfactant (Content: % by mass) | Solvent |
|---|---|---|---|---|---|---|---|---|---|---|---|
| R-67 | 1.4 | P-67 | 87.0 | PAG-Cation 1 | PAG-Anion 13 | 10.0 | Quencher 1 | 3.0 | — | — | SL-1/SL-3/SL-5 = 30/40/30 |
| R-68 | 2.4 | P-68 | 76.0 | PAG-Cation 2 | PAG-Anion 3 | 8.0 | Quencher 7 | 8.0 | — | — | SL-1/SL-3 = 80/20 |
| R-69 | 3.2 | P-69 | 80.0 | PAG-Cation 1 | PAG-Anion 10 | 17.0 | Quencher 1 | 3.0 | — | — | SL-1/SL-2 = 70/30 |
| R-70 | 2.4 | P-70 | 76.0 | PAG-Cation 2 | PAG-Anion 3 | 8.0 | Quencher 7 | 8.0 | — | — | SL-1/SL-3 = 80/20 |

[Table 2-2]

<EUV Exposure Examples>

The composition described in Table 3 was applied onto a silicon wafer (12 inches) having the underlayer film described in Table 3 formed thereon, and the coating film was heated under the baking condition described in (Condition for application of resist) to form a resist film having the film thickness described in Table 3, thereby obtaining a silicon wafer having a resist film.

The silicon wafer having the obtained resist film was subjected to pattern irradiation using an EUV exposure device (manufactured by Exitech Ltd., Micro Exposure Tool, NA 0.3, Quadrupole, an outer sigma of 0.68, and an inner sigma of 0.36). Further, a mask with a space size=20 nm and a line:space=5:1 was used as a reticle.

Thereafter, the silicon wafer was post-exposure baked (PEB) under the condition shown in Table 3 below, then puddle-developed for 30 seconds using a developer shown in Table 3 below, and puddle-rinsed with a rinsing liquid shown in Table 3 below, and then the silicon wafer was rotated at a rotation speed of 4,000 rpm for 30 seconds and baked at 90° C. for 60 seconds to obtain a line-and-space pattern with a pitch of 100 nm and a space width of 18 nm (line width of 82 nm). The results are summarized in Table 3.

<Evaluation>

With regard to the formed resist pattern, evaluations shown below were performed.

[A Value]

With regard to an atom of the component derived from the total solid content, included in the composition, an A value which is an EUV light absorption parameter determined by General Formula (1) was calculated.

$$A=([H]\times 0.04+[C]\times 1.0+[N]\times 2.1+[O]\times 3.6+[F]\times 5.6+[S]\times 1.5+[I]\times 39.5)/([H]\times 1+[C]\times 12+[N]\times 14+[O]\times 16+[F]\times 19+[S]\times 32+[I]\times 127)$$ Formula (1)

[H], [C], [N], [O], [F], [S], and [I] were computed from the structures and the contents of the components included in the resist composition.

[B Value (ALUMO)]

The B value (ALUMO) determined by General Formula (2) was calculated.

$$B\ value=LUMO(Polymer)-LUMO(PAG\_Cation)$$ Formula (2)

The LUMO (Polymer) represents an energy value of a lowest unoccupied molecular orbital level of a monomer of a repeating unit which is derived from the monomer having a lowest energy value of the lowest unoccupied molecular orbital level, the repeating unit being one of repeating units included in an amount of 5% by mass or more with respect to all the repeating units of the polymer.

The LUMO (PAG_Cation) represents an energy value of the lowest unoccupied molecular orbital level of a cationic moiety of the photoacid generator which is contained in the largest amount in the composition in term of a mass.

The LUMO values of the respective compounds were computed by Gaussian 09 which is currently widely used quantum chemistry computation program, (Gaussian 09, Revision A. 02, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2009). A density functional theory method was used as the calculation method and B3LYP was used as the functional theory. In a basis function thereof, 6-31+G (d, p) was used for an atom other than iodine and aug-cc-PVDZ-PP was used for the iodine atom. The aug-cc-PVDZ-PP was available from a database "Basis Set Exchange (https://bse.pn1.gov/bse/portal)" disclosed in WEB.

Furthermore, a structure optimization computation was performed by the present method to compute a LUMO value for a structure in which production energy was minimized. In a case where the LUMO value of the cationic moiety of the photoacid generator was computed, an anion derived from trifluoromethanesulfonic acid was used as a counter anion.

In addition, the LUMO value was a value in consideration of a permittivity as described above, and the parameter of a benzene (relative permittivity=2.2706) was used.

[Content of Acid Group]

With regard to an acid group having an acid dissociation constant (pKa) of 13 or less, a density (mmol/g) included per gram of a polymer was computed. In a case where a plurality of the corresponding acid groups were present, a summed density was computed. For the computation of pKa, Marvinsketch (ChemAxon) was used.

[Acid Diffusion Length (D)]

The compositions used for the present evaluation were prepared as follows.

With regard to the compositions of (R-1) to (R-67) shown in Table 2, the acid diffusion control agent was excluded, and the compositions having a concentration of solid contents of 10.0% by mass were prepared as ($R^1$-1) to (R'-67), respectively. In addition, with regard to the compositions of ($R^1$-1) to (R'-67), compositions from which the photoacid generator was further excluded were prepared as ($R^2$-1) to ($R^2$-67), respectively.

Each of the compositions ($R^1$-1) to (R'-67) was applied onto a silicon wafer and heated at a temperature under the baking condition of the corresponding composition shown in Table 3 for 60 seconds to form a resist film having a film thickness of about 300 nm. The resist film was exposed with PAS5500/850 (manufactured by ASML) and then the obtained film was scraped off from the silicon wafer with a razor to obtain a powder. This powder was molded into a pellet by press molding.

Next, the compositions ($R^2$-1) to ($R^2$-67) were applied onto a silicon wafer and heated at a temperature under the baking condition of the corresponding composition shown in Table 3 for 60 seconds to form a resin film having a film thickness of about 300 nm. Next, the pellet corresponding to the composition of the resin film was placed on a part of each resin film and heated under the PEB condition of the corresponding composition shown in Table 3.

The resin film after heating was developed with a 0.26 N aqueous tetramethylammonium hydroxide (TMAH) solution at 23° C.

For the thickness of the resin film after the developing treatment, each of the thickness of a part having the pellet placed thereon and the thickness of a part having the pellet not placed thereon were measured using DNS Lambda Ace (λ=633 nm), and a difference ΔL thereof was determined. An acid diffusion coefficient (D) was calculated using the following formula described in Journal Photopolymer Science Technology, Vol. 17, No. 3, 2004 p.p. 379-384.

$$\Delta L = 2(D \cdot t_{PEB})^{1/2} \mathrm{erfc}^{-1}(E_{crit}/E)$$

[Tg]

The glass transition temperature (Tg) of the polymer used was calculated by the above-mentioned method.

[Sensitivity]

While changing the exposure dose, the space width of the line-and-space pattern was measured, and the exposure dose as the space width reached 18 nm was determined and taken as a sensitivity (mJ/cm$^2$). A smaller value thereof indicates a resist having a higher sensitivity and better performance.

[LER]

In a case where a pattern was observed from the upper part of the pattern using a critical dimension scanning electron microscope SEM (CG-4100 manufactured by Hitachi High Technologies Corporation) in the observation of a line-and-space resist pattern resolved at an optimal exposure dose in the sensitivity evaluation, a distance from a center of the pattern of the space portion to the edge was observed at any points and a measurement deviation thereof was evaluated as 3σ. A smaller value thereof indicates better performance.

[Z-Factor]

A Z-factor represented by the following formula was determined using the sensitivity and the LER as determined above.

$$Z\text{-Factor} = (\text{Resolving power})^3 \times (\text{LER})^2 \times (\text{Sensitivity})$$

Here, the resolving power was set to 18 nm. A smaller value of the Z-factor indicates excellent total performance of a resist, such as a resolving power, a LER, and a sensitivity, and in a case where the value is smaller than 1.8E-08 (mJ×nm$^3$), the performance is good, in a case where the value is smaller than 1.5E-08 (mJ×nm$^3$), the performance is better, and in a case where the value is smaller than 1.2E-08 (mJ×nm$^3$), the performance is particularly good.

[Bridge Defect Performance]

With regard to the line-and-space resist pattern resolved at an optimum exposure dose in the sensitivity evaluation, a 10-μm square was observed with a critical dimension scanning electron microscope, and the number of bridge defects in which the resist remained in the space part was measured to form a bridged pattern defect. A smaller value thereof indicates that less bridge defects occur and the performance is better.

TABLE 3

| | Resist application condition | | | | PEB · Developing condition | | | Resist characteristic value | | | | | | | Evaluation results | | | |
|---|---|---|---|---|---|---|---|---|---|---|---|---|---|---|---|---|---|---|
| | Composition | Base | Film thickness (nm) | Baking | PEB | Developer | Rinsing liquid | Concentration of solid contents (% by mass) | A value | ΔLUMO | Acid value (mmol/g) | Acid diffusion length | Size of acid generated (Å³) | Amount of photoacid generator (Content: % by mass) | Tg (°C.) | Sensi- tivity (mJ/cm²) | LER (nm) | Z-factor (mJ*nm³) | Bridge defects (number of bridge defects) |
| Example 1 | R-1 | UL-1 | 65 | 100° C./60 seconds | 120° C./60 seconds | D-2 | D-6 | 2.9 | 0.15 | 1.19 | 2.00 | 6 | 437/257 | 25.0 | 102 | 10.8 | 4.3 | 1.16E-08 | 182 |
| Example 2 | R-2 | UL-1 | 75 | 120° C./60 seconds | 90° C./60 seconds | D-2 | D-6 | 3.4 | 0.18 | 0.61 | 1.62 | 8 | 271 | 20.0 | 105 | 10.3 | 4.1 | 1.01E-08 | 62 |
| Example 3 | R-3 | UL-1 | 55 | 100° C./60 seconds | 90° C./60 seconds | D-2 | D-7 | 2.6 | 0.14 | 1.18 | 3.24 | 12 | 257 | 15.0 | 108 | 20.9 | 3.2 | 1.25E-08 | 320 |
| Example 4 | R-4 | UL-1 | 60 | 90° C./60 seconds | 105° C./30 seconds | D-4 | D-6 | 2.7 | 0.17 | 1.36 | 2.67 | 9 | 252 | 26.0 | 99 | 22.0 | 2.8 | 1.01E-08 | 55 |
| Example 5 | R-5 | UL-2 | 75 | 100° C./60 seconds | 100° C./50 seconds | D-1 | D-6 | 3.4 | 0.17 | 0.62 | 1.90 | 15 | 257/270 | 16.0 | 126 | 23.1 | 2.9 | 1.13E-08 | 51 |
| Example 6 | R-6 | UL-2 | 65 | 100° C./45 seconds | 120° C./60 seconds | D-2 | D-6 | 2.9 | 0.20 | 0.94 | 0.94 | 10 | 347 | 20.0 | 92 | 22.0 | 2.4 | 7.39E-09 | 7 |
| Example 7 | R-7 | UL-1 | 60 | 120° C./60 seconds | 120° C./60 seconds | D-2 | D-6 | 2.7 | 0.22 | 0.42 | 0.94 | 11 | 585/270 | 16.0 | 107 | 22.0 | 2.4 | 7.39E-09 | 6 |
| Example 8 | R-8 | UL-1 | 65 | 100° C./60 seconds | 110° C./60 seconds | D-2 | D-7 | 2.9 | 0.14 | 1.18 | 3.31 | 7 | 437/257 | 21.0 | 124 | 36.3 | 2.5 | 1.32E-08 | 360 |
| Example 9 | R-9 | UL-1 | 75 | 90° C./60 seconds | 100° C./60 seconds | D-2 | D-6 | 3.4 | 0.16 | 1.30 | 1.62 | 6 | 585 | 14.0 | 101 | 37.4 | 2.3 | 1.15E-08 | 147 |
| Example 10 | R-10 | UL-1 | 60 | 100° C./60 seconds | 120° C./45 seconds | D-3 | D-7 | 2.7 | 0.18 | 0.49 | 2.02 | 5 | 437 | 12.0 | 114 | 37.0 | 2.2 | 1.04E-08 | 30 |
| Example 11 | R-11 | UL-1 | 65 | 100° C./60 seconds | 100° C./60 seconds | D-2 | D-7 | 2.9 | 0.20 | 0.69 | 1.00 | 13 | 585 | 20.0 | 99 | 38.5 | 2.1 | 9.90E-09 | 8 |
| Example 12 | R-12 | UL-2 | 75 | 120° C./60 seconds | 100° C./60 seconds | D-2 | D-6 | 3.4 | 0.21 | 0.42 | 1.37 | 14 | 257 | 14.0 | 118 | 37.0 | 1.8 | 6.98E-09 | 6 |
| Example 13 | R-13 | UL-2 | 75 | 100° C./50 seconds | 120° C./60 seconds | D-5 | D-6 | 3.4 | 0.14 | 1.65 | 3.03 | 10 | 437 | 20.0 | 124 | 39.6 | 2.4 | 1.33E-08 | 522 |
| Example 14 | R-14 | UL-1 | 60 | 90° C./60 seconds | 90° C./60 seconds | D-2 | D-6 | 2.9 | 0.17 | 1.86 | 1.04 | 11 | 257 | 20.0 | 98 | 46.2 | 2.1 | 1.19E-08 | 144 |
| Example 15 | R-15 | UL-1 | 80 | 100° C./60 seconds | 105° C./60 seconds | D-2 | D-6 | 3.7 | 0.17 | 0.98 | 1.00 | 7 | 585 | 18.0 | 101 | 45.8 | 1.9 | 9.63E-09 | 99 |
| Example 16 | R-16 | UL-1 | 80 | 100° C./60 seconds | 100° C./60 seconds | D-2 | D-6 | 3.8 | 0.20 | 1.51 | 0.92 | 6 | 354 | 15.0 | 82 | 47.3 | 1.8 | 8.94E-09 | 9 |
| Example 17 | R-17 | UL-1 | 60 | 120° C./60 seconds | 90° C./60 seconds | D-3 | D-6 | 2.7 | 0.22 | 0.42 | 1.00 | 10 | 252 | 12.0 | 118 | 45.7 | 1.8 | 8.63E-09 | 10 |
| Example 18 | R-18 | UL-2 | 65 | 100° C./60 seconds | 110° C./60 seconds | D-2 | D-6 | 2.9 | 0.17 | 1.94 | 3.07 | 11 | 437 | 17.0 | 103 | 66.0 | 1.7 | 1.11E-08 | 123 |
| Example 19 | R-19 | UL-1 | 70 | 90° C./60 seconds | 105° C./60 seconds | D-2 | D-7 | 3.2 | 0.17 | 0.48 | 2.02 | 9 | 252/138 | 21.0 | 117 | 71.5 | 1.6 | 1.07E-08 | 145 |
| Example 20 | R-20 | UL-1 | 30 | 100° C./60 seconds | 100° C./60 seconds | D-2 | D-6 | 1.4 | 0.16 | 0.13 | 2.47 | 4 | 585 | 22.0 | 102 | 22.0 | 3.6 | 1.66E-08 | 169 |

TABLE 3-continued

| | | Resist application condition | | | PEB · Developing condition | | | Resist characteristic value | | | | | | | Evaluation results | | | |
|---|---|---|---|---|---|---|---|---|---|---|---|---|---|---|---|---|---|---|
| | Composition | Base | Film thickness (nm) | Baking | PEB | Developer | Rinsing liquid | Concentration of solid contents (% by mass) | A value | ΔLUMO | Acid value (mmol/g) | Acid diffusion length | Size of acid generated (Å³) | Amount of photoacid generator (Content: % by mass) | Tg (°C) | Sensitivity (mJ/cm²) | LER (nm) | Z-factor (mJ*nm³) | Bridge defects (number of bridge defects) |
| Example 21 | R-21 | UL-1 | 30 | 100° C./60 seconds | 90° C./60 seconds | D-2 | D-7 | 1.5 | 0.18 | 0.06 | 1.21 | 5 | 347 | 20.0 | 97 | 20.9 | 3.4 | 1.41E-08 | 44 |
| Example 22 | R-22 | UL-2 | 30 | 120° C./30 seconds | 105° C./30 seconds | D-2 | D-6 | 1.5 | 0.20 | 0.29 | 0.76 | 19 | 244 | 15.0 | 86 | 22.0 | 3.3 | 1.40E-08 | 22 |
| Example 23 | R-23 | UL-1 | 105 | 100° C./60 seconds | 100° C./60 seconds | D-2 | D-6 | 4.9 | 0.16 | 0.79 | 0.74 | 27 | 271/266 | 15.0 | 113 | 23.1 | 3.2 | 1.38E-08 | 154 |
| Example 24 | R-24 | UL-1 | 100 | 90° C./60 seconds | 90° C./60 seconds | D-2 | D-6 | 4.5 | 0.16 | 0.98 | 0.69 | 22 | 585 | 25.0 | 98 | 22.6 | 3.3 | 1.43E-08 | 145 |
| Example 25 | R-25 | UL-1 | 30 | 100° C./60 seconds | 100° C./60 seconds | D-2 | D-6 | 1.4 | 0.16 | 0.49 | 0.78 | 35 | 271 | 20.0 | 105 | 22.6 | 3.3 | 1.43E-08 | 127 |
| Example 26 | R-26 | UL-1 | 50 | 90° C./60 seconds | 90° C./60 seconds | D-2 | D-6 | 2.5 | 0.17 | 0.62 | 1.60 | 40 | 70 | 20.0 | 123 | 22.6 | 3.4 | 1.52E-08 | 99 |
| Example 27 | R-27 | UL-1 | 45 | 120° C./60 seconds | 120° C./60 seconds | D-2 | D-6 | 2.1 | 0.23 | 0.42 | 0.30 | 35 | 168 | 11.0 | 123 | 23.1 | 3.2 | 1.38E-08 | 18 |
| Example 28 | R-28 | UL-1 | 35 | 100° C./60 seconds | 100° C./60 seconds | D-2 | D-7 | 1.5 | 0.16 | 1.86 | 1.95 | 2 | 452 | 20.0 | 120 | 24.9 | 3.4 | 1.68E-08 | 87 |
| Example 29 | R-29 | UL-2 | 30 | 90° C./60 seconds | 90° C./60 seconds | D-2 | D-6 | 1.5 | 0.24 | 0.42 | 0.40 | 15 | 585 | 6.0 | 121 | 21.5 | 3.3 | 1.36E-08 | 13 |
| Example 30 | R-30 | UL-1 | 40 | 100° C./60 seconds | 105° C./60 seconds | D-2 | D-6 | 2.1 | 0.20 | 0.57 | 1.83 | 23 | 252 | 10.0 | 103 | 23.1 | 3.2 | 1.38E-08 | 20 |
| Example 31 | R-31 | UL-1 | 40 | 100° C./60 seconds | 100° C./60 seconds | D-2 | D-7 | 1.8 | 0.16 | 0.89 | 2.43 | 7 | 437/257 | 35.0 | 107 | 22.0 | 3.4 | 1.48E-08 | 123 |
| Example 32 | R-32 | UL-1 | 90 | 120° C./60 seconds | 100° C./60 seconds | D-2 | D-6 | 2.4 | 0.18 | 0.90 | 1.00 | 11 | 347 | 40.0 | 95 | 21.6 | 3.3 | 1.37E-08 | 59 |
| Comparative Example 1 | R-33 | UL-1 | 65 | 100° C./60 seconds | 100° C./60 seconds | D-2 | D-7 | 2.9 | 0.11 | 1.14 | 3.33 | 6 | 347 | 6.0 | 112 | 22.0 | 4.6 | 2.71E-08 | 2,442 |
| Comparative Example 2 | R-34 | UL-2 | 75 | 90° C./60 seconds | 90° C./60 seconds | D-2 | D-6 | 3.4 | 0.12 | 1.18 | 3.24 | 35 | 168 | 10.0 | 108 | 22.0 | 4.0 | 2.05E-08 | 2,018 |
| Comparative Example 3 | R-35 | UL-1 | 70 | 100° C./60 seconds | 90° C./90 seconds | D-2 | D-6 | 3.2 | 0.11 | 1.57 | 4.99 | 50 | 135 | 18.0 | 132 | 41.8 | 3.5 | 2.94E-08 | 4,205 |
| Comparative Example 4 | R-36 | UL-1 | 75 | 100° C./60 seconds | 110° C./60 seconds | D-2 | D-6 | 3.4 | 0.11 | 0.13 | 2.90 | 26 | 437 | 40.0 | 126 | 37.0 | 3.4 | 2.49E-08 | 5,200 |
| Comparative Example 5 | R-37 | UL-1 | 70 | 90° C./60 seconds | 105° C./60 seconds | D-2 | D-6 | 3.5 | 0.17 | 0.28 | 1.04 | 22 | 585 | 4.0 | 106 | 46.2 | 3.2 | 2.76E-08 | 1,192 |
| Comparative Example 6 | R-38 | UL-1 | 120 | 100° C./60 seconds | 105° C./60 seconds | D-2 | D-6 | 5.6 | 0.19 | 0.90 | 0.40 | 4 | 252 | 18.0 | 88 | Un-analyzed | — | — | — |
| Comparative Example 7 | R-39 | UL-2 | 140 | 100° C./60 seconds | 105° C./60 seconds | D-2 | D-6 | 6.5 | 0.20 | 0.46 | 0.78 | 18 | 347 | 20.0 | 96 | Un-analyzed | — | — | — |
| Example 33 | R-40 | UL-1 | 75 | 100° C./60 seconds | 120° C./60 seconds | D-2 | D-6 | 3.4 | 0.15 | 0.94 | 2.00 | 6 | 437/257 | 25.0 | 108 | 11.0 | 4.2 | 1.13E-08 | 150 |
| Example 34 | R-41 | UL-1 | 65 | 100° C./60 seconds | 120° C./60 seconds | D-2 | D-6 | 2.9 | 0.15 | 0.58 | 2.00 | 6 | 437/257 | 25.0 | 135 | 10.9 | 4.0 | 1.02E-08 | 190 |

TABLE 3-continued

| | | Resist application condition | | | PEB · Developing condition | | | Resist characteristic value | | | | | | | Evaluation results | | | |
|---|---|---|---|---|---|---|---|---|---|---|---|---|---|---|---|---|---|---|
| | Composition | Base | Film thickness (nm) | Baking | PEB | Developer | Rinsing liquid | Concentration of solid contents (% by mass) | A value | ΔLUMO | Acid value (mmol/g) | Acid diffusion length | Size of acid generated (Å³) | Amount of photoacid generator (Content: % by mass) | Tg (° C.) | Sensitivity (mJ/cm²) | LER (nm) | Z-factor (mJ*nm³) | Bridge defects (number of bridge defects) |
| Example 35 | R-42 | UL-1 | 60 | 100° C./60 seconds | 120° C./60 seconds | D-2 | D-6 | 2.7 | 0.15 | 0.45 | 2.00 | 6 | 437/257 | 25.0 | 120 | 10.8 | 4.2 | 1.11E-08 | 206 |
| Example 36 | R-43 | UL-1 | 65 | 100° C./60 seconds | 120° C./60 seconds | D-2 | D-6 | 2.9 | 0.15 | 0.79 | 0.96 | 6 | 437/257 | 25.0 | 182 | 10.7 | 4.0 | 9.96E-09 | 211 |
| Example 37 | R-44 | UL-1 | 65 | 100° C./60 seconds | 120° C./60 seconds | D-2 | D-6 | 2.9 | 0.15 | 1.19 | 1.89 | 6 | 437/257 | 25.0 | 188 | 11.2 | 4.0 | 1.05E-08 | 233 |
| Example 38 | R-45 | UL-1 | 65 | 100° C./60 seconds | 120° C./60 seconds | D-2 | D-6 | 2.9 | 0.15 | 1.02 | 2.00 | 6 | 437/257 | 25.0 | 110 | 11.3 | 4.2 | 1.17E-08 | 248 |
| Example 39 | R-46 | UL-1 | 65 | 100° C./60 seconds | 120° C./60 seconds | D-2 | D-6 | 2.9 | 0.15 | 1.19 | 2.00 | 6 | 437/257 | 25.0 | 105 | 12.7 | 3.9 | 1.12E-08 | 123 |
| Example 40 | R-47 | UL-2 | 35 | 120° C./30 seconds | 105° C./30 seconds | D-2 | D-6 | 1.6 | 0.17 | 0.96 | 0.76 | 19 | 244 | 15.0 | 93 | 21.8 | 3.5 | 1.56E-08 | 92 |
| Example 41 | R-48 | UL-1 | 90 | 100° C./60 seconds | 100° C./60 seconds | D-2 | D-6 | 4.0 | 0.19 | 1.07 | 0.92 | 6 | 354 | 15.0 | 91 | 42.9 | 2.0 | 1.00E-08 | 44 |
| Example 42 | R-49 | UL-1 | 90 | 100° C./60 seconds | 100° C./60 seconds | D-2 | D-6 | 4.0 | 0.19 | 0.94 | 0.92 | 6 | 354 | 15.0 | 98 | 42.4 | 2.0 | 9.88E-09 | 31 |
| Example 43 | R-50 | UL-1 | 65 | 100° C./60 seconds | 110° C./60 seconds | D-2 | D-7 | 2.9 | 0.14 | 1.18 | 3.31 | 7 | 437/257 | 21.0 | 124 | 38.5 | 2.4 | 1.29E-08 | 465 |
| Example 44 | R-51 | UL-1 | 65 | 100° C./60 seconds | 110° C./60 seconds | D-2 | D-7 | 2.9 | 0.14 | 1.18 | 4.25 | 7 | 437/257 | 21.0 | 158 | 38.9 | 2.5 | 1.42E-08 | 336 |
| Example 45 | R-52 | UL-1 | 65 | 100° C./60 seconds | 110° C./60 seconds | D-2 | D-7 | 2.9 | 0.14 | 1.18 | 3.31 | 7 | 437/257 | 21.0 | 155 | 36.3 | 2.5 | 1.32E-08 | 661 |
| Example 46 | R-53 | UL-1 | 65 | 100° C./60 seconds | 110° C./60 seconds | D-2 | D-6 | 2.9 | 0.14 | 1.14 | 3.26 | 8 | 252 | 15.0 | 117 | 20.9 | 3.2 | 1.25E-08 | 260 |
| Example 47 | R-54 | UL-1 | 75 | 90° C./60 seconds | 100° C./60 seconds | D-2 | D-6 | 3.4 | 0.14 | 1.02 | 3.68 | 12 | 437/135 | 13.0 | 131 | 18.0 | 3.6 | 1.36E-08 | 365 |
| Example 48 | R-55 | UL-1 | 70 | 100° C./60 seconds | 120° C./45 seconds | D.3 | D.7 | 3.2 | 0.15 | 1.18 | 2.30 | 9 | 437/354 | 16.0 | 139 | 32.0 | 2.4 | 1.07E-08 | 181 |
| Example 49 | R-56 | UL-1 | 40 | 100° C./60 seconds | 100° C./60 seconds | D-2 | D-6 | 1.8 | 0.14 | 1.17 | 4.16 | 15 | 271 | 10.0 | 105 | 33.0 | 3.0 | 1.73E-08 | 333 |
| Example 50 | R-57 | UL-2 | 75 | 120° C./60 seconds | 100° C./60 seconds | D-2 | D-7 | 3.4 | 0.15 | 1.17 | 1.97 | 4 | 585 | 11.0 | 150 | 25.5 | 2.8 | 1.17E-08 | 222 |
| Example 51 | R-58 | UL-2 | 75 | 100° C./50 seconds | 120° C./60 seconds | D-5 | D-6 | 3.4 | 0.15 | 1.17 | 4.05 | 11 | 437/271 | 17.0 | 134 | 20.9 | 3.1 | 1.17E-08 | 192 |
| Example 52 | R-59 | UL-1 | 65 | 90° C./60 seconds | 90° C./60 seconds | D-2 | D-6 | 2.9 | 0.14 | 1.02 | 3.07 | 7 | 437/271 | 17.0 | 133 | 46.3 | 2.2 | 1.31E-08 | 621 |
| Example 53 | R-60 | UL-1 | 60 | 100° C./60 seconds | 105° C./60 seconds | D-2 | D-6 | 2.7 | 0.14 | 1.18 | 4.81 | 13 | 252 | 18.0 | 169 | 35.3 | 2.6 | 1.39E-08 | 565 |
| Example 54 | R-61 | UL-1 | 90 | 100° C./60 seconds | 100° C./60 seconds | D-2 | D-6 | 4.0 | 0.17 | 1.02 | 3.07 | 5 | 437/271 | 13.0 | 109 | 32.6 | 2.4 | 1.09E-08 | 123 |
| Example 55 | R-62 | UL-1 | 70 | 120° C./60 seconds | 90° C./60 seconds | D-3 | D-6 | 3.2 | 0.15 | 1.40 | 2.00 | 13 | 266/354 | 13.0 | 149 | 18.9 | 3.2 | 1.13E-08 | 299 |

TABLE 3-continued

| | Resist application condition | | | | PEB · Developing condition | | | Resist characteristic value | | | | | | | Evaluation results | | |
|---|---|---|---|---|---|---|---|---|---|---|---|---|---|---|---|---|---|
| | Composition | Base | Film thickness (nm) | Baking | PEB | Developer | Rinsing liquid | Concentration of solid contents (% by mass) | A value | ΔLUMO | Acid value (mmol/g) | Acid diffusion length | Size of acid generated (Å³) | Amount of photoacid generator (Content: % by mass) | Tg (° C.) | Sensitivity (mJ/cm²) | LER (nm) | Z-factor (mJ*nm³) | Bridge defects (number of bridge defects) |
| Example 56 | R-63 | UL-2 | 50 | 100° C./60 seconds | 110° C./60 seconds | D-2 | D-6 | 2.3 | 0.15 | 1.18 | 2.25 | 4 | 585 | 6.0 | 181 | 17.1 | 4.1 | 1.67E-08 | 298 |
| Example 57 | R-64 | UL-1 | 45 | 90° C./60 seconds | 105° C./60 seconds | D-2 | D-7 | 2.1 | 0.14 | 1.17 | 1.00 | 10 | 437/270 | 25.0 | 112 | 34.7 | 2.9 | 1.70E-08 | 636 |
| Example 58 | R-65 | UL-1 | 70 | 100° C./60 seconds | 100° C./60 seconds | D-2 | D-6 | 3.2 | 0.16 | 1.17 | 2.77 | 11 | 266/354 | 13.0 | 168 | 40.0 | 2.2 | 1.13E-08 | 230 |
| Example 59 | R-66 | UL-1 | 75 | 100° C./60 seconds | 90° C./60 seconds | D-2 | D-7 | 3.4 | 0.14 | 1.02 | 2.35 | 7 | 354 | 23.0 | 184 | 33.0 | 2.7 | 1.40E-08 | 492 |
| Example 60 | R-67 | UL-2 | 30 | 120° C./30 seconds | 105° C./30 seconds | D-2 | D-6 | 1.4 | 0.15 | 1.02 | 3.07 | 7 | 585 | 10.0 | 113 | 23.1 | 3.5 | 1.65E-08 | 300 |
| Example 61 | R-68 | UL-1 | 50 | 100° C./60 seconds | 100° C./60 seconds | D-2 | D-7 | 2.4 | 0.16 | 1.07 | 2.60 | 5 | 437/347 | 16.0 | 125 | 40.0 | 2.7 | 1.70E-08 | 245 |
| Example 62 | R-69 | UL-2 | 70 | 120° C./60 seconds | 120° C./60 seconds | D-2 | D-6 | 3.2 | 0.15 | 0.76 | 2.05 | 10 | 354 | 17.0 | 162 | 23.1 | 2.8 | 1.06E-08 | 270 |
| Example 63 | R-70 | UL-1 | 50 | 100° C./60 seconds | 100° C./60 seconds | D-2 | D-7 | 2.4 | 0.18 | 1.07 | 2.60 | 5 | 437/347 | 16.0 | 110 | 35.6 | 2.4 | 1.20E-08 | 218 |

As shown in the table, it was confirmed that in a case where the composition of the embodiment of the present invention is used, good performance is exhibited in the EUV exposure evaluation.

Furthermore, as shown in Table 3, in a case where the A value was 0.15 or more, the bridge defect was further suppressed. In addition, it was confirmed that in a case where the concentration of solid contents is more than 2.5% by mass and less than 4.5% by mass, and the A value is 0.15 or more, the numerical value of the Z-factor is smaller.

It was also found that in a case where the concentration of solid contents of the resist is more than 5.0% by mass, the resolution of the fine trench pattern is poorer.

What is claimed is:

1. A photosensitive composition for EUV light, comprising:
   a resin that has an increased polarity by action of an acid, thereby having an increased solubility in an alkali developer and a decreased solubility in an organic solvent; and a photoacid generator, or
   a resin that has a repeating unit having a photoacid generating group, and has an increased polarity by action of an acid, thereby having an increased solubility in an alkali developer and a decreased solubility in an organic solvent, and
   wherein the photosensitive composition satisfies Requirement 1 to Requirement 3 and the resin has a phenolic hydroxyl group,
   Requirement 1: an A value determined by Formula (1) is 0.14 or more, $$A=([H]\times0.04+[C]\times1.0+[N]\times2.1+[O]\times3.6+[F]\times5.6+[S]\times1.5+[I]\times39.5)/([H]\times1+[C]\times12+[N]\times14+[O]\times16+[F]\times19+[S]\times32+[I]\times127) \quad \text{Formula (1)}$$

in the formula, [H] represents a molar ratio of hydrogen atoms derived from a total solid content with respect to all atoms of the total solid content in the photosensitive composition for EUV light, [C] represents a molar ratio of carbon atoms derived from the total solid content with respect to all the atoms of the total solid content in the photosensitive composition for EUV light, [N] represents a molar ratio of nitrogen atoms derived from the total solid content with respect to all the atoms of the total solid content in the photosensitive composition for EUV light, [O] represents a molar ratio of oxygen atoms derived from the total solid content with respect to all the atoms of the total solid content in the photosensitive composition for EUV light, [F] represents a molar ratio of fluorine atoms derived from the total solid content with respect to all the atoms of the total solid content in the photosensitive composition for EUV light, [S] represents a molar ratio of sulfur atoms derived from the total solid content with respect to all the atoms of the total solid content in the photosensitive composition for EUV light, and [I] represents a molar ratio of iodine atoms derived from the total solid content with respect to all the atoms of the total solid content in the photosensitive composition for EUV light,
   Requirement 2: a concentration of a solid content in the photosensitive composition for EUV light is 5.0% by mass or less,
   Requirement 3: a content of the photoacid generator is 5% to 50% by mass with respect to the total solid content in the photosensitive composition for EUV light.

2. The photosensitive composition for EUV light according to claim 1, comprising:
   the resin that has an increased polarity by action of an acid, thereby having an increased solubility in an alkali developer and a decreased solubility in an organic solvent; and
   a photoacid generator consisting of a cationic moiety and an anionic moiety, wherein a B value determined by Formula (2) is 0 eV or more, $$B \text{ value}=\text{LUMO(Polymer)}-\text{LUMO(PAG\_Cation)} \quad \text{Formula (2)}$$

in the formula, the LUMO (Polymer) represents an energy value of a lowest unoccupied molecular orbital level of a monomer of a repeating unit which is derived from the monomer having a lowest energy value of the lowest unoccupied molecular orbital level, the repeating unit being one of repeating units included in an amount of 5% by mass or more with respect to all the repeating units of the resin, and
   the LUMO (PAG_Cation) represents an energy value of the lowest unoccupied molecular orbital level of a cationic moiety of the photoacid generator which is contained in a largest amount in the photosensitive composition for EUV light in term of a mass.

3. The photosensitive composition for EUV light according to claim 1,
   wherein a volume of an acid generated from the photoacid generator is 240 Å$^3$ or more.

4. The photosensitive composition for EUV light according to claim 1,
   wherein a glass transition temperature of the resin is higher than 90° C.

5. The photosensitive composition for EUV light according to claim 1,
   wherein the resin has an acid group with an acid dissociation constant of 13 or less.

6. The photosensitive composition for EUV light according to claim 5,
   wherein a content of the acid group of the resin having said acid group is 0.80 to 6.00 mmol/g.

7. The photosensitive composition for EUV light according to claim 1,
   wherein the resin has a repeating unit having a fluorine atom or an iodine atom.

8. The photosensitive composition for EUV light according to claim 7,
   wherein neither a structure in which a polar group is protected with a leaving group that leaves by action of an acid nor an acid group is included in the repeating unit having a fluorine atom or an iodine atom.

9. The photosensitive composition for EUV light according to claim 1,
   wherein the resin includes a fluorine atom and an iodine atom.

10. A pattern forming method comprising:
    forming a resist film on a substrate using the photosensitive composition for EUV light according to claim 1;
    exposing the resist film with EUV light; and
    developing the exposed resist film using an alkali developer to form a pattern.

11. A method for manufacturing an electronic device, comprising the pattern forming method according to claim 10.

12. A photosensitive composition for EUV light, comprising:
    a resin that has an increased polarity by action of an acid, thereby having an increased solubility in an alkali developer and a decreased solubility in an organic solvent; and a photoacid generator, or a resin that has a repeating unit having a photoacid generating group, and has an increased polarity by action of an acid, thereby having an increased solubility in an alkali developer and a decreased solubility in an organic solvent, and wherein the photosensitive composition satisfies Requirement 1 to Requirement 3 and the resin has a repeating unit having a structure in which a polar group is protected with a leaving group that leaves by action of an acid, the resin has a group selected from a group consisting of Formula (Y1), Formula (Y2), Formula (Y4), and Formula (Y3-1) as the leaving group or has a repeating unit represented by Formula (A) as the repeating unit having a structure in which a polar group is protected with a leaving group that leaves by action of an acid;

—C(Rx$_1$)(Rx$_2$)(Rx$_3$)  Formula (Y1)

—C(=O)OC(Rx$_1$)(Rx$_2$)(Rx$_3$)  Formula (Y2)

—C(Rn)(H)(Ar)  Formula (Y4)

in the Formula (Y1), Formula (Y2), and Formula (Y4), Rx$_1$ to Rx$_3$ each independently represent an alkyl group or a cycloalkyl group and two of Rx$_1$ to Rx$_3$ optionally be bonded to each other to form a monocycle or a polycycle;

Ar represents an aromatic ring group, Rn represents an alkyl group, a cycloalkyl group, or an aryl group, and Rn and Ar optionally be bonded to each other to form a non-aromatic ring;

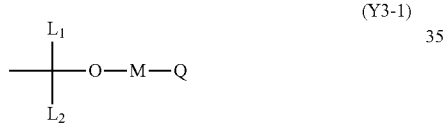

(Y3-1)

in the Formula (Y3-1), L$_1$ and L$_2$ each independently represent a hydrogen atom, an alkyl group, a cycloalkyl group, an aryl group, or a group formed by combination thereof, M represents a single bond or a divalent linking group, and Q represents an alkyl group which include a heteroatom, a cycloalkyl group which include a heteroatom, an aryl group which optionally include a heteroatom, an amino group, an ammonium group, a mercapto group, a cyano group, an aldehyde group, or a group formed by combination thereof;

(A)

in Formula (A), L$_1$ represents a divalent linking group which optionally have a fluorine atom or an iodine atom, R$_1$ represents a hydrogen atom, a fluorine atom, an iodine atom, an alkyl group which optionally have a fluorine atom or iodine atom, or an aryl group which optionally have a fluorine atom or an iodine atom, R$_2$ represents a group represented by Formula (Z1), Formula (Z2), Formula (Z3), or Formula (Z4), and at least one of L$_1$, R$_1$, and R$_2$ has a fluorine atom or an iodine atom;

—C(Rx$_{11}$)(Rx$_{12}$)(Rx$_{13}$)  Formula (Z1)

—C(=O)OC(Rx$_{11}$)(Rx$_{12}$)(Rx$_{13}$)  Formula (Z2)

—C(R$_{136}$)(R$_{137}$)(OR$_{138}$)  Formula (Z3)

—C(Rn$_1$)(H)(Ar$_1$)  Formula (Z4)

Rx$_{11}$ to Rx$_{13}$ each independently represent an alkyl group which optionally have a fluorine atom or an iodine atom, or a cycloalkyl group which optionally have a fluorine atom or an iodine atom;

R$_{136}$ and R$_{137}$ each independently represent a hydrogen atom or a monovalent organic group which optionally have a fluorine atom or an iodine atom, R$_{138}$ represents an alkyl group which have a heteroatom selected from a group consisting of a fluorine atom, an iodine atom, and an oxygen atom; a cycloalkyl group which have a heteroatom selected from a group consisting of a fluorine atom, an iodine atom, and an oxygen atom; an aryl group which optionally have a heteroatom selected from the group consisting of a fluorine atom, an iodine atom, and an oxygen atom; an aralkyl group which optionally have a heteroatom selected from the group consisting of a fluorine atom, an iodine atom, and an oxygen atom; or a group formed by combination thereof, and R$_{137}$ and R$_{138}$ optionally be bonded to each other to form a ring; and Ar$_1$ represents an aromatic ring group which optionally have a fluorine atom or an iodine atom, Rn$_1$ represents an alkyl group which optionally have a fluorine atom or an iodine atom, a cycloalkyl group which optionally have a fluorine atom or an iodine atom, or an aryl group which optionally have a fluorine atom or an iodine atom, and Rn$_1$ and Ar$_1$ optionally be bonded to each other to form a non-aromatic ring, Requirement 1: an A value determined by Formula (1) is 0.14 or more, A=([H]×0.04+[C]×1.0+[N]×2.1+[O]×3.6+[F]×5.6+ [S]×1.5+[I]×39.5)/([H]×1+[C]×12+[N]×14+[O]× 16+[F]×19+[S]×32+[I]×127)  Formula (1)

in the formula, [H] represents a molar ratio of hydrogen atoms derived from a total solid content with respect to all atoms of the total solid content in the photosensitive composition for EUV light, [C] represents a molar ratio of carbon atoms derived from the total solid content with respect to all the atoms of the total solid content in the photosensitive composition for EUV light, [N] represents a molar ratio of nitrogen atoms derived from the total solid content with respect to all the atoms of the total solid content in the photosensitive composition for EUV light, [O] represents a molar ratio of oxygen atoms derived from the total solid content with respect to all the atoms of the total solid content in the photosensitive composition for EUV light, [F] represents a molar ratio of fluorine atoms derived from the total solid content with respect to all the atoms of the total solid content in the photosensitive composition for EUV light, [S] represents a molar ratio of sulfur atoms derived from the total solid content with respect to all the atoms of the total solid content in the photosensitive composition for EUV light, and [I] represents a molar ratio of iodine atoms derived from the total solid content with respect to all the atoms of the total solid content in the photosensitive composition for EUV light, Requirement 2: a concentration of a solid content in the photosensitive composition for EUV light is 5.0% by mass or less, Requirement 3: a content of the photoacid generator is 5% to 50% by mass with respect to the total solid content in the photosensitive composition for EUV light.

* * * * *